United States Patent
Yamazaki et al.

(10) Patent No.: US 8,242,562 B2
(45) Date of Patent: Aug. 14, 2012

(54) FILM DEPOSITION APPARATUS

(75) Inventors: Shunpei Yamazaki, Tokyo (JP); Makoto Furuno, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/094,886

(22) Filed: Apr. 27, 2011

(65) Prior Publication Data

US 2011/0197815 A1 Aug. 18, 2011

Related U.S. Application Data

(62) Division of application No. 12/277,972, filed on Nov. 25, 2008, now Pat. No. 7,947,544.

(30) Foreign Application Priority Data

Nov. 27, 2007 (JP) .................................. 2007-305560

(51) Int. Cl.
- H01L 27/01 (2006.01)
- H01L 27/12 (2006.01)
- H01L 31/0392 (2006.01)

(52) U.S. Cl. .................. 257/347; 438/158; 438/488

(58) Field of Classification Search .................. 257/347, 257/E21.104, E21.414; 438/158, 488, 758
See application file for complete search history.

(56) References Cited

U.S. PATENT DOCUMENTS

| | | | |
|---|---|---|---|
| 4,624,214 A * | 11/1986 | Suzuki et al. ................. 118/719 |
| 4,989,543 A | 2/1991 | Schmitt | |
| 5,283,414 A * | 2/1994 | Straemke ................. 219/121.43 |
| 5,625,742 A * | 4/1997 | Boffito et al. ................. 392/345 |
| 5,733,986 A | 3/1998 | Senda et al. | |
| 5,897,137 A * | 4/1999 | Al-Amin et al. ............... 280/741 |
| 6,283,060 B1 | 9/2001 | Yamazaki et al. | |
| 6,296,735 B1 | 10/2001 | Marxer et al. | |
| 6,547,922 B2 | 4/2003 | Hori et al. | |
| 6,858,087 B2 | 2/2005 | Hori et al. | |
| 7,138,336 B2 | 11/2006 | Lee et al. | |
| 7,828,623 B2 | 11/2010 | Takatsu | |
| 2003/0136517 A1 | 7/2003 | Hori et al. | |
| 2004/0118346 A1 | 6/2004 | Yajima et al. | |
| 2006/0276037 A1 | 12/2006 | Lee et al. | |
| 2007/0034155 A1 | 2/2007 | Takatsu | |
| 2007/0187386 A1 * | 8/2007 | Kim et al. ..................... 219/385 |

FOREIGN PATENT DOCUMENTS

| | | |
|---|---|---|
| EP | 0784079 A2 | 7/1997 |
| JP | 02-007421 A | 1/1990 |
| JP | 02-057000 U | 4/1990 |
| JP | 06-151312 A | 5/1994 |

(Continued)

*Primary Examiner* — Phuc Dang

(74) *Attorney, Agent, or Firm* — Fish & Richardson P.C.

(57) ABSTRACT

An object is to provide a film deposition apparatus in which the amount of leakage from the outside of the chamber to the inside of the chamber is reduced. Even if leakage occurs from the outside of the chamber to the inside of the chamber, oxygen and nitrogen included in an atmosphere that surrounds the outer wall of the chamber are reduced as much as possible and the atmosphere is filled with a noble gas or hydrogen, whereby the inside of the chamber is kept cleaner at $1/100$ or less, preferably, $1/1000$ or less of oxygen concentration and nitrogen concentration than those in the air. Since the space with high airtightness is provided adjacent to the outside of the chamber, the chamber is covered with a bag and a high-purity argon gas is supplied to the bag.

19 Claims, 26 Drawing Sheets

FOREIGN PATENT DOCUMENTS

| | | |
|---|---|---|
| JP | 07-122621 A | 5/1995 |
| JP | 09-316642 A | 12/1997 |
| JP | 10-152604 A | 6/1998 |
| JP | 2000-182958 A | 6/2000 |
| JP | 2001-288571 A | 10/2001 |
| JP | 2004-332039 A | 11/2004 |
| JP | 2005-502784 A | 1/2005 |
| JP | 2007-052929 A | 3/2007 |
| WO | WO03/023835 A1 | 3/2003 |

* cited by examiner

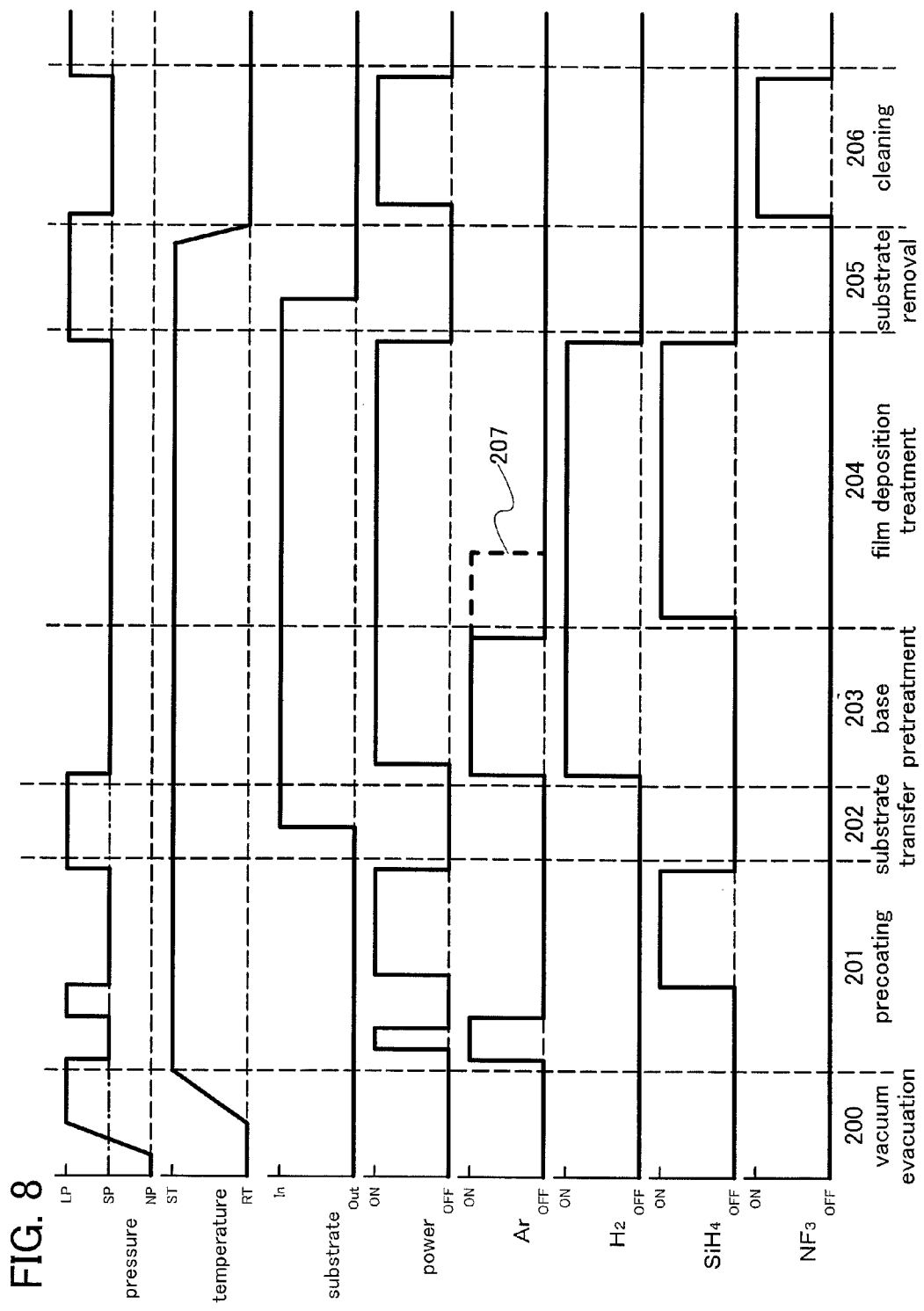

350   351b  351a   352

54   353

FILM DEPOSITION APPARATUS

CROSS-REFERENCE TO RELATED APPLICATIONS

This application is a divisional of U.S. application Ser. No. 12/277,972, filed Nov. 25, 2008, now U.S. Pat. No. 7,947,544, which claims the benefit of a foreign priority application filed in Japan as Serial No. 2007-305560 on Nov. 27, 2007, both of which are incorporated by reference.

BACKGROUND OF THE INVENTION

1. Field of the Invention

The present invention relates to a method of manufacturing a semiconductor device which has a circuit including a thin film transistor (hereinafter referred to as a TFT) using a semiconductor film. The present invention relates to a film deposition apparatus used in a process of forming a thin film by a plasma CVD method in manufacturing a semiconductor device. The present invention further relates to a film deposition method with the use of the film deposition apparatus. For example, the present invention relates to a photoelectric conversion device typified by a solar cell and a sensor, an electro-optical device typified by a liquid crystal display panel, or an electronic device equipped with a light-emitting device as a part.

In this specification, a semiconductor device refers to all types of devices which can function by using semiconductor characteristics. An electro-optical device, a light-emitting device, a semiconductor circuit, and an electronic device are all included in the category of semiconductor devices.

2. Description of the Related Art

With miniaturization of semiconductor elements, individual processes require high precision. In semiconductor manufacturing processes, a reaction-product film which is formed by reacting a source gas by various methods (plasma, heat, light, or the like) is deposited over a substrate to be processed which is arranged in a chamber of a film deposition apparatus. In particular, suppression of particles generated in the film deposition apparatus is a big problem, and keeping the inside of the chamber clean is important to stabilize processes.

The present applicant discloses, in Patent Document 1, a substrate processing apparatus in which a plurality of processes to form a thin film over a substrate or the like is successively performed with airtightness being kept.

A film deposition apparatus using a plasma CVD method is formed of a plurality of members, to which a fluidic device such as a valve or a pump is coupled, to prevent gas distribution to the outside by using a sealing material or a sealing member for an airtight structure for a shaft seal portion, a pipe flange connection portion, or the like.

A rubber o-ring is employed to prevent entry of outside air to the chamber and to keep the pressure constant. In addition, an hollow metal o-ring is sometimes used, which is formed in such a way that a metal pipe is cut to a certain length and formed into a ring shape, and both ends of the ring shape is welded.

Patent Document 1: Japanese Published Patent Application No, H7-122621.

SUMMARY OF THE INVENTION

Even when the o-ring, the hollow o-ring, or the like is used, SIMS measurement sometimes detects a very small amount of oxygen or nitrogen included in an amorphous silicon film which is formed using a plasma CVD apparatus by use of only a silane gas and a hydrogen gas although almost no oxygen or nitrogen is included in a source gas, for example. For this reason, it cannot be said that a conventional plasma CVD apparatus has a sufficient leakage measure.

Note that oxygen or nitrogen is an element that makes part of an amorphous semiconductor layer n-type. These elements increase defect density in the amorphous semiconductor layer and decrease electron field-effect mobility. Further, oxygen or nitrogen included in a film might be a factor of variation in electric characteristics of a TFT.

To increase the degree of vacuum in a chamber is a possible approach to reduce oxygen or nitrogen included in the film. However, if the same sealing material or the same sealing member is used, the higher the degree of vacuum in the chamber is, the more the amount of leakage from the outside of the chamber to the inside of the chamber increases.

In particular, if film deposition treatment is performed under a deposition condition that has long deposition time, the amount of oxygen or nitrogen which enters the chamber is also increased. For example, when a microcrystalline silicon film is formed, film deposition is performed such that a silane gas is diluted with greater than 100 times and 2000 times or less of hydrogen; therefore, deposition rate is slow and it takes a long period of time to obtain a desired film thickness. In addition, when oxygen inhibits crystallization and is taken in the microcrystalline silicon film, oxygen might act as a donor; therefore, oxygen is an impurity which should be particularly reduced in forming a microcrystalline silicon film.

An object of the present invention is to provide a film deposition apparatus which reduces the amount of leakage from the outside of the chamber to the inside of the chamber. Since time degradation occurs in the O-ring, the o-ring is necessary to be replaced on a regular basis; however, a worker cannot recognize deterioration that cannot be measured by a vacuum gauge. Although deterioration can be prevented by frequent replacement, such maintenance work temporarily stops a production line, which causes a heavy loss in productivity and higher production cost. Thus, another object of the present invention is to provide a film deposition apparatus which can perform film deposition without significant deterioration in film quality even when a sealing defect due to time degradation that occurs in the film deposition apparatus.

Another object of the present invention is to provide a film deposition method of a semiconductor film in which oxygen concentration and the nitrogen concentration are reduced.

Another object of the present invention is to provide a method of manufacturing a semiconductor device using a semiconductor film in which oxygen concentration and nitrogen concentration are reduced.

Even if leakage occurs from the outside of the chamber to the inside of the chamber, oxygen and nitrogen included in an atmosphere that surrounds the outer wall of the chamber are reduced as much as possible and the atmosphere is filled with a noble gas or hydrogen, whereby the inside of the chamber is kept cleaner at $1/100$ or less, preferably, $1/1000$ or less of oxygen concentration and nitrogen concentration than those in the air.

As the noble gas, helium, neon, argon, xenon, krypton, and the like are given, and argon that is inexpensive is preferably used among them.

A space with high airtightness is provided adjacent to the outside of the chamber so that the atmosphere that surrounds the outer wall of the chamber is a noble gas, hydrogen, or a mixed gas of a noble gas and hydrogen. The space provided adjacent to the outside of the chamber is once evacuated into vacuum, and then it is filled with a noble gas or hydrogen. By provision of this space, a sealing portion of the chamber and the air are separated from each other by increasing the distance between the sealing portion of the chamber and the air, whereby an atmospheric gas (oxygen, nitrogen, $H_2O$, $CO_x$, $NO_x$, or the like) can be prevented from entering the chamber. Even if a noble gas or hydrogen enters the chamber, there is almost no change in the electric characteristics of a semiconductor film to be formed, which is not a problem.

When a noble gas or hydrogen is supplied to the space between the chamber and the air, the space has a positive pressure, whereby an atmosphere component from the air which is under atmospheric pressure can be prevented from entering the space and an atmospheric gas can be effectively prevented from entering the chamber.

Regardless of the degree of vacuum, the remaining oxygen concentration and the remaining nitrogen concentration in the chamber can be reduced in accordance with the present invention.

Since the space with high airtightness is provided adjacent to the outside of the chamber, the chamber is covered with a bag and the space between the outer wall of the chamber and the inner surface of the bag is subjected to low pressure treatment, and then a noble gas or a hydrogen gas is supplied to the bag so that the bag is expanded and filled with the noble gas or the hydrogen gas. The bag is provided with an exhaust port coupled to a vending means, and an inflow entrance coupled to a gas supply means.

The noble gas or the hydrogen gas to be supplied to the space between the outer wall of the chamber and the inside of the bag preferably includes oxygen or nitrogen as small as possible, and oxygen concentration and nitrogen concentration included in the gas to be supplied to the space are preferably 30 ppm or less, more preferably, 30 ppb or less. The gas to be supplied to the space can be measured by an oxygen analyzer for measurement of, oxygen concentration and a nitrogen analyzer for measurement of nitrogen concentration.

As the material of the bag, a polyethylene resin, a polypropylene resin, a polyvinyl chloride resin, a polyvinylidene chloride resin, a cellulose acetate resin, a fluorine-containing resin, a polyamide resin, and the like are given, and especially, a polyamide resin and a fluorine-containing resin which are low oxygen transmittance and low nitrogen transmittance are preferable. By use of two or more kinds of films including these resins which are attached, oxygen transmittance and nitrogen transmittance are further reduced. In addition, a film in which these resins and an aluminum foil are combined with each other, a film in which these resins and a glass fiber are combined with each other, a resin film having a surface onto which silica fine powder is evaporated, or the like is used.

Alternatively, a bubble cushioning material may be used as the bag. Bubbles enclosed in the bubble cushioning material are not the air, and a noble gas or hydrogen is enclosed in the bubble cushioning material.

A film deposition apparatus disclosed in the present invention includes a bubble cushioning material; a vacuum chamber surrounded by the bubble cushioning material; and a first gas supply means which supplies one of a noble gas and a hydrogen gas to a space between the bubble cushioning material and the vacuum chamber. The vacuum chamber is provided with a vacuum evacuation means and a second gas supply means, and a plasma generation means is included in the vacuum chamber. The inside of the bubble cushioning material includes bubbles of one of the noble gas and the hydrogen gas, and the periphery of the bubbles is sealed with a resin. The resin of the bubble cushioning material uses the same material as the material of the aforementioned bag.

By use of the bubble cushioning material containing a noble gas or hydrogen, the outer wall of the chamber and the air can also be separated. The use of the bubble cushioning material can prevent an increase in size of a device due to the bag. When the pressure in the bag formed of a film is at a positive pressure, because the bag is expanded, no problem arises if a sufficient space for an installation position is secured; however, it is effective to use the bubble cushioning material when no sufficient space for the installation position is secured. A tiny space generated by surrounding the outer wall of the chamber with the bubble cushioning material is supplied with a noble gas or a hydrogen gas.

In addition, layers of two bags or a multiple structure having more than two bags may be used. In either case, it is preferable to reduce oxygen transmittance and nitrogen transmittance.

Even if a sealing defect that cannot be measured by a vacuum gage occurs and a very small amount of a gas flows in from the outside of the chamber, homogeneous film deposition can be continuously performed on a plurality of substrates without deterioration in film quality because the outside of the chamber is surrounded by the atmosphere that includes almost no oxygen or nitrogen.

When the chamber to which a special material gas having high reactivity is introduced is covered with the bag, even if a sealing portion or the like of the chamber is deteriorated and thus a silane gas or the like flows to the outside of the chamber or a gas outside of the chamber flows backward to a silane gas cylinder, ignition or a fire does not occur. Therefore, the installation of the bag can enhance the safety of the film deposition apparatus using a special material gas having high reactivity.

A film deposition apparatus disclosed in the present invention includes a bag provided with a first vacuum evacuation means and a first gas supply means; a vacuum chamber surrounded by the bag; the vacuum chamber is provided with a second vacuum evacuation means and a second gas supply means; and a plasma generation means in the vacuum chamber. The air and the outer wall of the vacuum chamber are separated from each other with one of a noble gas or a hydrogen gas which is supplied from the first gas supply means to the inside of the bag.

The present invention is to solve at least one of the above objects.

The present invention also includes a film deposition method using the above film deposition apparatus, including the steps of: providing a space, to which one of a noble gas and a hydrogen gas is introduced, between the air and the outer wall of a vacuum chamber, in which the space is in contact with the outer wall of the vacuum chamber; isolating the vacuum chamber and the air from each other with the space covered with a bag; providing a substrate in the vacuum chamber covered with the bag; and introducing a source gas in the vacuum chamber and generating plasma to form a semiconductor film over the substrate.

The present invention is to solve at least one of the above objects.

In the above film deposition method, the space to which the noble gas or the hydrogen gas is introduced has a positive pressure that is higher pressure than atmospheric pressure, whereby an atmospheric component is prevented from entering the vacuum chamber.

In the aforementioned film deposition method, it is preferable that a gas to be supplied between the air and the outer wall of the vacuum chamber is a high purity gas, and oxygen concentration and nitrogen concentration included in one of the noble gas and the hydrogen gas is 30 ppm or less.

In the aforementioned film deposition method, the source gas includes a silane gas, and the semiconductor film to be formed over the substrate is a microcrystalline semiconductor film. Since the deposition rate of the microcrystalline semiconductor film is slow, prevention of the entry of an atmospheric component to the vacuum chamber is important.

In this specification, the microcrystalline semiconductor film is a film which contains a semiconductor having an intermediate structure between amorphous and crystalline structures (including a single crystal and a polycrystal). This semiconductor is a semiconductor which has a third state that is stable in terms of free energy, and is a crystalline semiconductor which has short-range order and lattice distortion, and column-like or needle-like crystals with a grain size of 0.5 nm to 20 nm grown in the direction of a normal line with respect to the surface of the substrate. In addition, a microcrystalline semiconductor and a non-single-crystal semiconductor are mixed. Microcrystalline silicon, which is a typical example of a microcrystalline semiconductor, has a Raman spectrum which is shifted to a wave number side lower than 520.5 cm$^{-1}$ that represents single crystal silicon. In other word, a peak of a Raman spectrum of microcrystalline silicon lies between 520.5 cm$^{-1}$ which represents that of single crystal silicon, and 480 cm$^{-1}$ which represents that of amorphous silicon. The semiconductor includes hydrogen or halogen of at least 1 at. % to terminate a dangling bond.

The present invention also includes a method of manufacturing a semiconductor device using the above film deposition apparatus, including the steps of: forming a gate electrode over a substrate having an insulating surface; forming an insulating film over the gate electrode; providing a space, to which one of a noble gas and a hydrogen gas is introduced, between the air and the outer wall of a vacuum chamber, in which the space is in contact with the outer wall of the vacuum chamber; isolating the vacuum chamber and the air from each other with the space covered with a bag; providing a substrate provided with the insulating film in the vacuum chamber covered with the bag; and introducing a source gas in the vacuum chamber and generating plasma to form a microcrystalline semiconductor film over the insulating film; and forming a buffer layer over the microcrystalline semiconductor film. As for formation of the microcrystalline semiconductor film, a deposition condition is changed step-by-step or continuously so that the deposition rate in a first region in the vicinity of an interface with a buffer layer is higher than the deposition rate in a second region in the vicinity of an interface with the insulating film.

The present invention is to solve at least one of the above problems. Note that the clause "a deposition condition is continuously changed" indicates that a change of a deposition condition is smooth with respect to elapsed time, while the clause "a deposition condition is changed step-by-step" indicates that a deposition condition decreases or increases in a stepwise manner with respect to elapsed time. For example, in the case where a gas flow rate is changed as a deposition condition, when a graph shows time on the horizontal axis and a gas flow rate on a vertical axis, the former deposition condition draws an upward-sloping curve or straight line or a downward-sloping curve or straight line, while the latter deposition condition draws an upward-sloping or downward-sloping graph in a stepwise manner.

In addition to the above method of manufacturing a semiconductor, a semiconductor film containing an n-type impurity element is formed over the buffer layer, a source or drain electrode is formed over the semiconductor film containing an n-type impurity element, the semiconductor film containing an n-type impurity element is etched to form source and drain regions, and part of the buffer layer is etched and removed such that regions overlapping the source and drain regions are left remaining.

Note that, when plasma is generated in the vacuum chamber to perform film deposition treatment, the pressure in the vacuum chamber is at a maximum of $2 \times 10^{-2}$ Torr (2.666 Pa) to 1 Torr (133.3 Pa), and it is preferable that the pressure be set at a high degree of vacuum lower than $2 \times 10^{-2}$ Torr to reduce the residue of an atmospheric constituent gas. The ultimate pressure is lowered to be an ultra-high vacuum (UHV) from $1 \times 10^{-10}$ Torr to $1 \times 10^{-7}$ Torr (greater than or equal to approximately $1 \times 10^{-8}$ Pa and less than or equal to approximately $1 \times 10^{-5}$ Pa,) so that a residue of an atmospheric constituent gas such as oxygen, nitrogen, or $H_2O$ in a vacuum chamber (reaction container) is reduced in advance before film deposition as much as possible, a source gas with high purity is supplied, and substrate temperature in film deposition is set at higher than or equal to 100° C. and lower than 300° C.

In the case where ultra-high vacuum evacuation is performed to obtain the degree of vacuum higher than $10^{-5}$ Pa in the chamber, it is preferable to use a turbo-molecular pump and a cryopump. Evacuation is performed with the turbo-molecular pump, and then vacuum evacuation is performed with the cryopump.

Since a plasma CVD apparatus generates heat which increases a temperature of the outer wall of the chamber in film deposition, a cooling means such as a water-cooling mechanism or the like is provided on the outer wall of the chamber. It is preferable that the bag cover the cooling means. In addition, a noble gas or a hydrogen gas successively flows in the bag, whereby the outer wall of the chamber may be cooled by exhausting the gas which is heated to the outside. Further, the outer wall of the chamber may be cooled by flowing a cooled noble gas or a cooled hydrogen gas inside the bag.

As for the plasma CVD apparatus, not only a gas introduction system and an exhaust system but also a sealing portion is provided in various positions and for example, the vacuum chamber can be opened or closed for maintenance and an open/close portion is airtight by a sealing material. In the present invention, at least the sealing portion of the open/close portion is covered with the bag.

In this specification, the bag is used to cover the entire outer wall of the chamber, but actually there is no limitation on portions and means to cover therewith; at least a portion that has a possibility to generate leakage may be covered. For example, only the periphery of the sealing portion of a member that forms the outer wall of the chamber is covered with tape (the tape which combines an adhesive layer and an aluminum foil) and a hollow portion is provided between the tape and the outer wall to flow a noble gas or a hydrogen gas in the hollow portion. Needless to say, a material for the tape that has enough barrier properties with respect to oxygen or nitrogen is used. It is advantageous in cost when part of the outer wall of the chamber is covered, because it requires a small amount of gas, as compared with the case where the entire outer wall of the chamber is covered.

According to the present invention, even if a sealing defect occurs in the sealing portion of the plasma CVD apparatus, a noble gas or hydrogen which is adjacent to the sealing portion where a defect occurs just enters the vacuum chamber and an atmospheric component can be prevented from entering the vacuum chamber that causes plasma reaction. Therefore, a semiconductor film having stable quality can be provided.

By using the bag, the atmospheric component in the chamber is at low concentration relatively simple and easy at low cost, whereby the film quality of an obtained semiconductor film can be greatly improved. Conventionally, nitrogen has been referred to as an inert gas and thought as an element which has had no influence even if a very small amount of nitrogen have entered the chamber. Nitrogen which is one of the atmospheric components is a gas that accounts for about 80% of the air. Accordingly, in a state where the outer wall of the chamber is in contact with the air, the fact that it is difficult to prevent the entry of nitrogen from various sealing portions included in the chamber attracts attention; in particular, nitrogen is found as an element that is desired to be removed as much as possible from the vacuum chamber in the formation of a microcrystalline semiconductor film, which leads to this structure of the present invention.

Note that it is not limited to a microcrystalline semiconductor film, and the film quality of a semiconductor film such as an amorphous semiconductor film, a polycrystalline semiconductor film, a compound semiconductor film, or the like can also be greatly improved.

The present invention is combined with a method in which, while a local clean space is kept by the substrate transportation container which can be sealed up, such as a front opening unified pod (FOUP) or the like, a substrate is stored in the substrate transportation container to be transferred to the next process. Further, reducing oxygen concentration and nitrogen concentration in the chamber of the plasma CVD apparatus is preferable. Although a vacuum state is kept in the substrate transportation container, a noble gas or a hydrogen gas is used as a high purity gas instead of nitrogen when a gas for replacement is introduced in the substrate transportation container.

In the present invention, a space which has low oxygen concentration and low nitrogen concentration is provided between the outer wall of the vacuum chamber formed of stainless steel or the like and the air which is under atmospheric pressure. Note that the outer wall as well as the inner wall of the chamber has a mirror-like finish, whereby moisture or an atmospheric component attached to the outer wall is reduced.

To be an atmosphere which has low oxygen concentration and low nitrogen concentration, the bag is contracted once when vacuum evacuation is performed. Therefore, a material for the bag is shrinkable. After vacuum evacuation is performed, a sharp portion is cut off so that an exterior surface has a curved surface or the thickness of the bag is sufficiently thick for prevention of the bag broken by close arrangement to the corner of the outer wall of the chamber or the like.

The space which has low oxygen concentration and low nitrogen concentration is provided between the outer wall of the vacuum chamber for film deposition treatment and the air which is under atmospheric pressure, whereby atmospheric component concentration in the vacuum chamber having the sealing portion that is provided for maintenance of the apparatus can be prevented from increasing.

BRIEF DESCRIPTION OF THE DRAWINGS

FIG. 8 is a diagram which illustrates an example of a time chart describing a process for forming a microcrystalline silicon film.

DETAILED DESCRIPTION OF THE INVENTION

Embodiment Mode

Embodiment modes of the present invention are described below.

(Embodiment Mode 1)

Figure 1:
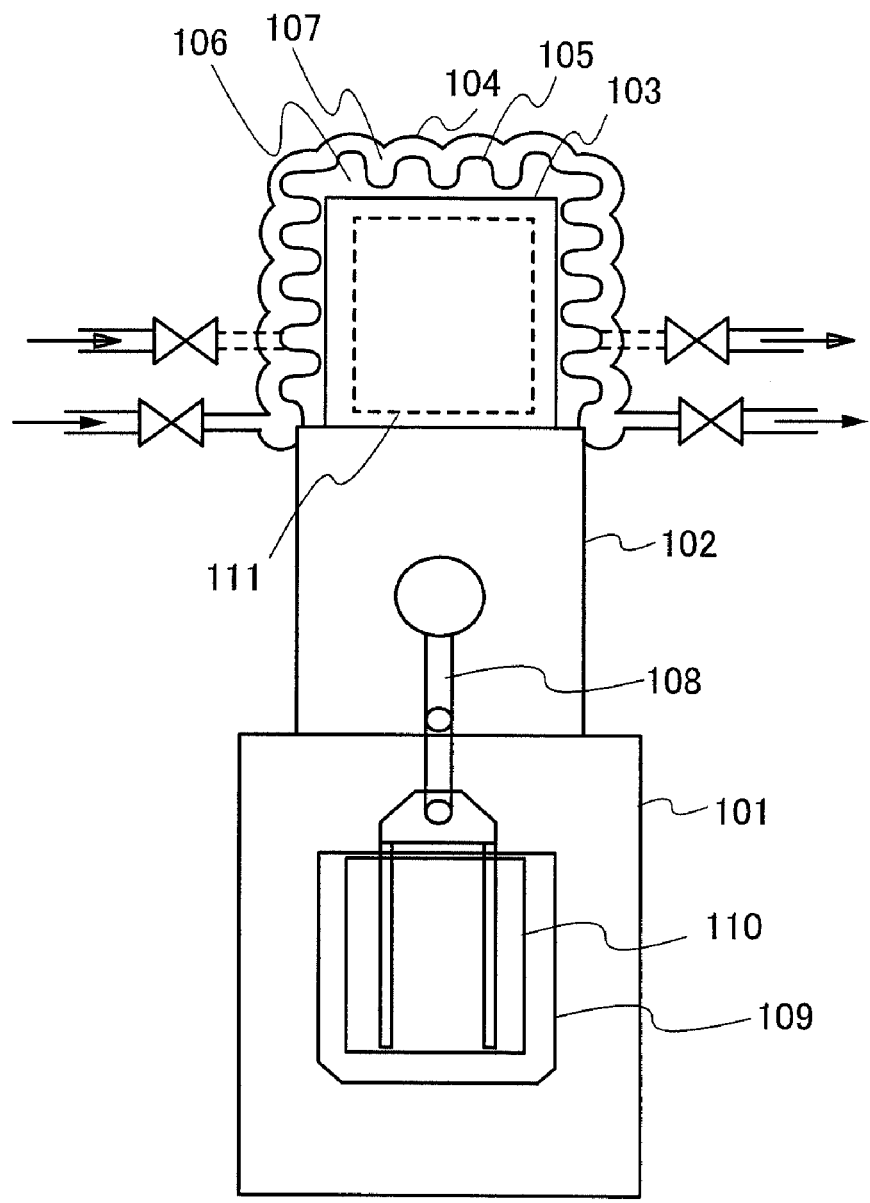
FIG. 1 is a top view which illustrates an example of a film deposition apparatus.

FIG. 1 is a top view of an example of a film deposition apparatus. A load chamber 101 which is provided with a cassette 109 loaded with a substrate to be processed 110 is coupled to a transfer chamber 102 provided with a carrier robot 108. A vacuum chamber 103 for film deposition treatment is coupled to the transfer chamber 102. Each of the load chamber 101, the transfer chamber 102, and the vacuum chamber 103 for film deposition treatment is provided with a vacuum evacuation means and a gas supply means. Note that a gate valve is provided at each of joint portions.

Conventionally, while film deposition operation is not performed, the load chamber and the transfer chamber are vacuum evacuated once, and then they are filled with a nitrogen gas. In the present invention, to reduce nitrogen concentration, the load chamber 101 and the transfer chamber 102 are returned to atmospheric pressure using a noble gas or a hydrogen gas, instead of a nitrogen gas.

A first space 106 is divided by a first bag 105 so as to surround the vacuum chamber 103 for film deposition treatment, and a second space 107 is divided by a second bag 104 so as to surround the first bag 105. The exterior surface of the second bag 104 is exposed to the air. By use of the first space 106 and the second space 107, the vacuum chamber 103 and the air that contains a large amount of nitrogen are separated from each other. Although not illustrated here, in order to suppress the swelling of the second bag 104 due to the supply of a gas, a depressed portion is held by a string (or a metal wire or the like) and anchored, so that the exterior surface of the second bag 104 is uneven. The first space 106 is anchored by a string so that the width of the first space 106 is 1 cm to 10 cm. Similarly, in order to suppress the swelling of the first bag 105 due to the supply of a gas, a depressed portion is held by a string (or a metal wire or the like) and anchored, so that the exterior surface of the first bag 105 is uneven. The second space 107 is anchored by a string so that the width of the second space 107 is 1 cm to 10 cm. That is, the distance between the first bag 105 and the second bag 104 is 1 cm to 10 cm.

First, before the substrate to be processed 110 is transferred in the load chamber 101, both the first space 106 and the second space 107 are vacuum evacuated using an evacuation means coupled to respective bags and the bags are filled with a noble gas or a hydrogen gas by a gas supply means coupled to respective bags. Note that, in order to constantly supply a clean gas to each space, a noble gas or a hydrogen gas is supplied in a constant flow rate by the gas supply means, so that each space is exhausted.

In order to expand the space between the vacuum chamber 103 for film deposition treatment and the air, both the first space 106 and the second space 107 preferably have a positive pressure.

Next, the transfer chamber 102 is vacuum evacuated, and the vacuum chamber 103 is vacuum evacuated. At this stage, the entire periphery of the vacuum chamber 103 for film deposition treatment is surrounded by the first space 106 and the second space 107 which are filled with a noble gas or hydrogen, the transfer chamber that is vacuum evacuated, and a floor of a clean room, which prevents entering of an atmospheric component from the outside of the vacuum chamber 103.

Next, precoating in the vacuum chamber 103 for film deposition treatment is performed before substrate transfer, whereby a silicon film is formed as an inner wall coating film. In precoating, after removing a gas (an atmospheric component such as oxygen and nitrogen or an etching gas used in cleaning the vacuum chamber) that is attached to the inner wall of the vacuum chamber by generating plasma by introducing hydrogen or a noble gas, a silane gas is introduced to generate plasma. Since a silane gas reacts with oxygen, moisture, or the like, oxygen and moisture in the vacuum chamber can be removed by flowing a silane gas, and further, generating silane plasma. In addition, by performing precoating, a metal element of a member constituting the vacuum chamber can be prevented from entering the microcrystalline silicon film as an impurity. In other words, by covering the inside of the vacuum chamber with silicon, the inside of the vacuum chamber can be prevented from being etched by plasma, and the impurity concentration of the microcrystalline silicon film formed later can be reduced. Moreover, this treatment includes a process of covering the inner wall of the vacuum chamber with a film of the same kind as a film to be deposited over the substrate.

Next, the cassette 109 provided with a plurality of substrates to be processed 110 is arrange in the load chamber 101 filled up with a noble gas or hydrogen. Instead of the cassette, a plastic case referred to as a FOUP may be used. This plastic case is a case in which degassing is suppressed and which is provided so as not to be exposed to the air in being transferred from a device to another device. In the case where the FOUP is used, if the FOUP that stores a plurality of substrates is filled with a noble gas or hydrogen and the transfer chamber 102 is provided with a FOUP opener mechanism, the FOUP opener mechanism is automatically opened and serves as a mechanism to be carried to the vacuum chamber using the carrier robot.

Next, the inside of the load chamber 101 provided with the cassette 109 is vacuum evacuated to be the degree of vacuum at the same or substantially the same level as the vacuum chamber 103 and the transfer chamber 102. Then, the gate valve between the transfer chamber 102 and the load chamber 101 is opened, the substrate to be processed 110 is taken out from the cassette using the carrier robot 108 included in the transfer chamber 102 to be transferred to the transfer chamber 102, and then the gate valve is closed. Next, the gate valve between the transfer chamber 102 and the vacuum chamber 103 for film deposition treatment is opened; the substrate to be processed 110 is transferred to the vacuum chamber 103 using the carrier robot 108 included in the transfer chamber 102; the substrate to be processed is moved to a location 111 as shown by a dotted line; and the gate valve is closed.

Next, a source gas is supplied, and plasma is generated by a plasma generation means in the vacuum chamber 103 for film deposition treatment, whereby a semiconductor film is formed over the substrate to be processed. Note that, in the present invention, a gas including oxygen or nitrogen is not used for the source gas.

In this embodiment mode, a silane gas and hydrogen are used as a source gas and a microcrystalline silicon film is formed. To form a microcrystalline silicon film, a flow rate of hydrogen to a silane gas is greater than or equal to 12 times and less than or equal to 1000 times, preferably, greater than or equal to 50 times and less than or equal to 200 times, more preferably, 100 times. As the source gas, instead of a silane gas, $SiH_2Cl_2$, $SiHCl_3$, $SiCl_4$, $SiF_4$, or the like can be used.

Further, an energy band width may be adjusted to 1.5 eV to 2.4 eV or 0.9 eV to 1.1 eV by mixing hydride of carbon such as $CH_4$ or $C_2H_6$, a germanium hydride such as $GeH_4$ or $GeF_4$, or a germanium fluoride into a gas such as a silane gas or the like. By adding carbon or germanium to silicon, the temperature characteristic of a TFT can be changed.

Here, under the first deposition condition, silane is diluted with greater than 100 times and less than or equal to 2000 times of hydrogen and/or a noble gas, and the heating temperature of the substrate is 100° C. to 300° C., preferably 120° C. to 220° C. Film deposition is preferably performed at 120° C. to 220° C. to inactivate the growth surface of the microcrystalline silicon film with hydrogen and to promote the growth of microcrystalline silicon.

Next, the first deposition condition is changed into the second deposition condition which has a higher deposition rate than that of under the first deposition condition to form a microcrystalline silicon film. In this embodiment mode, deposition time of the microcrystalline silicon film includes a first film deposition period in which film deposition is performed under the first deposition condition, and a second film deposition period in which film deposition is performed under the second deposition condition.

Next, after film deposition of the microcrystalline silicon under the second deposition condition is completed, supply of the source gas such as a silane gas and hydrogen, the high-frequency power is stopped, and substrate removal is performed. In the case of performing the film deposition treatment to a subsequent substrate, the same treatment starting from substrate transfer is performed. The cleaning is performed to remove a film or powder which is attached to the vacuum chamber.

For the cleaning, plasma etching is performed by introducing an etching gas typified by $NF_3$ and $SF_6$. Alternatively, a gas which can etch without using plasma, such as $ClF_3$ or the like, is introduced to perform the cleaning. In the stage of the cleaning, it is preferable to turn off the heater for heating the substrate in order to reduce temperature. This is to suppress generation of a reaction by-product due to etching. After completion of cleaning, the same treatments as described above may be performed to the subsequent substrate starting from precoating.

In the formation of the microcrystalline silicon film, since film deposition is performed with a crystal growth, the deposition time of the microcrystalline silicon film is a longer period of time than that of an amorphous silicon film. However, according to the present invention, even when the deposition time is longer, the oxygen concentration and the nitrogen concentration in the vacuum chamber for film deposition treatment can be reduced as low as possible; therefore, a homogeneous microcrystalline silicon film with high quality can be obtained.

Since the outer wall of the chamber is heated when plasma is generated, a cooling means which cools the outer wall of the chamber, such as a water-cooling mechanism or the like, may be provided separately. Needless to say, this water-cooling mechanism is also arranged in the bag to surround the space. Further, a gas is continuously supplied to this space, the heat of the outer wall of the chamber is carried using the gas, and the gas with heat is exhausted, whereby heat generated from the whole chamber can be dissipated.

In this embodiment mode, the example is described in which the space that just surrounds the vacuum chamber for film deposition treatment is provided; however, there is no particular limitation. The space that surrounds the transfer chamber may be divided by the bag, and preferably, the space that surrounds the whole manufacturing apparatus including the load chamber may be divided by the bag.

Note that, when maintenance of the vacuum chamber for film deposition treatment is performed, the atmosphere that a worker can work is set by removing the bag or supplying the air to the bag. Therefore, the oxygen meter which can measure the oxygen concentration of 19% or more is used when maintenance is performed. The plasma CVD apparatus has a structure which is provided with the sealing portion which can open the chamber for maintenance and in which this sealing portion is in contact with the air; therefore, there has been a limitation on the reduction in the oxygen concentration and nitrogen concentration in the chamber. In the present invention, the periphery of the vacuum chamber for film deposition treatment is covered with the bag and the space where oxygen concentration and nitrogen concentration are reduced is provided between the vacuum chamber and the air, whereby the oxygen concentration and nitrogen concentration in the vacuum chamber for film deposition treatment is reduced as low as possible.

Sealing portions are provided in various portions of the film deposition apparatus. Even if one of these is slightly deteriorated, the sealing portion which is deteriorated can be separated from the air by the space filled with a noble gas or a hydrogen gas, and low oxygen concentration and low nitrogen concentration can be kept in the vacuum chamber for film deposition treatment. Therefore, the apparatus illustrated in FIG. 1 can provide a homogeneous film for a long period of time compared with the conventional device.

The apparatus illustrated in FIG. 1 illustrates the example of a film deposition apparatus of single wafer type which deposits over a substrate one by one; however, there is no particular limitation, and the present invention can be applied to a film deposition apparatus of batch type which deposits over a plurality of substrates. When the film deposition apparatus of batch type is used, a space may be provided using one bag that surrounds a plurality of chambers, or a plurality of spaces may be provided using the same number of bags as chambers.

Figure 2:
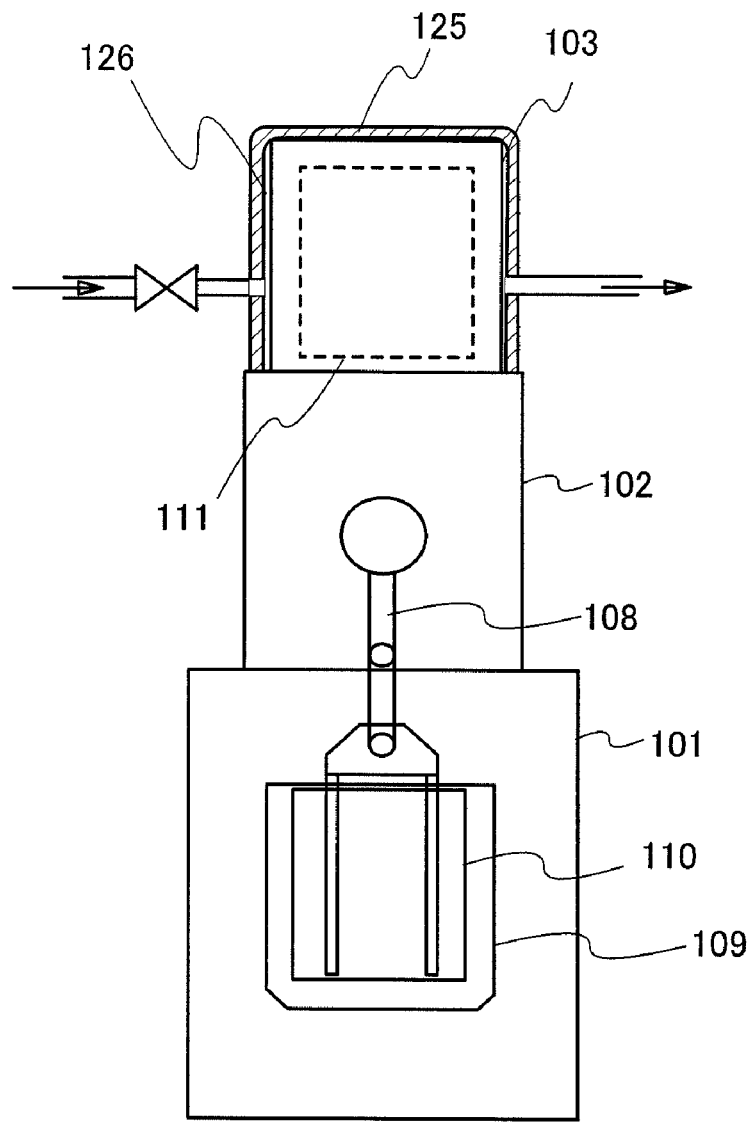
FIG. 2 is a top view which illustrates an example of a film deposition apparatus.
Figure 3:
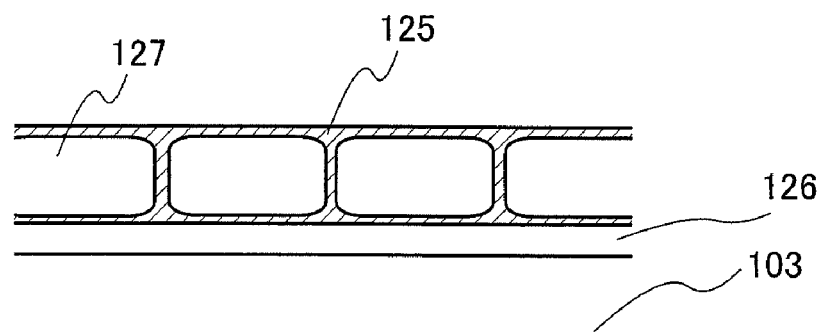
FIG. 3 is an enlarged view of part of a film deposition apparatus.

A top view of an example of the plasma CVD apparatus using a bubble cushioning material 125 as a bag is illustrated in FIG. 2. An enlarged view of part of the periphery of the outer wall of the chamber is illustrated in FIG. 3. In FIGS. 2 and 3, the same numeral is used for the same portion as that in FIG. 1.

In the similar manner to FIG. 1, the film deposition apparatus illustrated in FIG. 2 includes the vacuum chamber 103 for film deposition treatment, the transfer chamber 102, and the load chamber 101 which is provided with the cassette 109 loaded with the substrate to be processed 110.

The bubble cushioning material 125 is provided such that at least part of the bubble cushioning material 125 is in contact with the outer wall of the vacuum chamber 103 in order to reduce the space between the outer wall of the vacuum chamber 103 and the bubble cushioning material 125. As illustrated in FIG. 3, the bubble cushioning material 125 has a plurality of bubbles 127 whose periphery is surrounded with a resin. As this resin, a polyethylene resin, a polypropylene resin, a polyvinyl chloride resin, a polyvinylidene chloride resin, a cellulose acetate resin, a fluorine-containing resin, a polyamide resin, and the like are given, and especially, a polyamide resin and a fluorine-containing resin which are low oxygen transmittance and low nitrogen transmittance are preferable.

The bubbles 127 contain a high-purity noble gas or hydrogen. When the bubble cushioning material 125 is manufactured, bubbles are sealed up using a high purity gas of 9N (99.9999999%).

Since it is difficult to eliminate the space even when the space between the outer wall of the vacuum chamber 103 and the bubble cushioning material 125 is narrowed, a gas supply means that supplies a noble gas or a hydrogen gas causing a current of air in this strait space 126 is provided. In the film deposition apparatus of FIG. 2, an argon gas is continuously flowing to the space 126, whereby the argon gas is exhausted before reaching the outer wall of the chamber even if oxygen, nitrogen, or the like each of which is an atmospheric component passes through the bubble cushioning material 125. Therefore, in the film deposition apparatus of FIG. 2, the space 126 may be the same or substantially the same atmospheric pressure as that of the outside air.

The vacuum chamber 103 is surrounded by the bubble cushioning material 125, whereby space saving of the film deposition apparatus can be further achieved, compared with that of FIG. 1. In addition, the total amount of a noble gas or hydrogen gas to be supplied can be reduced more than that of FIG. 1. In particular, when an expensive high purity gas is supplied to the space 126, the film deposition apparatus of FIG. 2 has an advantageous effect.

Alternatively, the bubble cushioning material 125 may be partly attached to the outer wall of the chamber while the bubble cushioning material 125 has a path where a current of air flows so as not to swell the whole bubble cushioning material 125, which increases the volume of the space 126 when a noble gas or a hydrogen gas flows to the space 126. When part of the outer wall of the chamber and the bubble cushioning material are attached to each other, a portion which is partly attached is a region excluding the periphery of the sealing portion of the vacuum chamber, for example, a portion without connection part. Part attachment can provide a film deposition apparatus which saves further space. In addition, the amount of a gas to be supplied to the space can be reduced.

When the inside of the vacuum chamber is maintained, the bubble cushioning material 125 is removed. When maintenance is completed, a new bubble cushioning material may be provided to surround the vacuum chamber, and a gas supply means may be provided in a tiny space between the vacuum chamber and the bubble cushioning material. Needless to say, the same bubble cushioning material may be used. However, components of bubbles included in the bubble cushioning material might be changed with time; therefore, a new bubble cushioning material which includes almost no atmospheric component in bubbles is preferably used.

In this manner, the apparatus of FIG. 2 is provided with the bubble cushioning material 125 and the gas supply means which supplies a noble gas or hydrogen to the space, whereby the air and the vacuum chamber 103 are separated from each other, and the atmospheric component concentration in the vacuum chamber 103 can be prevented from increasing for a long period of time.

(Embodiment Mode 2)

In this embodiment mode, manufacturing steps of thin film transistors used for a liquid crystal display device are described with reference to FIGS. 4A to 4D, FIGS. 5A to 5D, FIGS. 6A to 6C, FIG. 7, and FIG. 8. FIGS. 4A to 4D, FIGS. 5A to 5D, and FIGS. 6A to 6C are cross-sectional views illustrating a manufacturing process of a thin film transistor, and FIG. 7 is a top view illustrating a connection region of a thin film transistor and a pixel electrode in a single pixel. Further, FIG. 8 is a timing chart illustrating a film deposition method of a microcrystalline silicon film.

A thin film transistor having a microcrystalline semiconductor film, which is of n-type, is more suitable for use in a driver circuit than that of p-type because it has a higher mobility. It is preferable that all thin film transistors formed over the same substrate have the same polarity, in order to reduce the number of steps. Here, description is made using an n-channel thin film transistor.

Figure 4A:
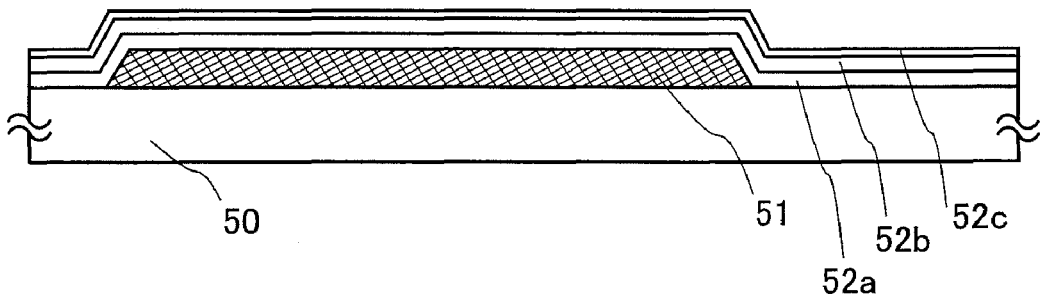
FIGS. 4A to 4D are cross-sectional views describing a manufacturing method of the present invention.

As illustrated in FIG. 4A, a gate electrode 51 is formed over a substrate 50. As the substrate 50, any of the following substrates can be used: non-alkaline glass substrates made of barium borosilicate glass, aluminoborosilicate glass, aluminosilicate glass, or the like by a fusion method or a float method. When the substrate 50 is mother glass, the substrate may have any of the following sizes: the first generation (e.g., 320 mm×400 mm), the second generation (e.g., 400 mm×500 mm), the third generation (e.g., 550 mm×650 mm), the fourth generation (e.g., 680 mm×880 mm, or 730 mm×920 mm), the fifth generation (e.g., 1000 mm×1200 mm, or 1100 mm×1300 mm), the sixth generation (e.g., 1500 mm×1800 mm), the seventh generation (e.g., 1900 mm×2200 mm), the eighth generation (e.g., 2160 mm×2460 mm), the ninth generation (e.g., 2400 mm×2800 mm), the tenth generation (e.g., 2850 mm×3050 mm), and the like.

The gate electrode 51 is formed using a metal material such as titanium, molybdenum, chromium, tantalum, tungsten, or aluminum or an alloy material thereof. The gate electrode 51 can be formed in such a manner that a conductive film is formed over the substrate 50 by a sputtering method or a vacuum evaporation method; a mask is formed over the conductive film by a photolithography technique or an inkjet method; and the conductive film is etched using the mask. Alternatively, the gate electrode 51 can be formed by discharge of a conductive nanopaste of silver, gold, copper, or the like by an inkjet method and by baking the conductive nanopaste. Note that, as barrier metal which increases adhesion between the gate electrode 51 and the substrate 50 and prevents diffusion to a base, a nitride film of the above-mentioned metal material may be provided between the substrate 50 and the gate electrode 51. Here, the gate electrode is formed by etching a conductive film formed over the substrate 50, with a resist mask formed using a first photomask.

As a specific example of a structure of the gate electrode, a structure in which a molybdenum film is stacked on an aluminum film so that a hillock and electromigration specific to aluminum are prevented may be employed. Further, a three-layer structure in which an aluminum film is sandwiched by molybdenum films may be employed as well. Further, as other examples of the structure of the gate electrode, a stacked-layer structure in which a molybdenum film is stacked on a copper film, a stacked-layer structure in which a titanium nitride film is stacked on a copper film, and a stacked-layer structure in which a tantalum nitride film is stacked on a copper film can be given.

Note that, because a semiconductor film and a wiring are to be formed over the gate electrode 51, it is desired that the gate electrode 51 be processed so that its edge portions are tapered in order to prevent disconnection. Further, although not illustrated, a wiring connected to the gate electrode can also be formed at the same time when the gate electrode is formed.

Next, gate insulating films 52a, 52b, and 52c are formed in this order over the gate electrode 51. A cross-sectional view up through this step is FIG. 4A.

Each of the gate insulating films 52a, 52b, and 52c can be formed of a silicon oxide film, a silicon nitride film, a silicon oxynitride film, or a silicon nitride oxide film by a CVD method, a sputtering method, or the like. In order to prevent interlayer short circuit caused by a pinhole or the like formed in the gate insulating films, it is preferable to form plural layers using different insulating layers. Here, a silicon nitride film, a silicon oxynitride film, and a silicon nitride film are stacked in this order as the gate insulating films 52a, 52b, and 52c respectively.

Here, a silicon oxynitride film means a film that contains more oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

A film thickness of each of a first layer and a second layer of the gate insulating films is to be larger than 50 nm. It is preferable that the first layer of the gate insulating films be a silicon nitride film or a silicon nitride oxide film in order to prevent diffusion of an impurity (e.g., alkali metal) from the substrate. Further, the first layer of the gate insulating films can prevent oxidation of the gate electrode and can also prevent hillock in the case of using aluminum for the gate electrode. A third layer of the gate insulating films that comes into contact with a microcrystalline semiconductor film is to have a thickness that is greater than 0 nm and less than or equal to 5 nm, desirably about 1 nm. The third layer of the gate insulating films is provided to improve adhesion with the microcrystalline semiconductor film. Further, when the third layer of the gate insulating films is formed of a silicon nitride film, oxidation of the microcrystalline semiconductor film by heat treatment performed later can be prevented. For example, if heat treatment is performed in the state in which an insulating film including a large amount of oxygen is in contact with the microcrystalline semiconductor film, there is a possibility that the microcrystalline semiconductor film may be oxidized.

Further, the gate insulating films are preferably formed by a microwave plasma CVD apparatus with a frequency of 1 GHz or more. A silicon oxynitride film or a silicon nitride oxide film formed by a microwave plasma CVD apparatus has high withstand voltage, so that reliability of a thin film transistor can be improved.

Although here, the gate insulating films employ a three-layer structure, a single layer of a silicon nitride film may be used in the case where a thin film transistor is used for a switching element of a liquid crystal display device, in which AC driving is performed.

After forming the gate insulating films, the substrate is transferred without exposure to the air, and a microcrystalline semiconductor film 53 is preferably formed in a vacuum chamber that is different from a vacuum chamber for forming the gate insulating films.

In this embodiment mode, the microcrystalline semiconductor film 53 is formed using the film deposition apparatus illustrated in FIG. 1. The periphery of the film deposition apparatus is filled with an argon gas, whereby low oxygen concentration and low nitrogen concentration can be kept in the film deposition apparatus.

A procedure for forming the microcrystalline semiconductor film 53 is described below also with reference to FIG. 8. FIG. 8 illustrates the procedure starting from a step where vacuum evacuation 200 is performed in the vacuum chamber that is under atmospheric pressure. Then, the following treatments are shown in chronological order: precoating 201, substrate transfer 202, base pretreatment 203, film deposition treatment 204, substrate removal 205, and cleaning 206. Note that the procedure is not limited to performing vacuum evacuation starting from atmospheric pressure, and it is preferable to maintain the vacuum chamber under a certain degree of vacuum at all times in terms of mass production as well as in terms of reducing the ultimate vacuum in a short time.

In this embodiment mode, ultra-high vacuum evacuation is performed in order to achieve a higher degree of vacuum than $10^{-5}$ Pa in the vacuum chamber before substrate transfer. This step corresponds to the vacuum evacuation 200 in FIG. 8. In the case of performing such ultra-high vacuum evacuation, it is preferable to use a turbo-molecular pump and a cryopump. Evacuation is performed with the turbo-molecular pump, and vacuum evacuation is performed with the cryopump. It is also effective to conduct vacuum evacuation with two turbo-molecular pumps connected in series. Further, it is preferable to perform heat treatment by providing a heater for baking in the vacuum chamber and perform a treatment of degassing from the inner wall of the vacuum chamber. Moreover, a heater for heating the substrate is also operated to stabilize the temperature. The heating temperature of the substrate is 100° C. to 300° C., preferably 120° C. to 220° C.

Next, the precoating 201 is performed before substrate transfer, and a silicon film is formed as an inner wall coating film. In the precoating 201, after removing a gas (an atmospheric component such as oxygen and nitrogen or an etching gas used in cleaning the vacuum chamber) that is attached to the inner wall of the vacuum chamber by generating plasma by introducing hydrogen or a noble gas, a silane gas is introduced to generate plasma. Since a silane gas reacts with oxygen, moisture, or the like, oxygen and moisture in the vacuum chamber can be removed by flowing a silane gas, and further, generating silane plasma. In addition, by performing the precoating 201, a metal element of a member constituting the vacuum chamber can be prevented from entering the microcrystalline silicon film as an impurity. In other words, by covering the inside of the vacuum chamber with silicon, the inside of the vacuum chamber can be prevented from being etched by plasma, and the impurity concentration of the microcrystalline silicon film formed later can be reduced. The precoating 201 includes treatment in which the inner wall of the vacuum chamber is covered with a film that is of the same kind as a film to be deposited over the substrate.

After the precoating 201, the substrate transfer 202 is performed. Since the substrate over which the microcrystalline silicon film will be deposited is stored in a load chamber on which vacuum evacuation has been performed, the degree of vacuum in the vacuum chamber will not deteriorate remarkably even if the substrate is transferred therein.

Next, the base pretreatment 203 is performed. The base pretreatment 203 is preferably performed because it is particularly effective in the case of forming the microcrystalline silicon film. In the case of forming a microcrystalline silicon film over a glass substrate surface, an insulating film surface, or an amorphous silicon surface by a plasma CVD method, there is a possibility that an amorphous layer may be formed in an initial stage of deposition due to an impurity or lattice mismatch. In order to reduce the thickness of this amorphous layer as much as possible, or to eliminate the amorphous layer if possible, the base pretreatment 203 is preferably performed. As the base pretreatment, noble gas plasma treatment, hydrogen plasma treatment, or a combination of both treatments is preferable. A noble gas element having large mass number, such as argon, krypton, or xenon, is preferably used for the noble gas plasma treatment. This is so that an impurity such as oxygen, moisture, an organic substance, or a metal element that is attached to the surface is removed by a sputtering effect. The hydrogen plasma treatment is effective in that by hydrogen radicals, the above impurity that is adsorbed to the surface is removed, and a clean film surface is formed by an etching effect with respect to the insulating film or the amorphous silicon film. Further, by performing both the noble gas plasma treatment and the hydrogen plasma treatment, the promotion of growth of microcrystal nuclei can be accelerated.

In terms of promoting growth of microcrystal nuclei, it is effective to supply a noble gas such as argon or the like continuously in the initial stage of forming the microcrystalline silicon film, as shown by a broken line 207 in FIG. 8.

Next, the film deposition treatment 204 for forming the microcrystalline silicon film is performed after the base pretreatment 203. In this embodiment mode, a film in the vicinity of an interface with the gate insulating film is formed under a first deposition condition in which the deposition rate is low but the quality of a film to be formed is high, and then a film is further deposited under a second deposition condition in which the deposition rate is high.

There are no particular limitations as long as the deposition rate under the second deposition condition is higher than that under the first deposition condition. Therefore, a microcrystalline silicon film can be formed by a high frequency plasma CVD method with a frequency of several tens to several hundreds of MHz (megahertz) or using a microwave plasma CVD apparatus with a frequency of greater than or equal to 1 GHz. Typically, the microcrystalline silicon film can be formed by generating plasma by diluting silicon hydride such as $SiH_4$ or $Si_2H_6$ with hydrogen. With a dilution with one or plural kinds of noble gas elements selected from helium, argon, krypton, and neon in addition to silicon hydride and hydrogen, the microcrystalline semiconductor film can be formed. In such a case, a flow rate of hydrogen is greater than or equal to 12 times and less than or equal to 1000 times, preferably, greater than or equal to 50 times and less than or equal to 200 times, and more preferably, 100 times as high as that of silicon hydride. Note that, $SiH_2Cl_2$, $SiHCl_3$, $SiCl_4$, $SiF_4$, or the like can be used in place of silicon hydride.

Further, in the case of adding helium to a source gas, since helium has an ionization energy of 24.5 eV that is the largest among all gases and has a metastable state in the level of about 20 eV that is a little lower than the ionization energy, only the difference of about 4 eV is necessary for ionization during discharging. Therefore, discharge starting voltage of helium shows the lowest value in all gases. Because of such characteristics, helium can maintain plasma with stability. Moreover, since uniform plasma can be generated, the plasma density can be homogenized even if an area of a substrate over which the microcrystalline silicon film is deposited is large.

Further, an energy band width may be adjusted to 1.5 eV to 2.4 eV or 0.9 eV to 1.1 eV by mixing hydride of carbon such as $CH_4$ or $C_2H_6$, germanium hydride such as $GeH_4$ or $GeF_4$, or germanium fluoride into a gas such as silane or the like. By adding carbon or germanium to silicon, the temperature characteristic of a TFT can be changed.

Here, under the first deposition condition, silane is diluted with greater than 100 times and less than or equal to 2000 times of hydrogen and/or a noble gas, and the heating temperature of the substrate is 100° C. to 300° C., preferably 120° C. to 220° C. In order to promote growth of microcrystalline silicon, film deposition is preferably performed at 120° C. to 220° C.

Figure 4B:
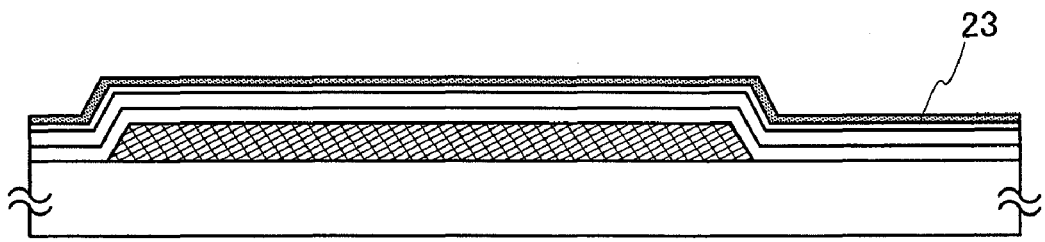

A cross-sectional view up through the step under the first deposition condition is illustrated in FIG. 4B. Over the gate insulating film 52c, a microcrystalline semiconductor film 23 is formed, which is formed with low deposition rate but has good quality. The quality of this microcrystalline semiconductor film 23 obtained under the first deposition condition contributes to increasing the on current and improving the field-effect mobility of a TFT that is formed later; therefore, it is important to sufficiently reduce the oxygen concentration in the film to an oxygen concentration of less than or equal to $1 \times 10^{17}$/cm. Further, by the above procedure, not only the concentration of oxygen that mixes into the microcrystalline semiconductor film is reduced, but those of nitrogen and carbon can also be reduced; therefore, the microcrystalline semiconductor film becoming an n-type can be prevented.

Figure 4C:
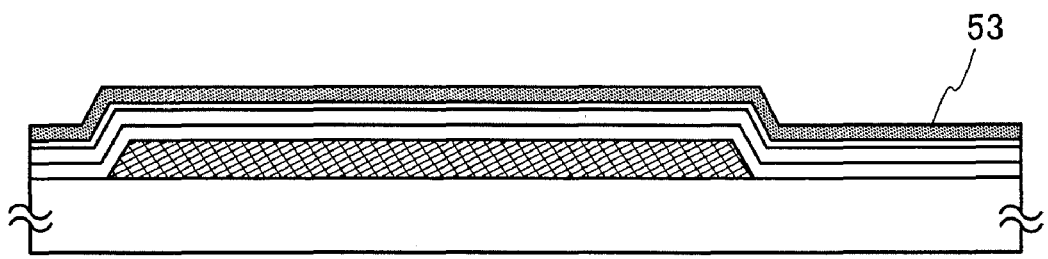

Next, the deposition rate is increased by changing from that under the first deposition condition to that under the second deposition condition, to form the microcrystalline semiconductor film 53. A cross-sectional view of this stage is illustrated in FIG. 4C. The film thickness of the microcrystalline semiconductor film 53 may be 50 nm to 500 nm (preferably 100 nm to 250 nm). Note that in this embodiment mode, deposition time of the microcrystalline semiconductor film 53 includes a first film deposition period in which film deposition is performed under the first deposition condition, and a second film deposition period in which film deposition is performed under the second deposition condition.

Here, under the second deposition condition, silane is diluted with greater than or equal to 12 times and less than or equal to 100 times of hydrogen and/or a noble gas, and the heating temperature of the substrate is 100° C. to 300° C., preferably 120° C. to 220° C. Note that a microcrystalline silicon film is formed under the following condition: a capacitively coupled (parallel plate) CVD apparatus is used, a gap (a distance between an electrode surface and a substrate surface) is 20 nm, the degree of vacuum in the vacuum chamber is 100 Pa, substrate temperature is 300° C., 20 W of high-frequency power with a frequency of 60 MHz is applied, and a silane gas (the flow rate of 8 sccm) is diluted with 50 times of hydrogen (the flow rate of 400 sccm). In addition, when a microcrystalline silicon film is formed under the condition that only the flow rate of a silane gas is changed to 4 sccm and diluted with 100 times under the above deposition condition, the deposition rate is slowed. The deposition rate is increased by fixing the flow rate of hydrogen and increasing the flow rate of silane. The deposition rate is decreased, whereby crystallinity is improved.

In this embodiment mode, a capacitively coupled (parallel plate) CVD apparatus is used, a gap (a distance between an electrode surface and a substrate surface) is set at 20 nm, and a microcrystalline silicon film is formed under the first deposition condition and the second deposition condition. Under the first deposition condition, the degree of vacuum in the vacuum chamber is 100 Pa, substrate temperature is 100° C., 30 W of high-frequency power with a frequency of 60 MHz is applied, and a silane gas (the flow rate of 2 sccm) is diluted with 200 times of hydrogen (the flow rate of 400 sccm). Under the second deposition condition, in order to increase the deposition rate, the gas flow rate is changed, and a silane gas of 4 sccm is diluted with 100 times of hydrogen (the flow rate of 400 sccm) (other conditions are the same as in the first deposition condition).

Next, after film deposition of the microcrystalline silicon under the second deposition condition is completed, supply of the source gas such as silane and hydrogen, and the high-frequency power are stopped, and the substrate removal 205 is performed. In the case of performing the film deposition treatment to a subsequent substrate, the same treatment starting from the substrate transfer 202 is performed. In order to remove a coating film or powder that is attached to the inside of the vacuum chamber, the cleaning 206 is performed.

The cleaning 206 is performed by plasma etching with introduction of an etching gas typified by $NF_3$ and $SF_6$. Alternatively, a gas capable of etching without using plasma, such as $ClF_3$ or the like, is introduced to perform the cleaning 206. The cleaning 206 is preferably performed such that the heater is turned off for low temperature for heating the substrate. This is to suppress generation of a reaction by-product due to etching. After completion of the cleaning 206, the same treatments as described above may be performed to the subsequent substrate starting from the precoating 201. Since $NF_3$ includes nitrogen in the composition, precoating for sufficient reduction in the nitrogen concentration in the film deposition chamber is preferably performed.

Next, after forming the microcrystalline semiconductor film 53, the substrate is transferred without exposure to the air, and a buffer layer 54 is preferably formed in a vacuum chamber that is different from the vacuum chamber for forming the microcrystalline semiconductor film 53. By having separate vacuum chambers for forming the buffer layer 54 and forming the microcrystalline semiconductor film 53, the vacuum chamber for forming the microcrystalline semiconductor film 53 can be a chamber dedicated to having an ultra-high vacuum prior to introducing the substrate. Accordingly, contamination by an impurity can be suppressed to a minimum, and the time it takes to reach an ultra-high vacuum can be shortened. This is particularly effective in the case of performing baking to reach the ultra-high vacuum, because it takes time for the inner-wall temperature of the chamber to become lower and stable. Furthermore, by having separate vacuum chambers, different frequencies of high-frequency power can be used according to film qualities that are to be obtained.

The buffer layer 54 is formed using an amorphous semiconductor film containing hydrogen or halogen. Furthermore, an amorphous semiconductor film including hydrogen can also be formed using hydrogen with a flow rate of greater than or equal to 1 time and less than or equal to 10 times, preferably, greater than or equal to 1 time and less than or equal to 5 times as high as a flow rate of silicon hydride. Further, an amorphous semiconductor film including fluorine, chlorine, bromine, or iodine can also be formed using the above silicon hydride, and a gas including fluorine, chlorine, bromine, or iodine (e.g., $F_2$, $Cl_2$, $Br_2$, $I_2$, HF, HCl, HBr, or HI). Note that, in place of silicon hydride, $SiH_2Cl_2$, $SiHCl_3$, $SiCl_4$, $SiF_4$, or the like can be used.

Alternatively, as the buffer layer 54, an amorphous semiconductor film can be formed by sputtering with hydrogen or a noble gas using an amorphous semiconductor as a target. If a gas including fluorine, chlorine, bromine, or iodine (e.g., $F_2$, $Cl_2$, $Br_2$, $I_2$, HF, HCl, HBr, or HI) is included in the atmosphere, an amorphous semiconductor film including fluorine, chlorine, bromine, or iodine can be formed.

The buffer layer 54 is preferably formed using an amorphous semiconductor film which does not contain crystal grains. Therefore, when the buffer layer 54 is formed by a microwave plasma CVD method or a high-frequency plasma CVD method with a frequency of several tens to several hundreds of MHz (megahertz), deposition conditions are preferably controlled so that an amorphous semiconductor film does not contain crystal grains.

In a later process for forming source and drain regions, the buffer layer 54 is partly etched. It is preferable that the buffer layer 54 is formed with a sufficient thickness so that part of the buffer layer 54 is left remaining after etching, so as not to expose the microcrystalline semiconductor film 53. Typically, it is preferable to form the buffer layer 54 with a thickness of greater than or equal to 100 nm and less than or equal to 400 nm, preferably, greater than or equal to 200 nm and less than or equal to 300 nm. In a display device including a thin film transistor to which high voltage (e.g., about 15 V) is applied, typically, in a liquid crystal display device, if the buffer layer 54 is formed to have a large thickness in the above range, withstand voltage is increased, so that deterioration of the thin film transistor can be prevented even if high voltage is applied to the thin film transistor.

Note that an impurity imparting one conductivity type such as phosphorus or boron is not added into the buffer layer 54. The buffer layer 54 functions as a barrier layer so that an impurity imparting one conductivity type from a semiconductor film 55 to which an impurity imparting one conductivity type is added, is not dispersed into the microcrystalline semiconductor film 53. In the case where the buffer layer is not provided, if the microcrystalline semiconductor film 53 and the semiconductor film 55 to which the impurity imparting one conductivity type is added are in contact with each other, there is a possibility that the impurity may be moved by a later etching process or heating treatment to make control of the threshold value difficult.

Further, by forming the buffer layer 54 over the surface of the microcrystalline semiconductor film 53, natural oxidation of surfaces of crystal grains contained in the microcrystalline semiconductor film 53 can be prevented. In particular, in a region where an amorphous semiconductor is in contact with microcrystal grains, a crack is likely to be caused due to localized stress. When this crack is exposed to oxygen, the crystal grains are oxidized, and silicon oxide is formed.

An energy gap of the buffer layer 54 that is an amorphous semiconductor film is larger than that of the microcrystalline semiconductor film 53 (an energy gap of the amorphous semiconductor film is 1.6 eV to 1.8 eV, and an energy gap of the microcrystalline semiconductor film 53 is 1.1 eV to 1.5 eV). Also, resistance is higher and electron mobility is lower in the buffer layer 54 than in the microcrystalline semiconductor film 53, and the electron mobility of the buffer layer 54 is $\frac{1}{5}$ to $\frac{1}{10}$ of that of the microcrystalline semiconductor film 53. Accordingly, in a thin film transistor that is formed later, the buffer layer that is formed between source and drain regions and the microcrystalline semiconductor film 53 functions as a high-resistant region, and the microcrystalline semiconductor film 53 functions as a channel formation region. Accordingly, the off current of the thin film transistor can be reduced. When the thin film transistor is used as a switching element of a display device, the contrast of the display device can be improved.

Note that over the microcrystalline semiconductor film 53, the buffer layer 54 is preferably formed at a temperature of 300° C. to 400° C. by a plasma CVD method. By this film deposition treatment, hydrogen is supplied to the microcrystalline semiconductor film 53, and the same effect as hydrogenating the microcrystalline semiconductor film 53 can be obtained. In other words, by depositing the buffer layer 54 over the microcrystalline semiconductor film 53, hydrogen is dispersed in the microcrystalline semiconductor film 53, and dangling bonds can be terminated.

Figure 4D:
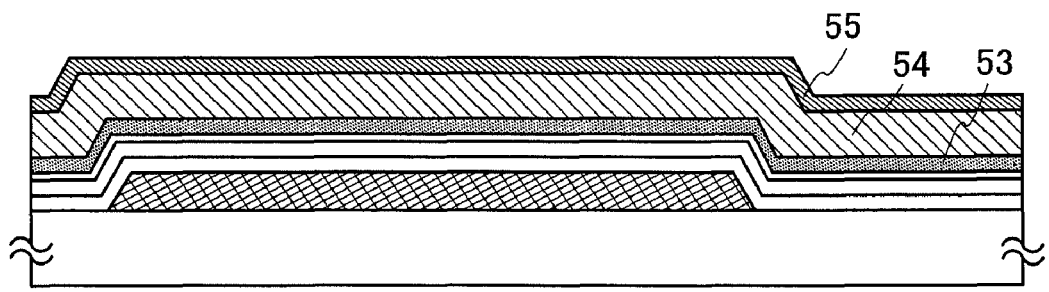

Next, after forming the buffer layer 54, the substrate is transferred without exposure to the air, and the semiconductor film 55 to which the impurity imparting one conductivity type is added is preferably formed in a vacuum chamber that is different from the vacuum chamber for forming the buffer layer 54. A cross-sectional view at this stage is illustrated in FIG. 4D. By forming the semiconductor film 55 to which the impurity imparting one conductivity type is added in a vacuum chamber that is different from the vacuum chamber for forming the buffer layer 54, the impurity imparting one conductivity type can be prevented from mixing into the buffer layer when the buffer layer is formed.

In the case where an n-channel thin film transistor is to be formed, phosphorus may be added as a typical impurity element to the semiconductor film 55 to which the impurity imparting one conductivity type is added, and an impurity gas such as $PH_3$ or the like may be added to silicon hydride. In the case where a p-channel thin film transistor is to be formed, boron may be added as a typical impurity element, and an impurity gas such as $B_2H_6$ or the like may be added to silicon hydride. The semiconductor film 55 to which the impurity imparting one conductivity type is added can be formed using a microcrystalline semiconductor or an amorphous semiconductor. The semiconductor film 55 to which the impurity imparting one conductivity type is added is formed to a thickness of greater than or equal to 2 nm and less than or equal to 50 nm. By formation of the semiconductor film to which an impurity imparting one conductivity type is added to a small thickness, throughput can be improved.

Figure 5A:
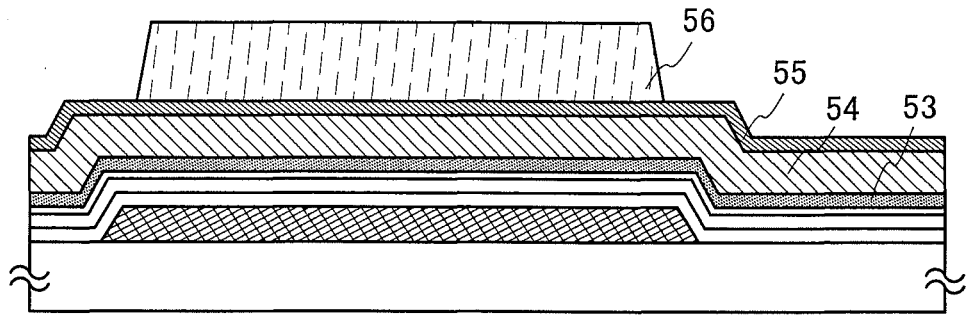
FIGS. 5A to 5D are cross-sectional views describing a manufacturing method of the present invention.

Next, as illustrated in FIG. 5A, a resist mask 56 is formed over the semiconductor film 55 to which the impurity imparting one conductivity type is added. The resist mask 56 is formed by a photolithography technique or an inkjet method. Here, using a second photomask, a resist that is applied over the semiconductor film 55 to which the impurity imparting one conductivity type is added is exposed to light to be developed, whereby the resist mask 56 is formed.

Figure 5B:
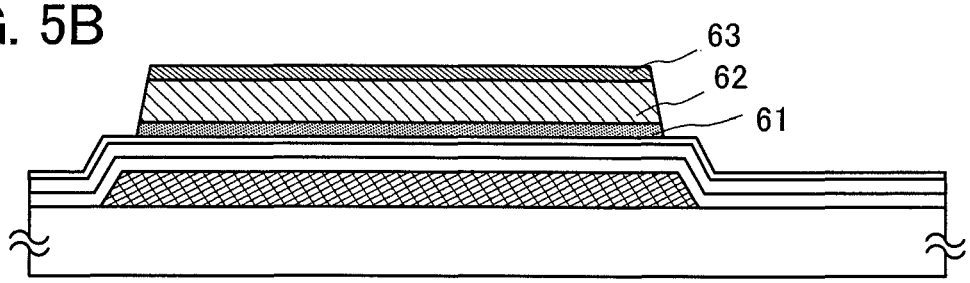

Next, the microcrystalline semiconductor film 53, the buffer layer 54, and the semiconductor film 55 to which the impurity imparting one conductivity type is added are etched using the resist mask 56, to form a microcrystalline semiconductor film 61, a buffer layer 62, and a semiconductor film 63 to which an impurity imparting one conductivity type is added, as illustrated in FIG. 5B. After that, the resist mask 56 is removed.

The side faces in the end portions of the microcrystalline semiconductor film 61 and the buffer layer 62 are inclined, so that leakage current can be prevented from flowing between the source and drain regions formed over the buffer layer 62 and the microcrystalline semiconductor film 61. In addition, leakage current between the source and drain electrodes and the microcrystalline semiconductor film 61 can also be prevented. The inclination angle of the side faces in the end portions of the microcrystalline semiconductor film 61 and the buffer layer 62 is from 30° to 90°, preferably from 45° to 80°. By adopting such an angle, disconnection of the source electrode or the drain electrode due to the step can be prevented.

Figure 5C:
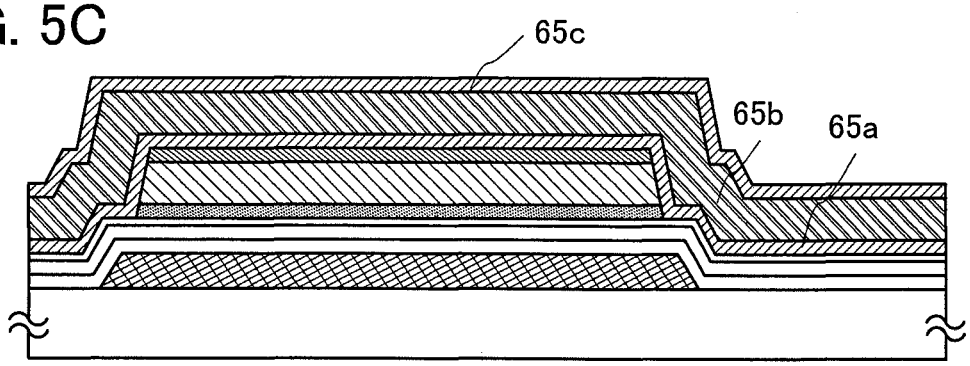

Next, as illustrated in FIG. 5C, conductive films 65a to 65c are formed so as to cover the semiconductor film 63 to which the impurity imparting one conductivity type is added and the gate insulating film 52c. It is preferable that the conductive films 65a to 65c be formed using a single layer or a stacked layer of aluminum, copper, or an aluminum alloy to which an element to improve heat resistance or an element to prevent a hillock such as silicon, titanium, neodymium, scandium, or molybdenum is added. Alternatively, a film in contact with the semiconductor film to which an impurity imparting one conductivity type is added may be formed of titanium, tantalum, molybdenum, or tungsten, or nitride of such an element, and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or nitride thereof to form a stacked-layer structure. Here, as the conductive film, a conductive film with a stacked three-layer structure of the conductive films 65a to 65c is illustrated, and a stacked-layer conductive film where molybdenum films are used as the conductive films 65a and 65c and an aluminum film is used as the conductive film 65b or a stacked-layer conductive film where titanium films are used as the conductive films 65a and 65c and an aluminum film is used as the conductive film 65b can be given. The conductive films 65a to 65c are formed by a sputtering method or a vacuum evaporation method.

Figure 5D:
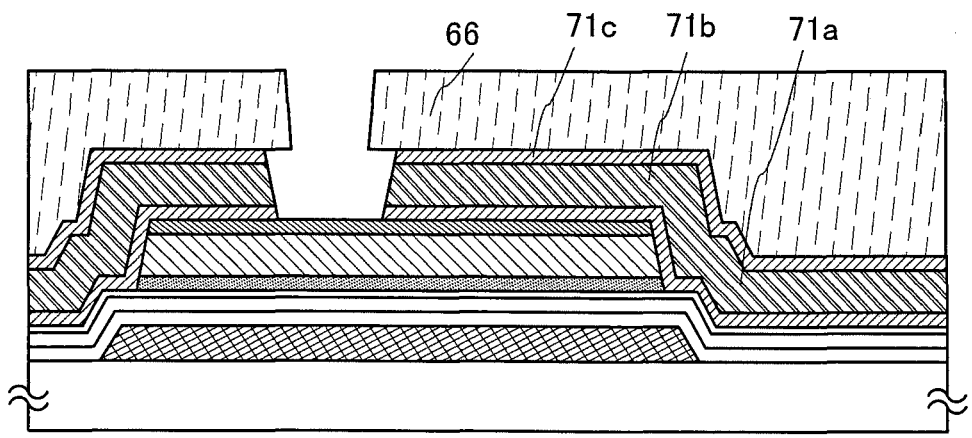

Next, as illustrated in FIG. 5D, a resist mask 66 is formed using a third photomask over the conductive films 65a to 65c, and part of the conductive films 65a to 65c is etched to form a pair of source and drain electrodes 71a to 71c. By performing wet etching on the conductive films 65a to 65c, the conductive films 65a to 65c are selectively etched. Accordingly, the conductive films are isotropically etched, and thus the source and drain electrodes 71a to 71c which have a smaller area than the resist mask 66 can be formed.

Figure 6A:
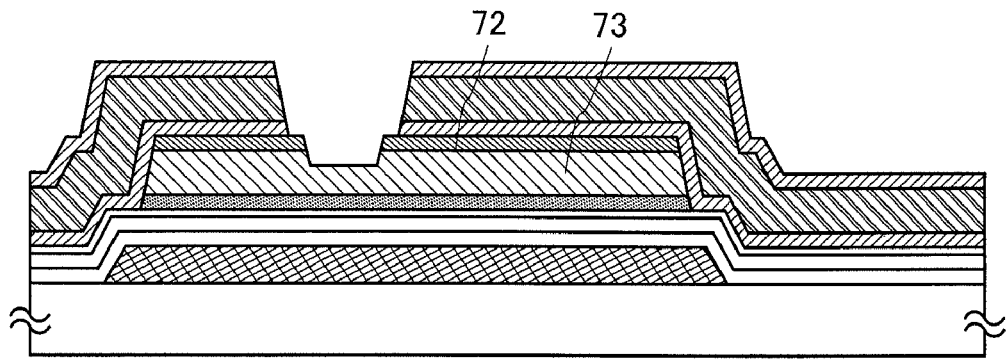
FIGS. 6A to 6C are cross-sectional views describing a manufacturing method of the present invention.
Figure 7:
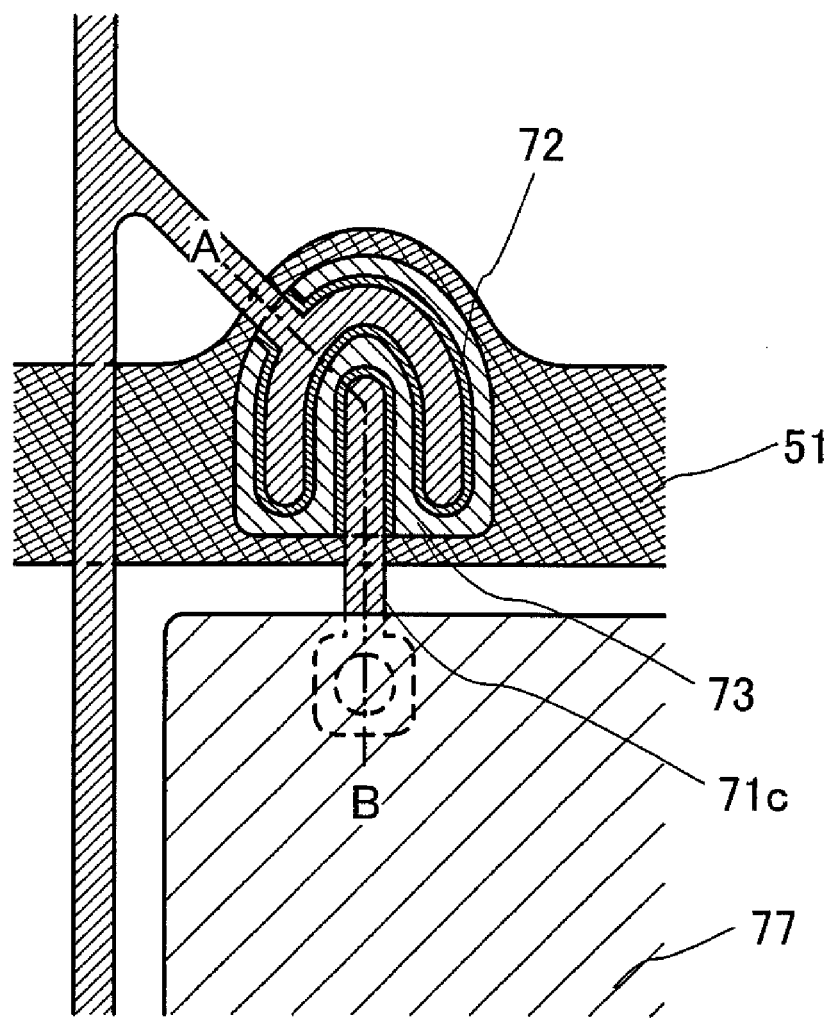
FIG. 7 is a top view describing a manufacturing method of the present invention.

Next, as illustrated in FIG. 6A, the semiconductor film 63 to which the impurity imparting one conductivity type is added is etched using the resist mask 66, to form a pair of source and drain regions 72. In this etching process, part of the buffer layer 62 is also etched. The buffer layer which is partly etched and has a depression (a groove) is referred to as a buffer layer 73. The source and drain regions and the depression (the groove) of the buffer layer can be formed by the same step. With a depth of the depression (the groove) of the buffer layer to ½ to ⅓ of the thickness of the thickest region of the buffer layer, it is possible to have distance between the source region and the drain region. Accordingly, leakage current between the source and drain regions can be reduced. After that, the resist mask 66 is removed.

The quality of the resist mask is changed when the resist mask is exposed to plasma used for, in particular, dry etching or the like and the resist mask is not completely removed in the resist removal step; thus, the buffer layer is etched by about 50 nm so that a residue of the resist mask is not left. The resist mask 66 is used twice for the partial etching treatment of the conductive films 65a to 65c and for the etching treatment at the time of forming the source and drain regions 72, and a residue thereof tends to remain if dry etching is used for each treatment. Therefore, it is effective that the buffer layer that may be etched in removing the residue completely be formed to be thick. In addition, the buffer layer 73 can prevent plasma damage, to the microcrystalline semiconductor film 61 during dry etching.

Figure 6B:
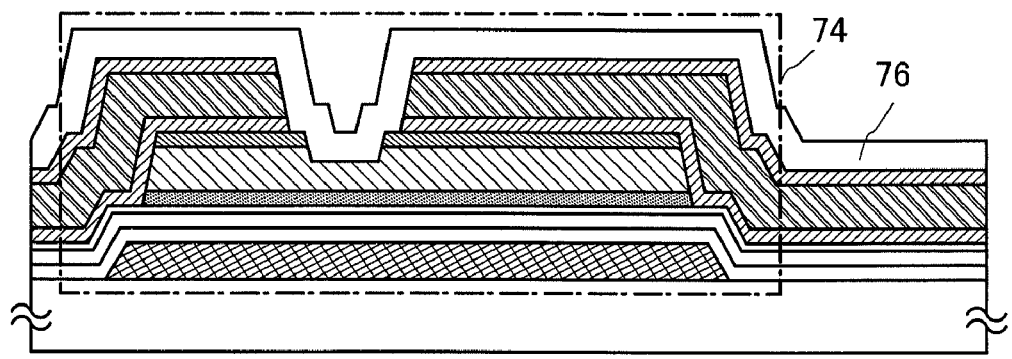
Figure 6C:
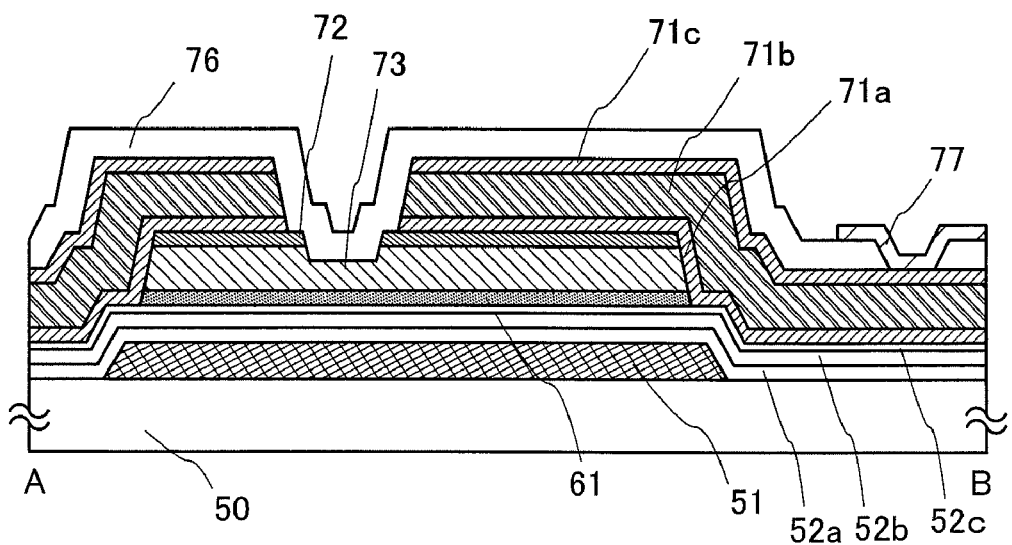

Next, as illustrated in FIG. 6B, an insulating film 76 is formed so as to cover the source and drain electrodes 71a to 71c, the source and drain regions 72, the buffer layer 73, the microcrystalline semiconductor film 61, and the gate insulating film 52c. The insulating film 76 can be formed in a similar manner to the gate insulating films 52a, 52b, and 52c. Note that the insulating film 76 is provided to prevent entry of a contaminant impurity such as an organic substance, a metal substance, or moisture floating in the air and is preferably a dense film. By use of a silicon nitride film as the insulating film 76, the oxygen concentration in the buffer layer 73 can be made to be $5 \times 10^{19}$ atoms/cm$^3$ or less, preferably, $1 \times 10^{19}$ atoms/cm$^3$ or less.

As illustrated in FIG. 6B, the end portions of the source and drain electrodes 71a to 71c are not aligned with those of the source and drain regions 72, and the end portions are apart from each other, whereby the distance between the end portions of the source and drain electrodes 71a to 71c can be increased; thus, leakage current or short circuit between the source and drain electrodes can be prevented. Furthermore, the end portions of the source and drain electrodes 71a to 71c are not aligned with those of the source and drain regions 72, and the end portions are apart from each other, whereby an electric field is not concentrated on the end portions of the source and drain electrodes 71a to 71c and the source and drain regions 72; thus, leakage current between the gate electrode 51 and the source and drain electrodes 71a to 71c can be prevented. Accordingly, a thin film transistor with high reliability and high withstand voltage can be manufactured.

By the above process, a thin film transistor 74 can be formed.

In the thin film transistor described in this embodiment mode, the gate insulating film, the microcrystalline semiconductor film, the buffer layer, the source and drain regions, and the source and drain electrodes are stacked over the gate electrode, and the buffer layer covers the surface of the microcrystalline semiconductor film which functions as a channel formation region. In addition, a depression (a groove) is formed in part of the buffer layer, and regions other than the depression are covered with the source and drain regions. That is, due to the depression formed in the buffer layer, the source and drain regions are apart from each other; thus, leakage current between the source and drain regions can be reduced. In addition, because the depression is formed by etching of part of the buffer layer, an etching residue which is generated in the formation step of the source and drain regions can be removed. Accordingly, leakage current (parasitic channel) can be prevented from being generated between the source and drain regions through the residue.

The buffer layer is formed between the microcrystalline semiconductor film which functions as a channel formation region and the source and drain regions. In addition, the buffer layer covers the surface of the microcrystalline semiconductor film. Because the buffer layer, which has high resistance, is also formed between the microcrystalline semiconductor film and the source and drain regions, occurrence of leakage current can be reduced in a thin film transistor, and deterioration due to application of high voltage can be suppressed. In addition, the buffer layer, the microcrystalline semiconductor film, and the source and drain regions are formed in regions that overlap with the gate electrode. Thus, the structure can be considered as a structure which is not adversely affected by the end form of the gate electrode. In the case where the gate electrode is formed with a stacked-layer structure, if aluminum is used for a lower layer thereof, aluminum may be exposed to the side face of the gate electrode, which may cause a hillock. However, by forming the source and drain regions so as not to overlap with the end portion of the gate electrode, short circuit in the region which overlaps with the side face of the gate electrode can be prevented. Moreover, because the amorphous semiconductor film, the surface of which is terminated with hydrogen, is formed as the buffer layer on the surface of the microcrystalline semiconductor film, the microcrystalline semiconductor film can be prevented from being oxidized, and an etching residue which is generated in the formation step of the source and drain regions can be prevented from being mixed into the microcrystalline semiconductor film. Thus, the thin film transistor can have excellent electric characteristics and excellent withstand voltage.

Further, a channel length of the thin film transistor can be shortened, and a planar area of the thin film transistor can be made smaller.

Next, a contact hole is formed in the insulating film 76 by partly etching the insulating film 76 using a resist mask formed using a fourth photomask. Then, a pixel electrode 77 that is in contact with the source and drain electrodes 71c in the contact hole is formed. Note that FIG. 6C corresponds to a cross-sectional view in FIG. 7 along a chain line A-B.

As illustrated in FIG. 7, the end portions of the source and drain regions 72 are located outside those of the source and drain electrodes 71c. Further, end portions of the buffer layer 73 are located outside those of the source and drain electrodes 71c and those of the source and drain regions 72. Furthermore, one of the source and drain electrodes surrounds the other of the source and drain electrodes (specifically, the former electrode is in a U-shape or a C-shape). Thus, an area in which carriers move can be increased, and thus the amount of current can be increased and an area for a thin film transistor can be reduced. Further, unevenness of the gate electrode has little influence on the films and layers thereover because the microcrystalline semiconductor film and the source and drain electrodes overlap with each other over the gate electrode, thereby curbing reduction in coverage and generation of leakage current. Note that one of the source and drain electrodes also functions as a source or drain wiring.

The pixel electrode 77 can be formed of a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added.

Alternatively, the pixel electrode 77 can be formed using a conductive composition containing a conductive macromolecule (also referred to as a conductive polymer). The pixel electrode formed of the conductive composition preferably has a sheet resistance which is 10000 Ω/square or less and a transmittance which is 70% or higher at a wavelength of 550 nm. The sheet resistance of the pixel electrode is preferably lower. Further, a resistivity of the conductive polymer included in the conductive composition is preferably 0.1 Ω·cm or less.

As the conductive polymer, a so-called π-electron conjugated conductive polymer can be used. As examples thereof, polyaniline or a derivative thereof, polypyrrole or a derivative thereof, polythiophene or a derivative thereof, a copolymer of more than two kinds of them, and the like can be given.

Here, as the pixel electrode 77, an indium tin oxide film is formed by a sputtering method, and then a resist is applied over the indium tin oxide film. Subsequently, the resist is exposed to light and developed using a fifth photomask, thereby forming a resist mask. Then, the pixel electrode 77 is formed by etching the indium tin oxide film using the resist mask.

In the above manner, an element substrate which can be used for a display device can be formed. Note that, in this embodiment mode, the example is described in which an element substrate used for an electro-optical apparatus typified by a liquid crystal display panel or a light emitting device; however, there is no particular limitation. A photoelectric conversion device typified by a solar cell or a sensor, in which a semiconductor film formed using a film deposition apparatus or a film deposition method of the present invention is used as at least one layer of photoelectric conversion layers, can also be used.

(Embodiment Mode 3)

Figure 9A:
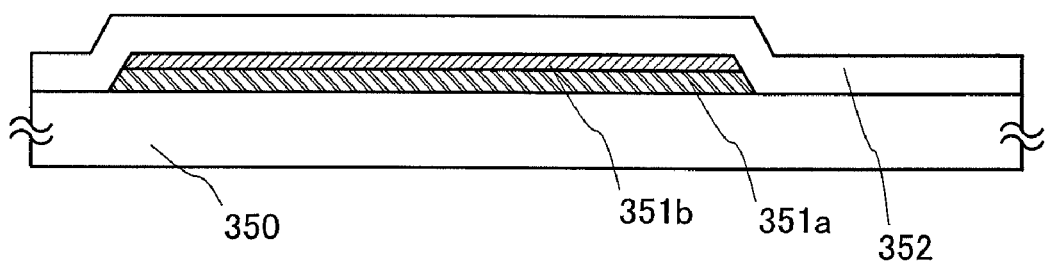
FIGS. 9A to 9C are cross-sectional views describing a manufacturing method of the present invention.
Figure 9B:
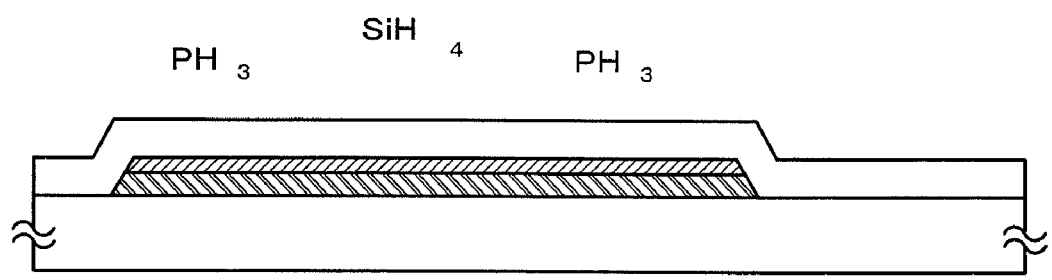
Figure 9C:
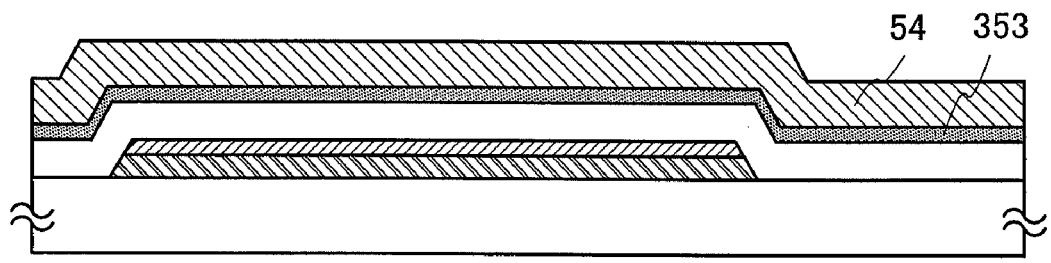

In this embodiment mode, an example is described in which before a substrate is transferred to a vacuum chamber, hydrogen or a noble gas is introduced to generate plasma so that a gas (an atmospheric component such as oxygen and nitrogen, or an etching gas used for cleaning the vacuum chamber) which is attached to the inner wall of the vacuum chamber is removed, and then hydrogen, a silane gas, and a small amount of phosphine ($PH_3$) gas are introduced. Since only part of a process is different from that of Embodiment Mode 2, a different process will be described in detail with reference to FIGS. 9A to 9C. In FIGS. 9A to 9C, the same numeral is used for the same portion as that in Embodiment Mode 2.

First, a gate electrode is formed over a substrate 350 in a similar manner to that in Embodiment Mode 2. Here, a non-alkaline glass substrate with a size of 600 mm×720 mm is used. Since an example where a display device with a large display screen is manufactured using a large substrate is described here, a gate electrode formed by stacking a first conductive layer 351a formed using aluminum, which has low electric resistance, and a second conductive layer 351b formed using molybdenum which has higher heat resistance properties than the first conductive layer 351a is used as the gate electrode.

Next, a gate insulating film 352 is formed over the second conductive layer 351b which is the upper layer of the gate electrode. A single layer of a silicon nitride film is preferably used as the gate insulating film 352 in the case where a thin film transistor is used for a switching element of a liquid crystal display device, in which AC driving is performed. Here, a single layer of a silicon nitride film (a dielectric constant of 7.0 and a thickness of 300 nm) is formed for the gate insulating film 352 by a plasma CVD method. A cross-sectional view up through this step is FIG. 9A.

Next, after forming the gate insulating film, the substrate is transferred without exposure to the air, and a microcrystalline semiconductor film is formed in a vacuum chamber that is different from a vacuum chamber for forming the gate insulating film. In this embodiment mode, the microcrystalline semiconductor film is formed using the film deposition apparatus illustrated in FIG. 2.

Before the substrate is transferred to a vacuum chamber of the film deposition apparatus illustrated in FIG. 2, hydrogen or a noble gas is introduced to generate plasma so that a gas (an atmospheric component such as oxygen and nitrogen, or an etching gas used for cleaning the vacuum chamber) which is attached to the inner wall of the vacuum chamber is removed. Then, hydrogen, a silane gas, and a small amount of phosphine ($PH_3$) gas are introduced. The silane gas can be reacted with oxygen, moisture, or the like in the vacuum chamber. The small amount of phosphine gas can make phosphorus be contained in a microcrystalline semiconductor film which is formed later.

Subsequently, the substrate is transferred to the vacuum chamber and is exposed to the silane gas and the small amount of a phosphine gas, as illustrated in FIG. 9B, and then a microcrystalline semiconductor film is formed. The microcrystalline semiconductor film can be typically formed by generating plasma by diluting silicon hydride such as $SiH_4$, $Si_2H_6$, or the like with hydrogen. A microcrystalline semiconductor film 353 including phosphorus and hydrogen can be formed using hydrogen with a flow rate of greater than 100 times and less than or equal to 2000 times as high as the flow rate of a silane gas. The substrate is exposed to the phosphine gas, whereby crystalline nucleus generation is promoted and the microcrystalline semiconductor film 353 is formed. The microcrystalline semiconductor film 353 illustrates a concentration profile in which phosphorus concentration decreases as a distance from the interface of the gate insulating film increases.

Next, a deposition condition is changed in the same chamber, and the buffer layer 54 formed of amorphous silicon including hydrogen is stacked using hydrogen with a flow rate of greater than or equal to 1 time and less than or equal to 10 times, preferably, greater than or equal to 1 time and less than or equal to 5 times as high as a flow rate of silicon hydride. A cross-sectional view up through this step is illustrated in FIG. 9C.

Next, after forming the buffer layer 54, the substrate is transferred without exposure to the air, and the semiconductor film 55 to which the impurity imparting one conductivity type is added is formed in a vacuum chamber that is different from the one for forming the microcrystalline silicon film 353 and the buffer layer 54. The subsequent steps after the formation of the semiconductor film 55 are the same as those in Embodiment Mode 2; thus, detailed description thereof is omitted here.

The film deposition apparatus illustrated in FIG. 2 can reduce an atmospheric component, such as oxygen concentration and nitrogen concentration of the inside of the chamber in the film deposition apparatus, as much as possible because the film deposition apparatus is separated from the air by the bubble cushioning material. Therefore, oxygen concentration and nitrogen concentration included in the microcrystalline semiconductor film 353 and the buffer layer 54 which are obtained can be reduced.

This embodiment mode can be freely combined with Embodiment Mode 1 or Embodiment Mode 2.

(Embodiment Mode 4)

Figure 10:
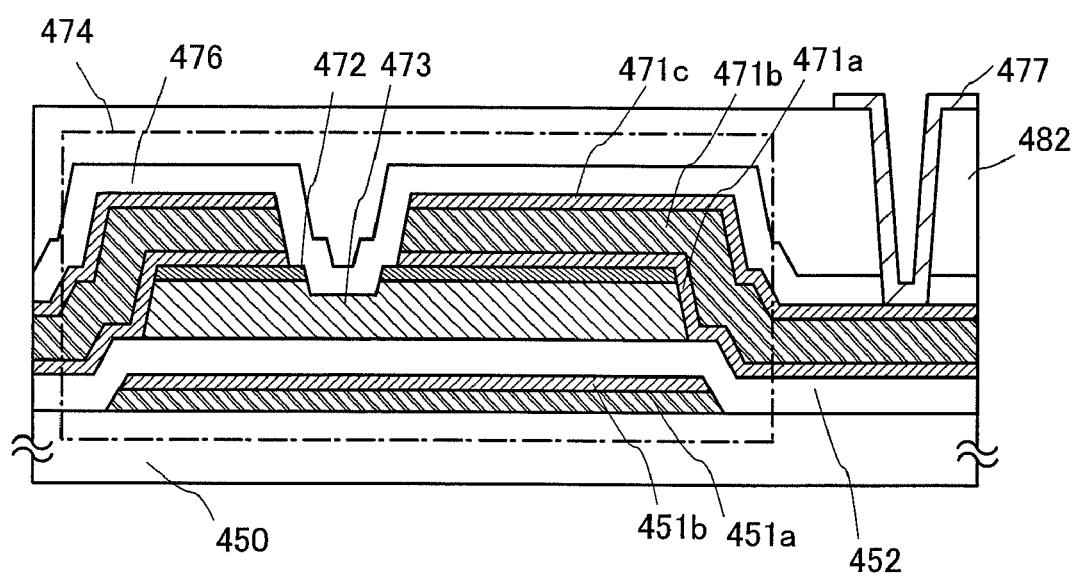
FIG. 10 is a cross-sectional view of a semiconductor device.

In Embodiment Mode 2 and Embodiment Mode 3, the example of a stack of the microcrystal semiconductor film and the buffer layer is described. In the film deposition apparatus illustrated in FIG. 1 and FIG. 2, not only a microcrystalline semiconductor film but also an amorphous semiconductor film can obtain excellent quality. In this embodiment mode, an example in which a single layer of an amorphous silicon film is used as an active layer is illustrated in FIG. 10.

A gate electrode is formed over a substrate 450 in the similar manner to Embodiment Mode 3. The gate electrode is formed of a stacked layer of a first conductive layer 451a formed of aluminum with low electric resistance and a second conductive layer 451b formed of molybdenum nitride which has higher heat resistance than the first conductive layer 451a.

Next, in a similar manner to that of Embodiment Mode 3, a gate insulating film 452 formed of a silicon nitride film is formed over the second conductive layer 451b which is the upper layer of the gate electrode.

Subsequently, after the gate insulating film is formed, the substrate is transferred without being exposed to the air, and an amorphous semiconductor film is formed in a vacuum chamber which is different from that for forming the gate insulating film. In this embodiment mode, the amorphous semiconductor film is formed using the film deposition apparatus illustrated in FIG. 2.

Here, cleaning is performed using $NF_3$, $SF_3$, or $ClF_3$ before film deposition, and a halogen such as chlorine or fluorine is intentionally included in the amorphous semiconductor film. For example, the amorphous silicon film can be formed typically by diluting silicon hydride such as $SiH_4$ or $Si_2H_6$ with hydrogen to generate plasma. An amorphous silicon film including a halogen and hydrogen can be formed using hydrogen with a flow rate of greater than or equal to 1 time and less than or equal to 10 times, preferably, greater than or equal to 1 time and less than or equal to 5 times as high as a flow rate of silicon hydride. The pressure in the vacuum chamber in film deposition is at least in the range of $2 \times 10^{-2}$ Torr (2.666 Pa) to 1 Torr (133.3 Pa). The film deposition apparatus illustrated in FIG. 2 can sufficiently reduce the concentration of an atmospheric component such as oxygen, nitrogen, or the like to be mixed into the amorphous silicon film. An amorphous silicon film 473 illustrates a concentration profile in which the halogen concentration decreases in accordance with the increase in distance from the interface with the gate insulating film. It is effective because a halogen is included in the interface with the gate insulating film of the amorphous silicon film, whereby a dangling bond in the amorphous silicon film can be terminated.

Subsequently, after the amorphous silicon film 473 is formed, the substrate is transferred without being exposed to the air, and a semiconductor film 472 to which an impurity imparting one conductivity type is added is formed in a vacuum chamber which is different from the vacuum chamber for forming the amorphous silicon film.

Next, a resist mask is formed over the semiconductor film to which the impurity imparting one conductivity type is added. The amorphous silicon film 473 and the semiconductor film 472 to which the impurity imparting one conductivity type is added are etched using the resist mask to be separated. Then, the resist mask is removed.

Next, a conductive film is formed so as to cover the semiconductor film 472 to which the impurity imparting one conductivity type is added and the gate insulating film 452. Here, as the conductive film, a conductive film of three stacked layers is formed of, specifically, molybdenum films used for a first conductive film and a third conductive film and an aluminum film used for a second conductive film. The film having three layers is formed by a sputtering method or a vacuum evaporation method.

Next, a resist mask is formed over the conductive film having three layers, and part of the conductive film having three layers is etched to form a pair of source and drain electrodes 471a to 471c. Next, the semiconductor film 472 to which the impurity imparting one conductivity type is added is etched using the resist mask to form a pair of source and drain regions. Further, in the etching step, the amorphous silicon film 473 is also partly etched by about 50 nm. The amorphous silicon film 473 which is partly etched and provided with a depression (a groove) is illustrated in FIG. 10.

Next, an insulating film 476 is formed to cover the source and drain electrodes 471a to 471c and the gate insulating film 452. The insulating film 476 can be formed by using the same method as the method of forming the gate insulating film 452. Note that the insulating film 476 is provided to prevent entry of a contaminant impurity such as an organic substance, a metal substance, or moisture floating in the air, so it is preferably a dense film. In addition, by using a silicon nitride film as the insulating film 476, the oxygen concentration in the amorphous silicon film 473 can be $5 \times 10^{19}$ atoms/cm$^3$ or less, preferably $1 \times 10^{19}$ atoms/cm$^3$ or less.

By the above process, a thin film transistor 474 can be formed as illustrated in FIG. 10.

As for the thin film transistor described in this embodiment mode, the gate insulating film, the amorphous silicon film, the source and drain regions, and the source and drain electrodes are stacked over the gate electrode. In addition, the depression (the groove) is formed in part of the amorphous silicon film, and regions other than the depression are covered with the source and drain regions. That is, due to the depression formed in the amorphous silicon film, a distance between the source and drain regions is long. Thus, leakage current between the source and drain regions can be reduced. Further, since the depression is formed by partly etching the amorphous silicon film, an etching residue which is generated in the formation step of the source and drain regions can be removed. Accordingly, generation of leakage current (parasitic channel) between the source and drain regions through the residue can be prevented.

Next, a planarization film 482 is formed over the insulating film 476. The planarization film 482 is formed using an organic resin film. Subsequently, a contact hole is formed by partly etching the insulating film 476 and the planarization film 482 by using a resist mask. Then, a pixel electrode 477 which is in contact with the one of the source and drain electrodes 471c in the contact hole is formed.

In the above manner, an element substrate which can be used for a display device can be formed. Note that, in this embodiment mode, the example in which the planarization film 482 is provided is described; however, there is no particular limitation, and the planarization film 482 is not necessarily provided.

This embodiment mode can be freely combined with any of Embodiment Modes 1 to 3.

(Embodiment Mode 5)

Another method of manufacturing a thin film transistor, which is different from that in Embodiment Mode 2, will be described with reference to FIGS. 11A to 11D, FIGS. 12A and 12B, FIGS. 13A to 13C, FIGS. 14A and 14B, and FIGS. 15A to 15C. Here, a process for manufacturing a thin film transistor, using a process capable of reducing the number of photomasks compared with Embodiment Mode 2 will be described.

In a similar manner to FIG. 4A described in Embodiment Mode 2, a conductive film is formed over the substrate 50, a resist is applied over the conductive film, and the conductive film is partly etched using a resist mask formed by a photolithography process using a first photomask, so that the gate electrode 51 is formed. Next, the gate insulating films 52a, 52b, and 52c are formed in this order over the gate electrode 51.

Next, in a similar manner to FIG. 4B described in Embodiment Mode 2, the microcrystalline semiconductor film 23 is formed under the first deposition condition by using the film deposition apparatus illustrated in FIG. 1. Then, in a similar manner to FIG. 4C described in Embodiment Mode 2, the microcrystalline semiconductor film 53 is formed in the same chamber under the second deposition condition. Next, in a similar manner to FIG. 4D described in Embodiment Mode 2, the buffer layer 54 and the semiconductor film 55 to which the impurity imparting one conductivity type is added are formed in this order over the microcrystalline semiconductor film 53.

Figure 12A:
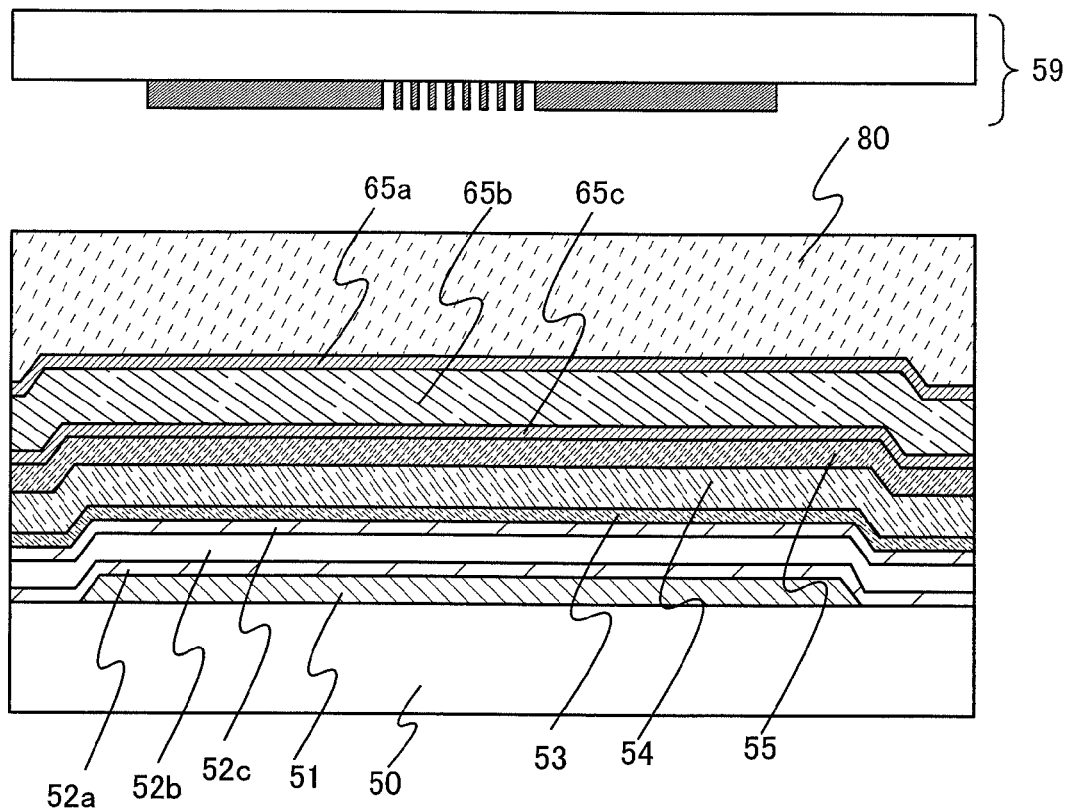
FIGS. 12A and 12B are cross-sectional views of a manufacturing process of the present invention.

Next, the conductive films 65a to 65c are formed over the semiconductor film 55 to which the impurity imparting one conductivity type is added. Next, as illustrated in FIG. 12A, a resist 80 is applied over the conductive film 65a.

The resist 80 can be a positive resist or a negative resist. Here, a positive resist is used.

Next, the resist 80 is irradiated with light using a multi-tone photomask 59 as a second photomask to expose the resist 80 to light.

Now, light exposure using the multi-tone photomask 59 is described with reference to FIGS. 11A to 11D.

A multi-tone photomask can achieve three levels of light exposure to obtain an exposed portion, a half-exposed portion, and an unexposed portion; one-time exposure and development process allows a resist mask with regions of plural thicknesses (typically, two kinds of thicknesses) to be formed. Accordingly, the use of a multi-tone photomask allows the number of photomasks to be reduced.

Figure 11A:
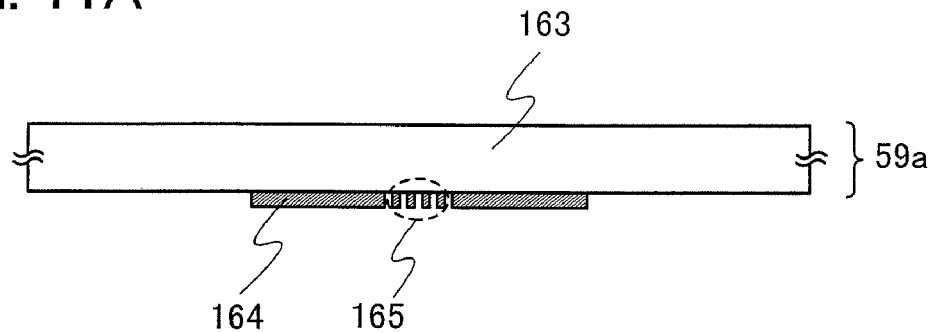
FIGS. 11A to 11D are views describing a multi-tone mask which can be applied to the present invention.
Figure 11B:
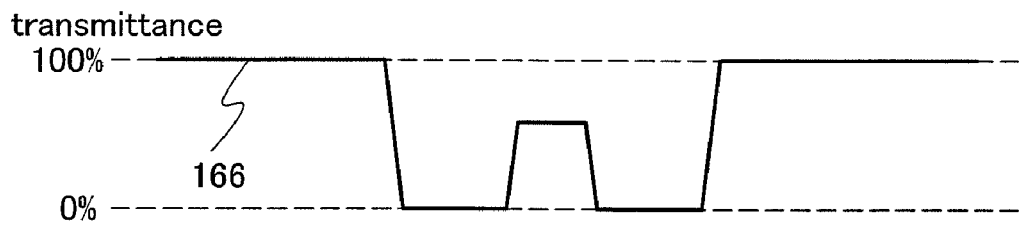
Figure 11C:
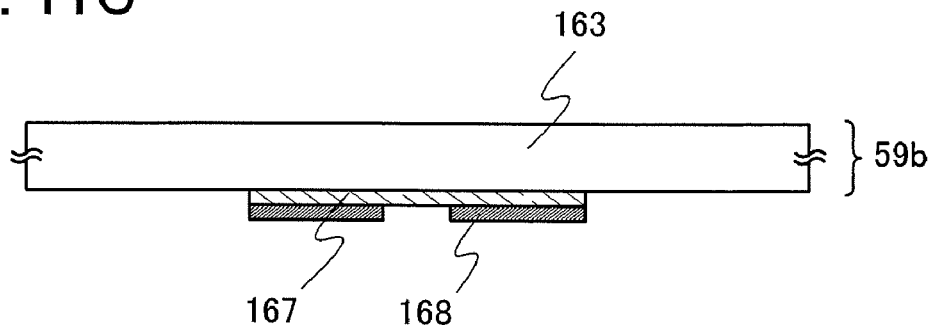

Typical examples of a multi-tone photomask include a gray-tone mask 59a as illustrated in FIG. 11A, and a half-tone mask 59b as illustrated in FIG. 11C.

As illustrated in FIG. 11A, the gray-tone mask 59a includes a light-transmitting substrate 163, and a light block portion 164 and a diffraction grating 165 that are formed thereon. The light transmittance of the light block portion 164 is 0%. On the other hand, the diffraction grating 165 has a light-transmitting portion in a slit form, a dot form, a mesh form, or the like with intervals which are less than or equal to the resolution limit for light used for the exposure; thus, the light transmittance can be controlled. Note that the diffraction grating 165 can be in a slit form, a dot form, or a mesh form with regular intervals; or in a slit form, a dot form, or a mesh form with irregular intervals.

For the light-transmitting substrate 163, a light-transmitting substrate, such as a quartz substrate or the like, can be used. The light block portion 164 and the diffraction grating 165 can be formed using a light block material such as chromium or chromium oxide, which absorbs light.

When the gray-tone mask 59a is irradiated with light for exposure, a light transmittance 166 of the light block portion 164 is 0% and that of a region where neither the light block portion 164 nor the diffraction grating 165 are provided is 100%, as illustrated in FIG. 11B. The light transmittance of the diffraction grating 165 can be controlled in a range of 10% to 70%. The light transmittance of the diffraction grating 165 can be controlled by adjusting the interval or pitch of slit forms, dot forms, or mesh forms of the diffraction grating.

As illustrated in FIG. 11C, the half-tone mask 59b includes the light-transmitting substrate 163, and a semi-transmissive portion 167 and a light block portion 168 that are formed thereon. The semi-transmissive portion 167 can be formed using MoSiN, MoSi, MoSiO, MoSiON, CrSi, or the like. The light block portion 168 can be formed using a light block material such as chromium or chromium oxide, which absorbs light.

Figure 11D:
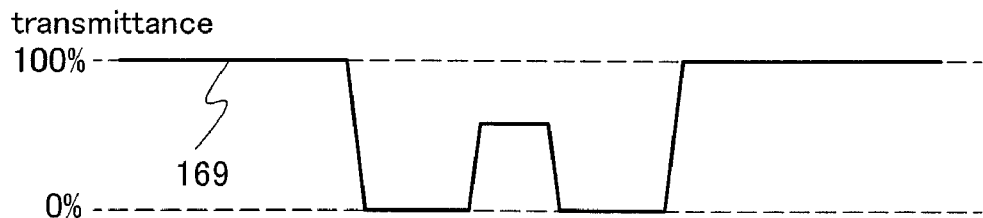

In the case where the half-tone mask 59b is irradiated with exposure light, as illustrated in FIG. 11D, light transmittance 169 in the light block portion 168 is 0% and the light transmittance 169 in a region where the light block portion 168 and the semi-transmissive portion 167 are not provided is 100%. The light transmittance of the semi-transmissive portion 167 can be controlled in a range of 10% to 70%. The light transmittance of the semi-transmissive portion 167 can be controlled with the material of the semi-transmissive portion 167.

Figure 12B:
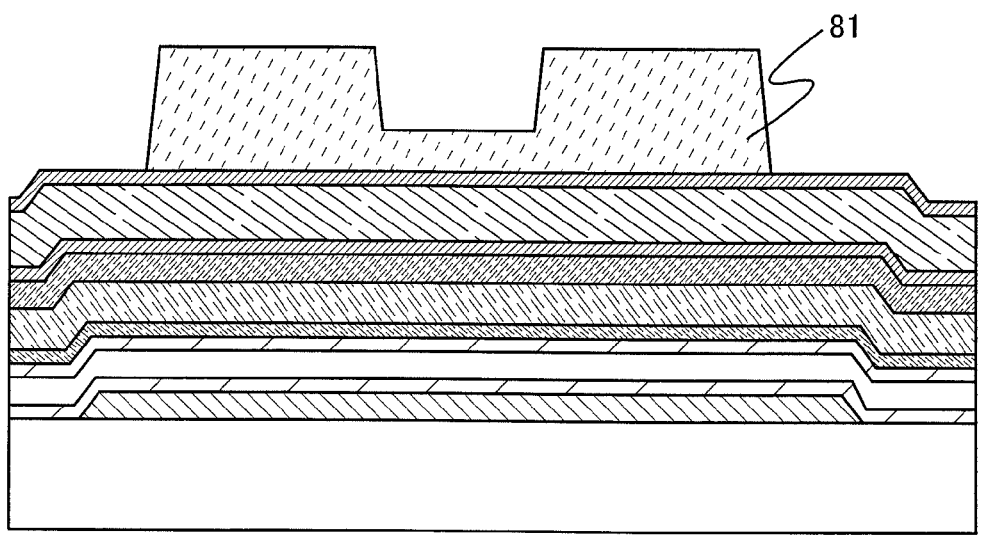

After the light exposure using the multi-tone photomask is done, development is carried out, whereby a resist mask 81 having regions with different thicknesses can be formed, as illustrated in FIG. 12B.

Figure 13A:
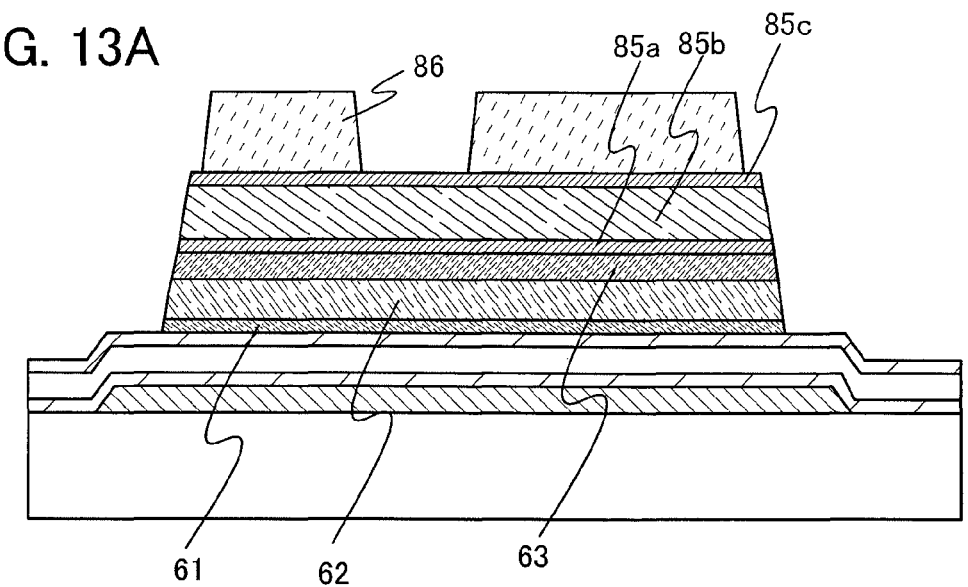
FIGS. 13A to 13C are cross-sectional views of a manufacturing process of the present invention.

Next, with the resist mask 81 used as a mask, the microcrystalline semiconductor film 53, the buffer layer 54, the semiconductor film 55 to which the impurity imparting one conductivity type is added, and the conductive films 65a to 65c are etched. As a result, the microcrystalline semiconductor film 61, the buffer layer 62, the semiconductor film 63 to which the impurity imparting one conductivity type is added, and conductive films 85a to 85c as illustrated in FIG. 13A can be formed. Note that FIG. 13A corresponds to a cross-sectional view taken along a line A-B in FIG. 15A (although a resist mask 86 is not illustrated in FIGS. 15A to 15C).

Next, ashing is performed on the resist mask 81. As a result, the area and the thickness of the resist mask are reduced. At this time, the resist in a region with a small thickness (a region overlapping with part of the gate electrode 51) is removed to form the separated resist mask 86, as illustrated in FIG. 13A.

Figure 13B:
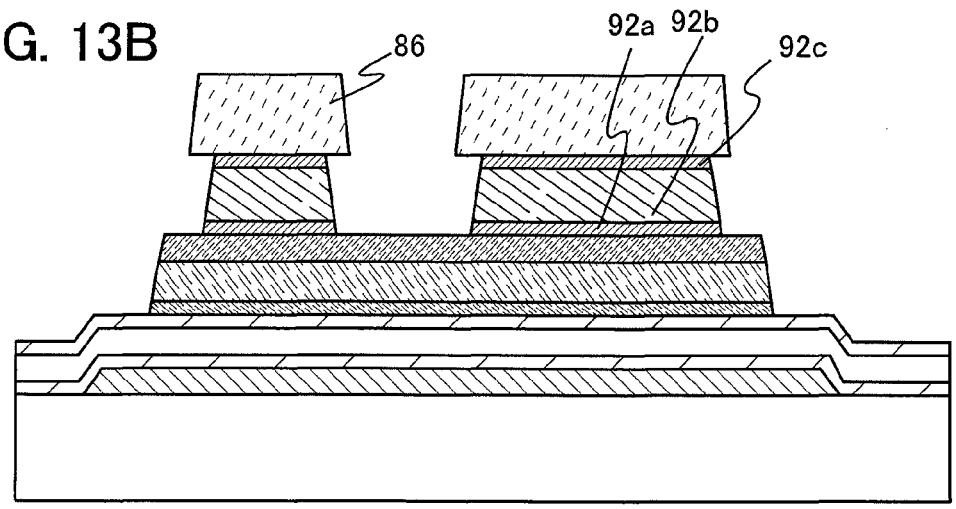

Next, the conductive films 85a to 85c are etched to be separated using the resist mask 86. As a result, a pair of source and drain electrodes 92a, a pair of source and drain electrodes 92b, and a pair of source and drain electrodes 92c can be formed, as illustrated in FIG. 13B. By wet etching of the conductive films 85a to 85c with use of the resist mask 86, the conductive films 85a to 85c are selectively etched. Accordingly, the conductive films are isotropically etched, and thus the source and drain electrodes 92a to 92c having smaller areas than the resist mask 86 can be formed.

Next, the semiconductor film 63 to which the impurity imparting one conductivity type is added is etched using the resist mask 86 to form a pair of source and drain regions 88. Note that in this etching process, part of the buffer layer 62 is also etched. The partly etched buffer layer is referred to as the buffer layer 87. Note that in the buffer layer 87, a depression is formed. The source and drain regions and the depression (the groove) of the buffer layer can be formed by the same step. Here, the buffer layer 87 is partly etched with use of the resist mask 86 having smaller areas than that of the resist mask 81, so that end portions of the buffer layer 87 are located outside those of the source and drain regions 88. After that, the resist mask 86 is removed. The end portions of the source and drain electrodes 92a to 92c are not aligned with the end portions of the source and drain regions 88, and the end portions of the source and drain regions 88 are formed outside the end portions of the source and drain electrodes 92a to 92c.

Figure 13C:
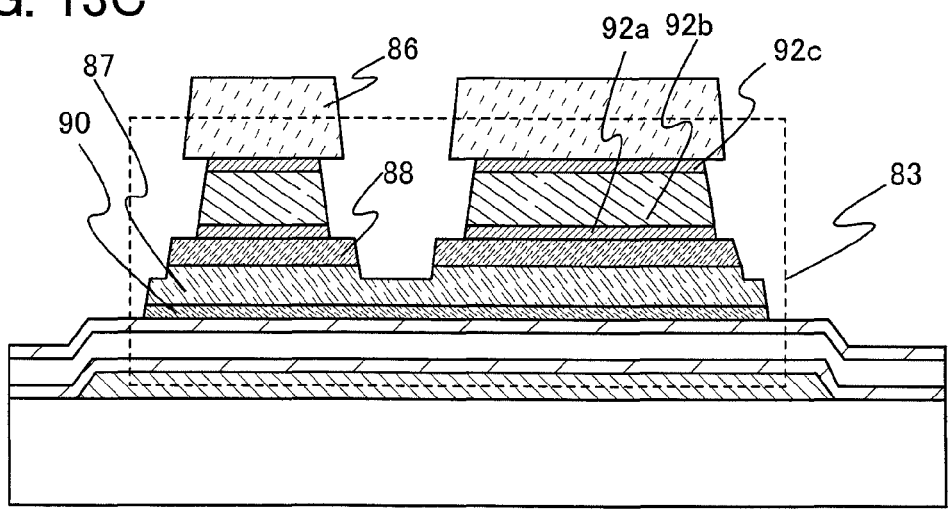
Figure 15A:
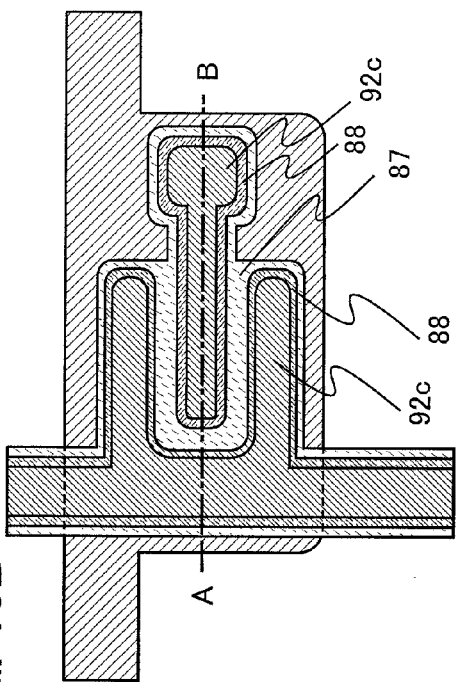
FIGS. 15A to 15C are top views of a manufacturing process of the present invention.
Figure 15B:
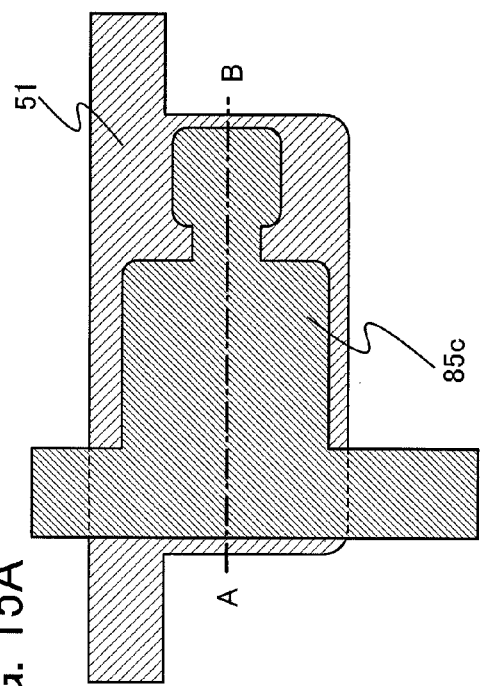
Figure 15C:
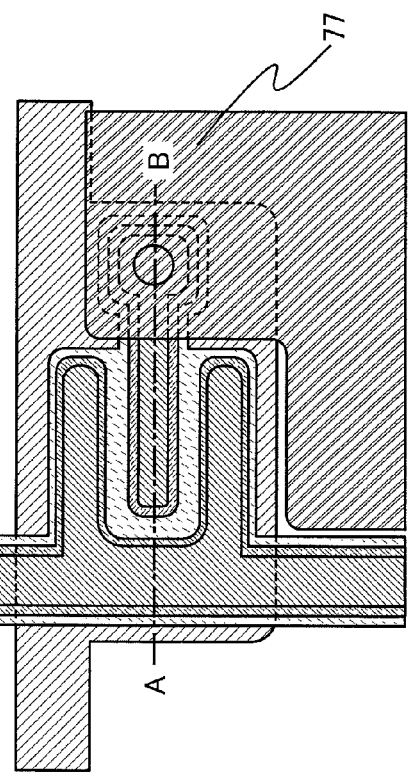

Note that FIG. 13C corresponds to a cross-sectional view taken along a line A-B in FIG. 15B. As illustrated in FIG. 15B, the end portions of the source and drain regions 88 are located outside those of the source and drain electrodes 92c. Further, end portions of the buffer layer 87 are located outside those of the source and drain electrodes 92c and those of the source and drain regions 88. Furthermore, one of the source and drain electrodes surrounds the other of the source and drain electrodes (specifically, the former electrode is in a U-shape or a C-shape). Thus, an area in which carriers can move can be increased, and thus the amount of current can be increased and an area for a thin film transistor can be reduced. Over the gate electrode, the microcrystalline semiconductor film and the source and drain electrodes are overlapped, and thus influence by unevenness of the gate electrode is small and poor coverage can be reduced and generation of leakage current can be suppressed. Note that one of the source and drain electrodes also functions as a source or drain wiring.

As illustrated in FIG. 13C, the end portions of the source and drain electrodes 92a to 92c are not aligned with those of the source and drain regions 88, and the end portions are apart from each other, whereby the distance between the end portions of the source and drain electrodes 92a to 92c can be increased; thus, leakage current or short circuit between the source and drain electrodes can be prevented. Further, since the end portions of the source and drain electrodes 92a to 92c and the end portions of the source and drain regions 88 are not aligned with each other, an electric field does not concentrate on the end portions of the source and drain electrodes 92a to 92c and the end portions of the source and drain regions 88, and generation of leakage current between the gate electrode 51 and the source and drain electrodes 92a to 92c can be prevented. Accordingly, a thin film transistor with high reliability and high withstand voltage can be manufactured.

Through the above process, a thin film transistor 83 can be formed. In addition, the thin film transistor can be formed using two photomasks.

Figure 14A:
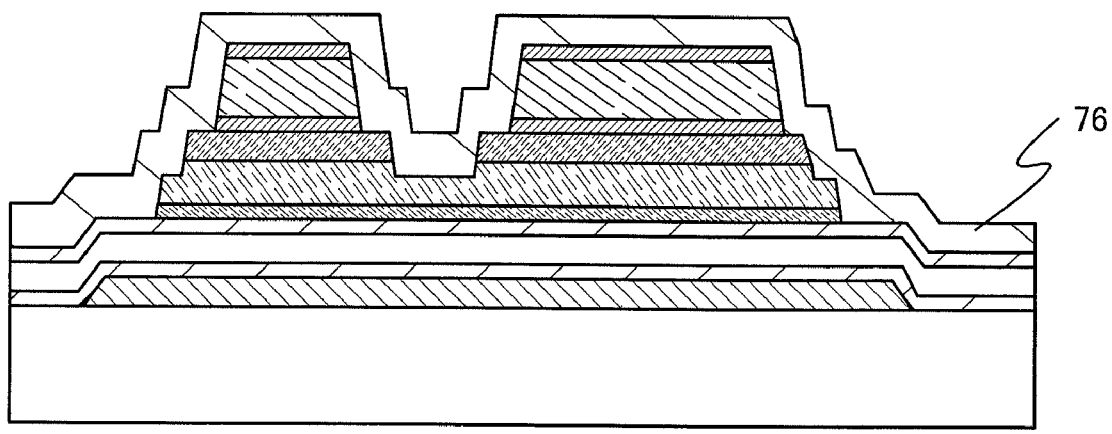
FIGS. 14A and 14B are cross-sectional views of a manufacturing process of the present invention.

Next, as illustrated in FIG. 14A, the insulating film 76 is formed over the source and drain electrodes 92a to 92c, the source and drain regions 88, the buffer layer 87, a microcrystalline semiconductor film 90, and the gate insulating film 52c.

Figure 14B:
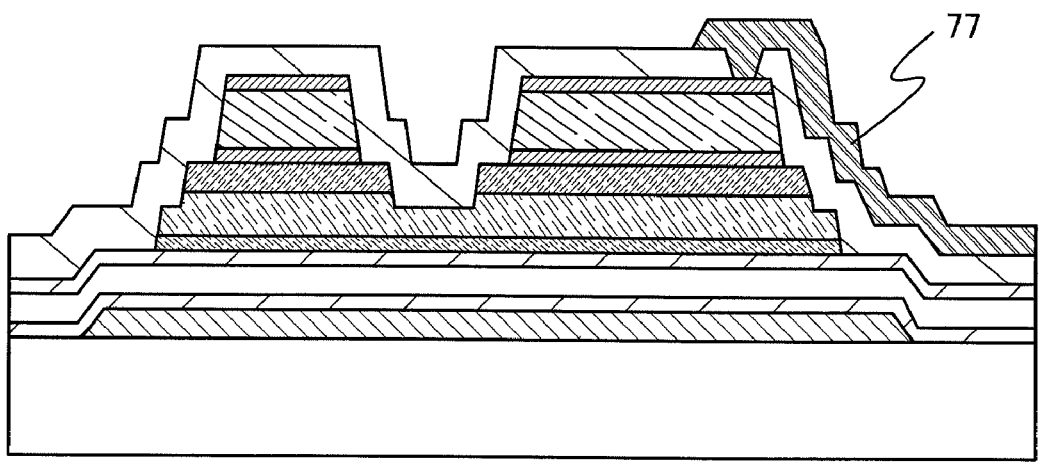

Next, a contact hole is formed in the insulating film 76 by partly etching the insulating film 76 using a resist mask formed using a third photomask. Subsequently, in the contact hole, the pixel electrode 77 is formed in contact with one of the source and drain electrodes 92c. Here, as the pixel electrode 77, an indium tin oxide film is formed by a sputtering method, and then a resist is applied over the indium tin oxide film. Subsequently, the resist is exposed to light and developed using a fourth photomask, thereby forming a resist mask. Then, the pixel electrode 77 is formed by etching the indium tin oxide film using the resist mask. FIG. 14B corresponds to a cross-sectional view taken along a line A-B in FIG. 15C.

In this manner, an element substrate which can be used for a display device can be formed in which a multi-tone mask is used to reduce the number of masks.

This embodiment mode can be freely combined with any of Embodiment Modes 1 to 4.

(Embodiment Mode 6)

In this embodiment mode, as one mode of a display device, a liquid crystal display device including the thin film transistor described in Embodiment Mode 2 will be described below.

First, a vertical alignment (VA) liquid crystal display device is described. The VA liquid crystal display device is a kind of form in which alignment of liquid crystal molecules of a liquid crystal panel is controlled. A VA mode is a mode in which liquid crystal molecules are aligned vertically to a panel surface when voltage is not applied. In this embodiment mode, it is devised to particularly separate pixels into some regions (sub-pixels) so that molecules are aligned in different directions in the respective regions. This is referred to as multi-domain or multi-domain design. In the following description, a liquid crystal display device with multi-domain design is described.

Figure 16:
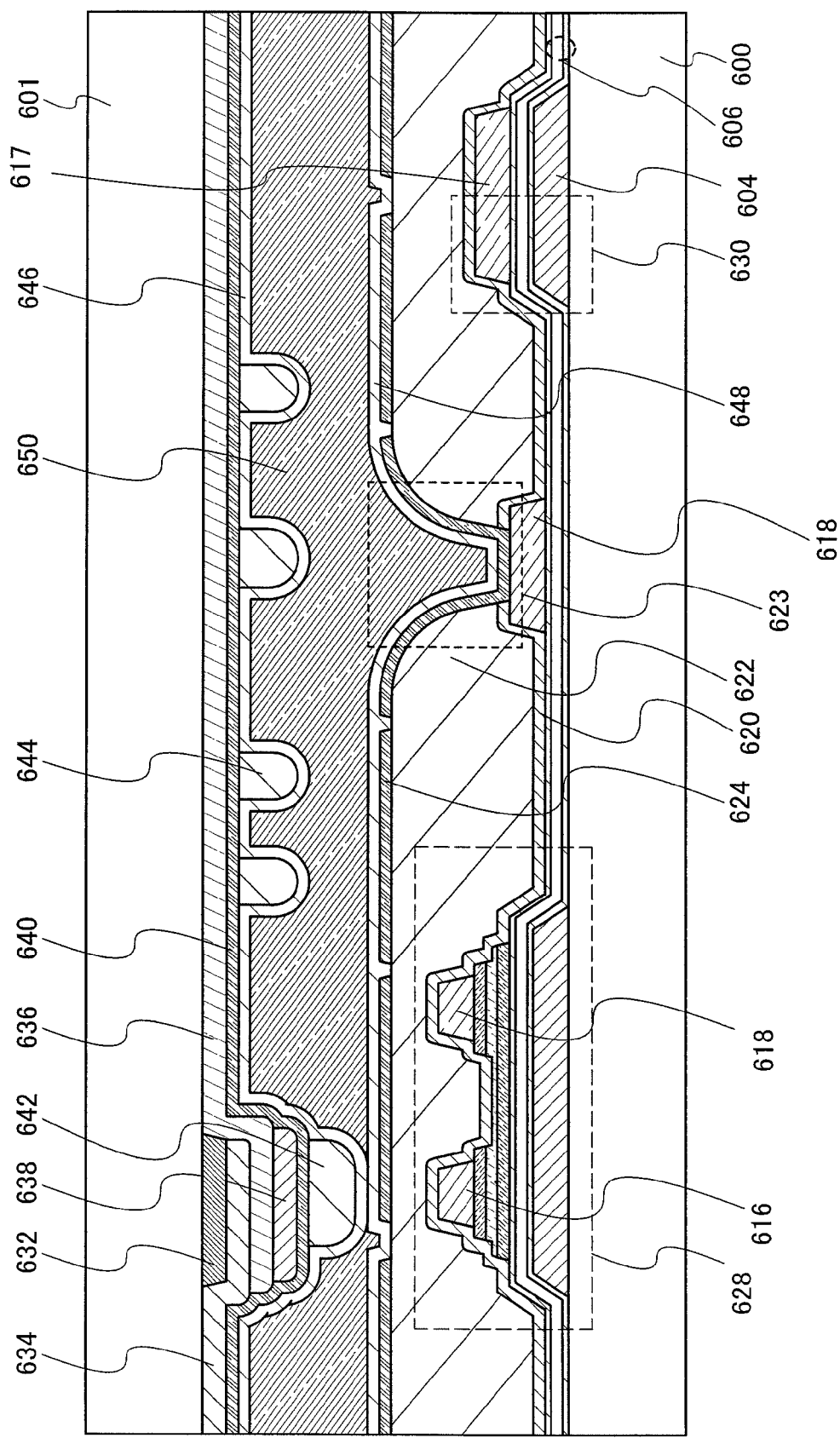
FIG. 16 is a diagram describing an example of a liquid crystal display device.
Figure 17:
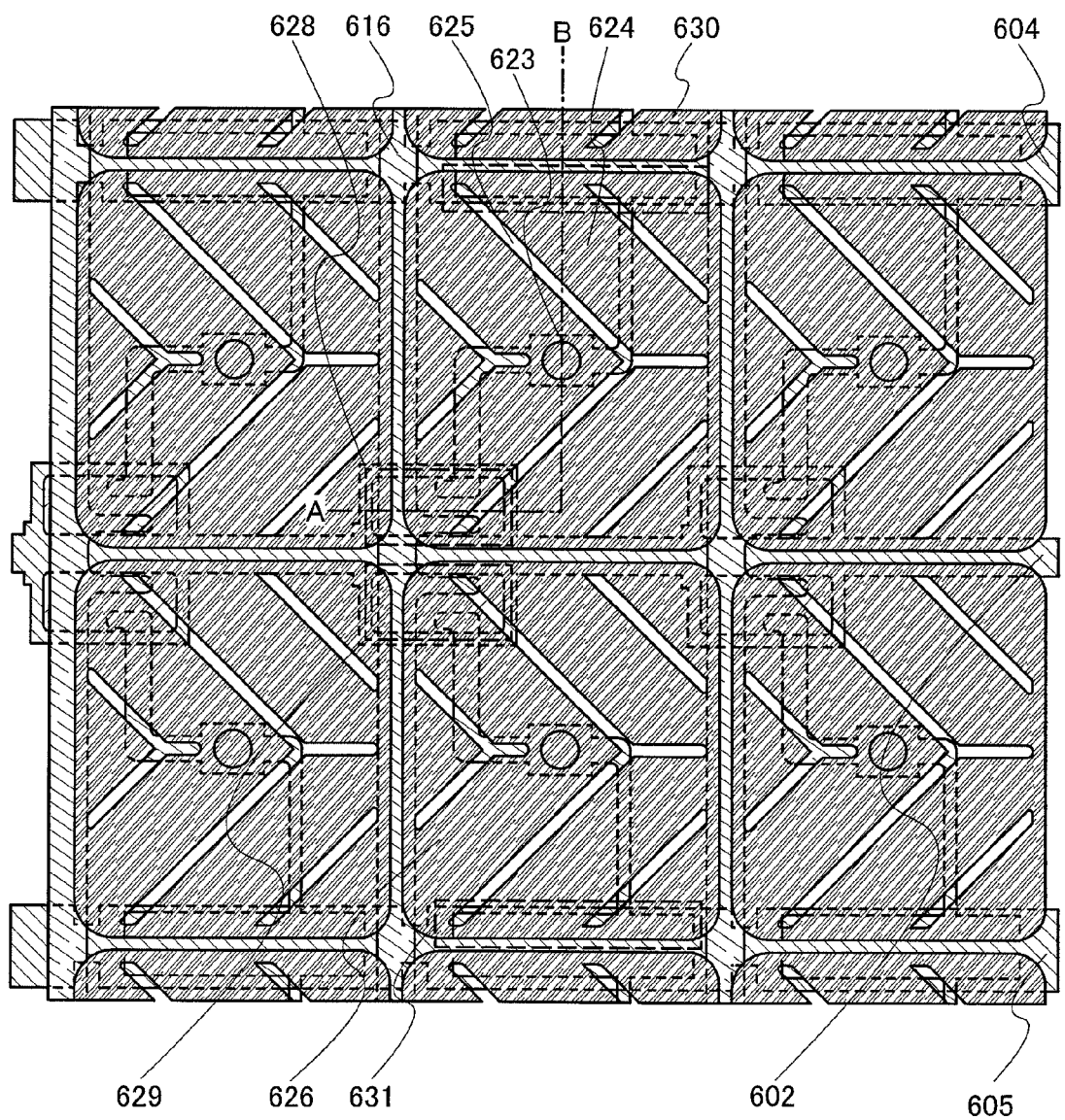
FIG. 17 is a diagram describing an example of a liquid crystal display device.
Figure 18:
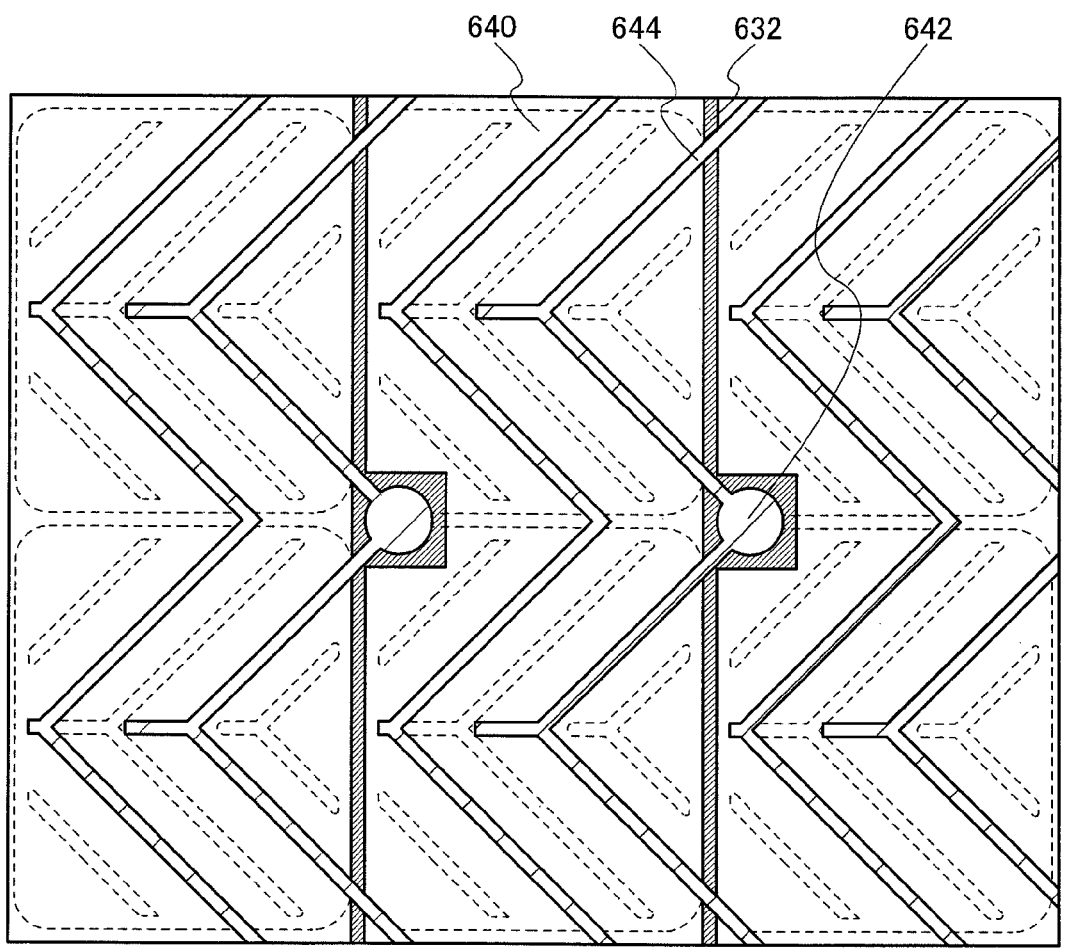
FIG. 18 is a diagram describing an example of a liquid crystal display device.

FIG. 17 and FIG. 18 illustrate a pixel electrode and a counter electrode, respectively. FIG. 17 is a plan view on a substrate side where the pixel electrode is formed. FIG. 16 is a cross-sectional structure along a line A-B in FIG. 17. FIG. 18 is a plan view on a substrate side where the counter electrode is formed. Hereinafter, description is made with reference to these drawings.

FIG. 16 illustrates a state in which a substrate 600 provided with a TFT 628, a pixel electrode 624 connected to the TFT 628, and a storage capacitor portion 630 overlaps with a counter substrate 601 provided with a counter electrode 640 and the like, and liquid crystal is injected therebetween.

At the position where the counter substrate 601 is provided with a spacer 642, a light shielding film 632, a first color film 634, a second color film 636, a third color film 638, and the counter electrode 640 are formed. With this structure, the height of a projection 644 for controlling orientation of liquid crystals is made different from that of the spacer 642. An orientation film 648 is formed over the pixel electrode 624, and the counter electrode 640 is similarly provided with an orientation film 646. A liquid crystal layer 650 is formed between the orientation films 648 and 646.

Although a columnar spacer is used for the spacer 642 here, a bead spacer may be dispersed. Further, the spacer 642 may be formed over the pixel electrode 624 provided over the substrate 600.

The TFT 628, the pixel electrode 624 connected to the TFT 628, and the storage capacitor portion 630 are formed over the substrate 600. The pixel electrode 624 is connected to a wiring 618 via a contact hole 623 which penetrates an insulating film 620 which covers the TFT 628, the wiring 618, and the storage capacitor portion 630 and also penetrates a third insulating film 622 which covers the insulating film 620. The thin film transistors described in Embodiment Mode 2 can be used as appropriate for the TFT 628. The storage capacitor portion 630 includes a first capacitor wiring 604 which is formed in a similar manner to a gate wiring 602 of the TFT 628, a gate insulating film 606, and a second capacitor wiring 617 which is formed in a similar manner to a wiring 616 and the wiring 618.

A liquid crystal element is formed by overlapping of the pixel electrode 624, the liquid crystal layer 650, and the counter electrode 640.

FIG. 17 illustrates a structure over the substrate 600. The pixel electrode 624 is formed using a material described in Embodiment Mode 2. The pixel electrode 624 is provided with a slit 625. The slit 625 is provided to control orientation of liquid crystals.

A TFT 629, a pixel electrode 626 connected to the TFT 629, and a storage capacitor portion 631 illustrated in FIG. 17 can be formed in a similar manner to the TFT 628, the pixel electrode 624, and the storage capacitor portion 630, respectively. Both the TFTs 628 and 629 are connected to the wiring 616. Each pixel of this liquid crystal panel includes the pixel electrodes 624 and 626. Each of the pixel electrodes 624 and 626 is a sub-pixel.

FIG. 18 illustrates a structure on the counter substrate side. The counter electrode 640 is formed over the light shielding film 632. The counter electrode 640 is preferably formed using a material similar to the pixel electrode 624. The projection 644 that controls orientation of liquid crystals is formed over the counter electrode 640. Moreover, the spacer 642 is formed corresponding to the position of the light shielding film 632.

Figure 19:
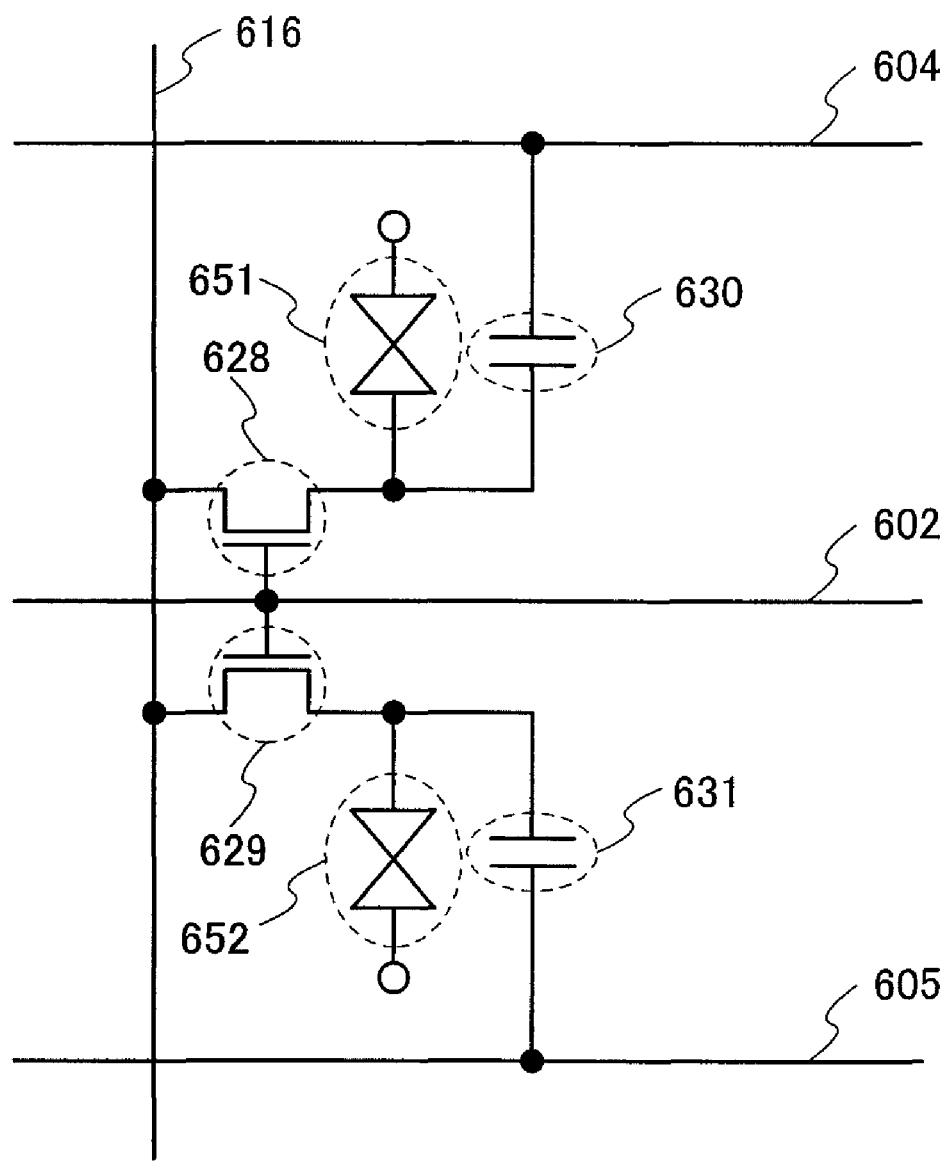
FIG. 19 is an equivalent circuit schematic of a pixel of a liquid crystal display device.

FIG. 19 illustrates an equivalent circuit of this pixel structure. Both the TFTs 628 and 629 are connected to the gate wiring 602 and the wiring 616. In this case, when potentials of the capacitor wiring 604 and a capacitor wiring 605 are different from each other, operations of liquid crystal elements 651 and 652 can vary. In other words, each potential of the capacitor wirings 604 and 605 is individually controlled, whereby orientation of liquid crystals is precisely controlled to expand a viewing angle.

When voltage is applied to the pixel electrode 624 provided with the slit 625, distortion of an electric field (an oblique electric field) is generated in the vicinity of the slit 625. This slit 625 is disposed so as to alternately mesh with the projection 644 on the side of the counter substrate 601 and an oblique electric field is effectively generated to control orientation of liquid crystals, whereby the direction in which liquid crystals are oriented is made different depending on a place. In other words, a viewing angle of liquid crystal panel is expanded by multi-domain.

The example of the VA liquid crystal display device is described above; however, there is no particular limitation on the pixel electrode structure illustrated in FIG. 17.

Next, a mode of a TN liquid crystal display device is described.

Figure 20:
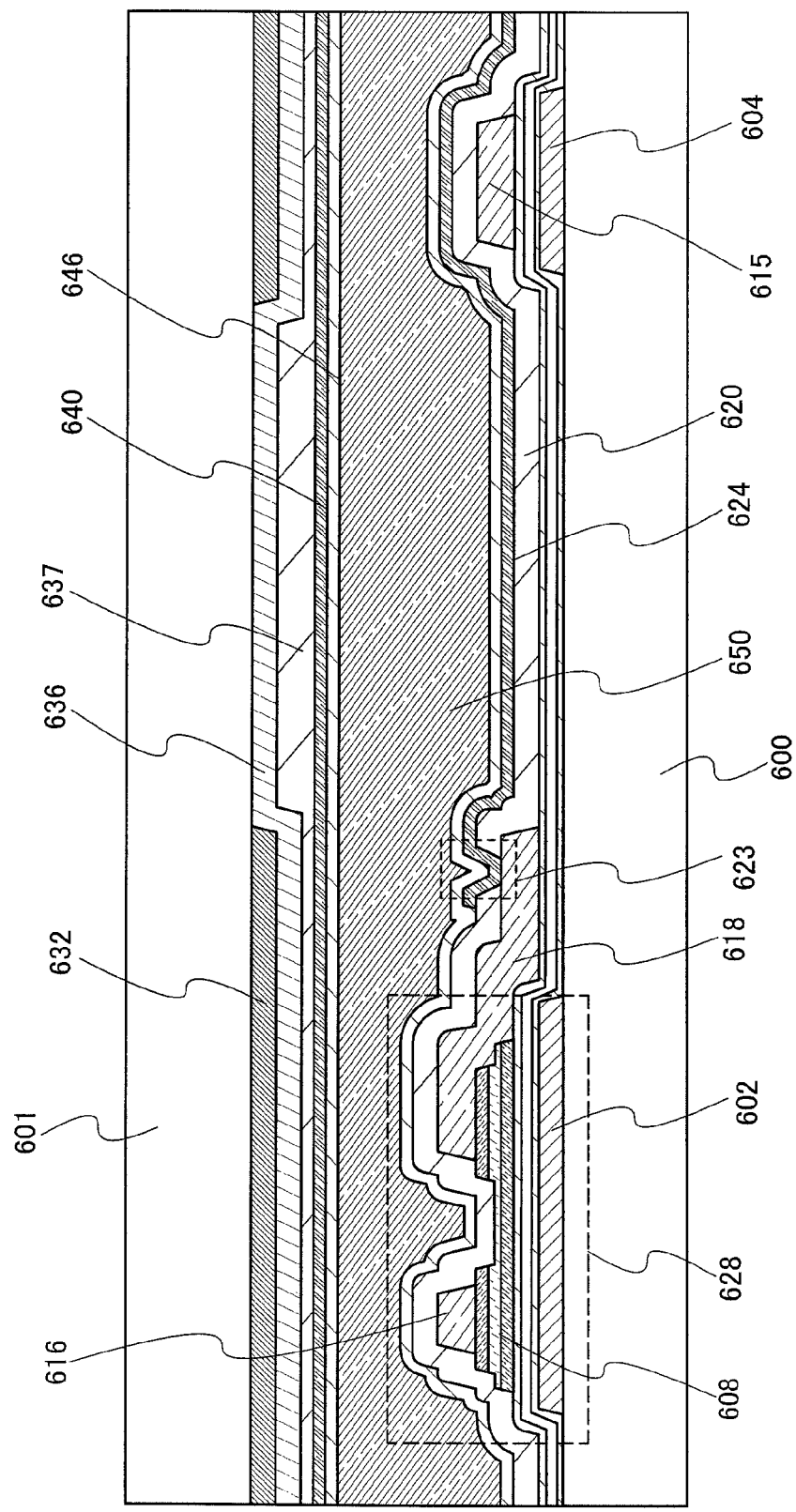
FIG. 20 is a diagram describing an example of a liquid crystal display device.
Figure 21:
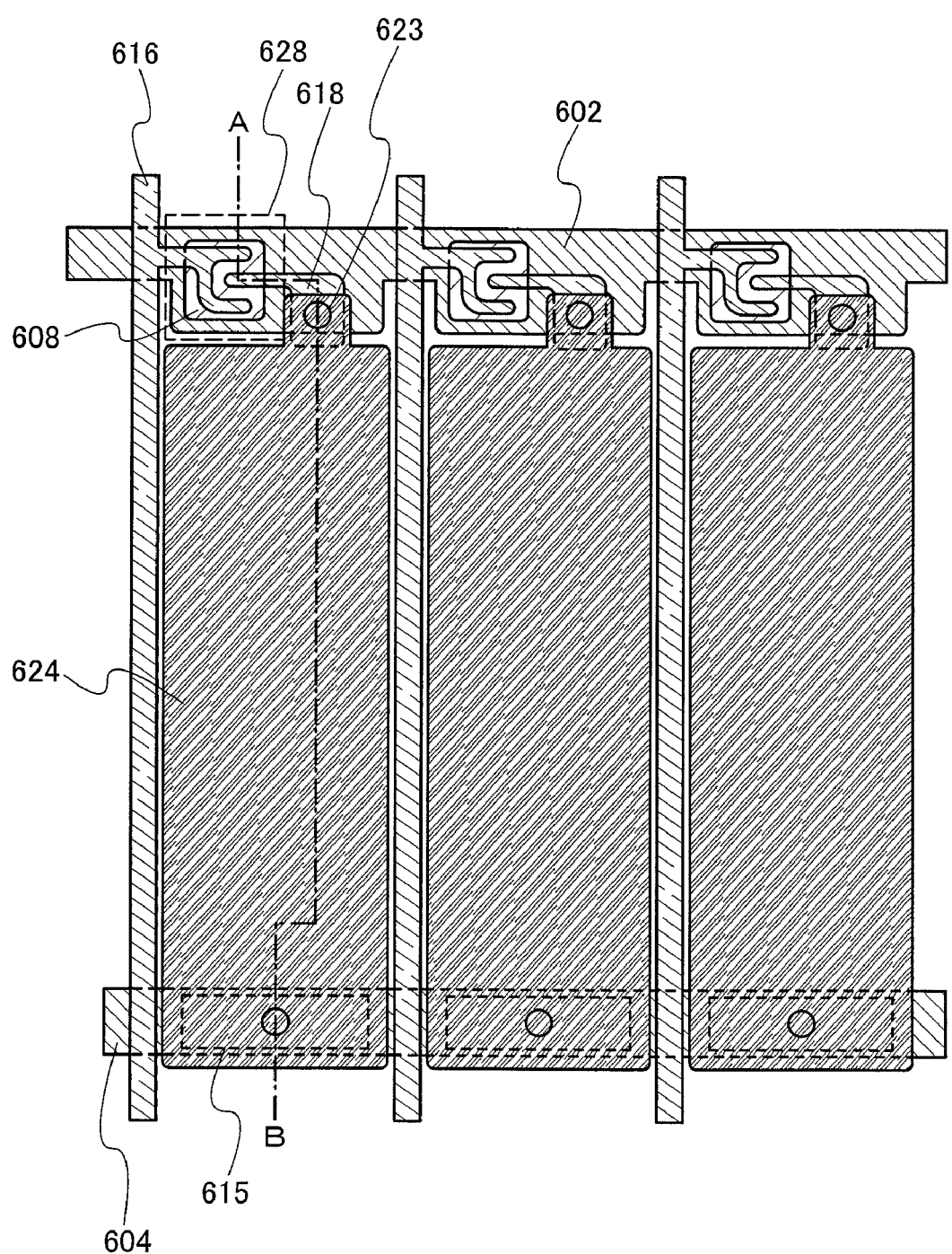
FIG. 21 is a diagram describing an example of a liquid crystal display device.

FIGS. 20 and 21 each illustrate a pixel structure of a TN liquid crystal display device. FIG. 21 is a plane view, and FIG. 20 illustrates a cross-sectional structure taken along a line A-B illustrated in FIG. 21. The following description will be made with reference to both the drawings.

The pixel electrode 624 is connected to the TFT 628 through the wiring 618 by the contact hole 623. The wiring 616 serving as a data line is connected to the TFT 628. As the TFT 628, any of the TFTs described in Embodiment Mode 2 can be used.

The pixel electrode 624 is formed using the pixel electrode 77 described in Embodiment Mode 2.

The counter substrate 601 is provided with the light shielding film 632, the second color film 636, and the counter electrode 640. Moreover, a planarization film 637 is formed between the second color film 636 and the counter electrode 640 to prevent alignment disorder of the liquid crystal. The liquid crystal layer 650 is formed between the pixel electrode 624 and the counter electrode 640.

A liquid crystal element is formed by overlapping of the pixel electrode 624, the liquid crystal layer 650, and the counter electrode 640.

The substrate 600 or the counter substrate 601 may be provided with a color filter, a light-blocking film (a black matrix) for preventing disclination, or the like. Further, a polarizing plate is attached to a surface of the substrate 600, which is opposite to a surface on which the thin film transistor is formed. Moreover, a polarizing plate is attached to a surface of the counter substrate 601, which is opposite to a surface on which the counter electrode 640 is formed.

Through the above steps, the liquid crystal display device can be manufactured. The liquid crystal display device in this embodiment mode has high contrast and high visibility because a thin film transistor with small off current, excellent electric characteristics, and high reliability is used in the liquid crystal display device.

The present invention can also be applied to a liquid crystal display device of a horizontal electric field mode. The horizontal electric field mode is a method in which an electric field is applied to liquid crystal molecules in a cell in a horizontal direction, whereby liquid crystals are driven to express gray scales. In accordance with this method, a viewing angle can be expanded up to approximately 180°.

(Embodiment Mode 7)

In this embodiment mode, a light-emitting device, which is one mode of a display device, is described with reference to FIGS. 12A and 12B, FIGS. 13A to 13C, FIGS. 14A and 14B, 22A and 22B, and FIGS. 23A to 23C. A light-emitting device, in which a light-emitting element utilizing electroluminescence is used, is described here. Light-emitting elements utilizing electroluminescence are classified according to whether a light emitting material is an organic compound or an inorganic compound. In general, the former is referred to as an organic EL element, the latter as an inorganic EL element.

In an organic EL element, by application of voltage to a light-emitting element, electrons and holes are separately injected from a pair of electrodes into a layer containing a light-emitting organic compound, and current flows. Then, the electrons and holes (i.e., carriers) are recombined, and thus the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion type inorganic EL element and a thin-film type inorganic EL element. The dispersion type inorganic EL element has a light-emitting layer in which particles of a light-emitting material are dispersed in a binder. The mechanism of light emission of the dispersion type inorganic EL element is donor acceptor recombination light emission, which utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element. In addition, description is made using the thin film transistor described in Embodiment Mode 2 as a thin film transistor which controls driving of a light-emitting element. In a light-emitting device in which the thin film transistor obtained according to Embodiment Mode 2 is used, variation in threshold voltage of the thin film transistor can be suppressed and reliability can be improved. In particular, the thin film transistor which is used in the light-emitting device is driven by direct current. Thus, the thin film transistor described in Embodiment Mode 2 having a gate insulating film with a three-layer structure in which a silicon nitride film is formed as a first layer, a silicon oxynitride film is formed as a second layer, and a silicon nitride film is formed as a third layer can suppress a drift of the threshold voltage mainly owing to the silicon oxynitride film in the second layer.

Figure 22A:
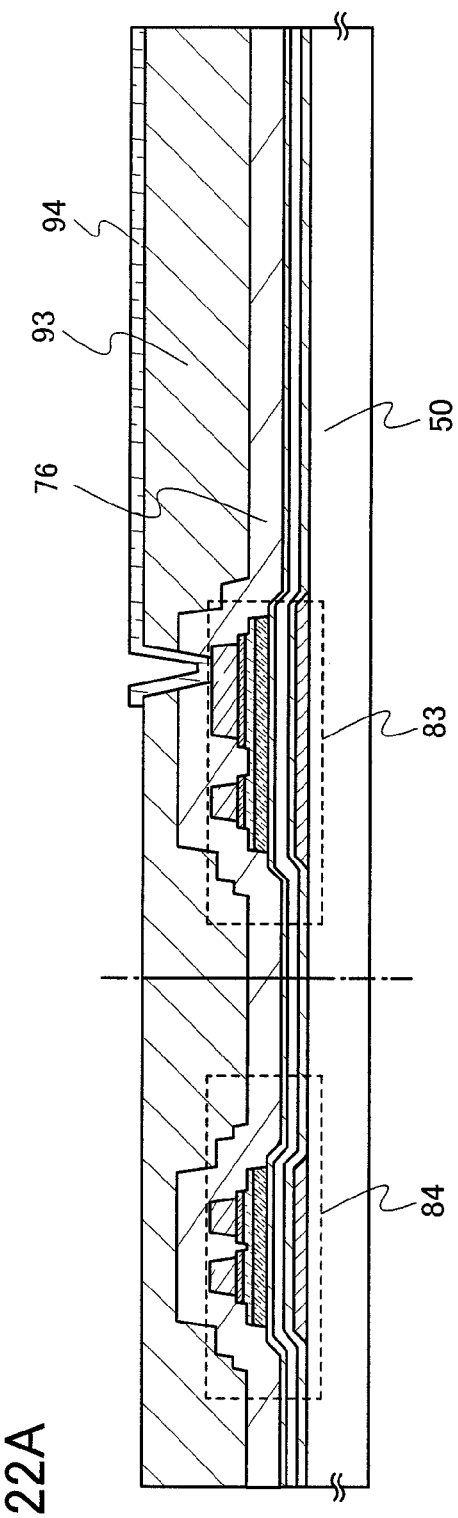
FIGS. 22A and 22B are cross-sectional views describing an example of a manufacturing method of a light-emitting device.
Figure 22B:
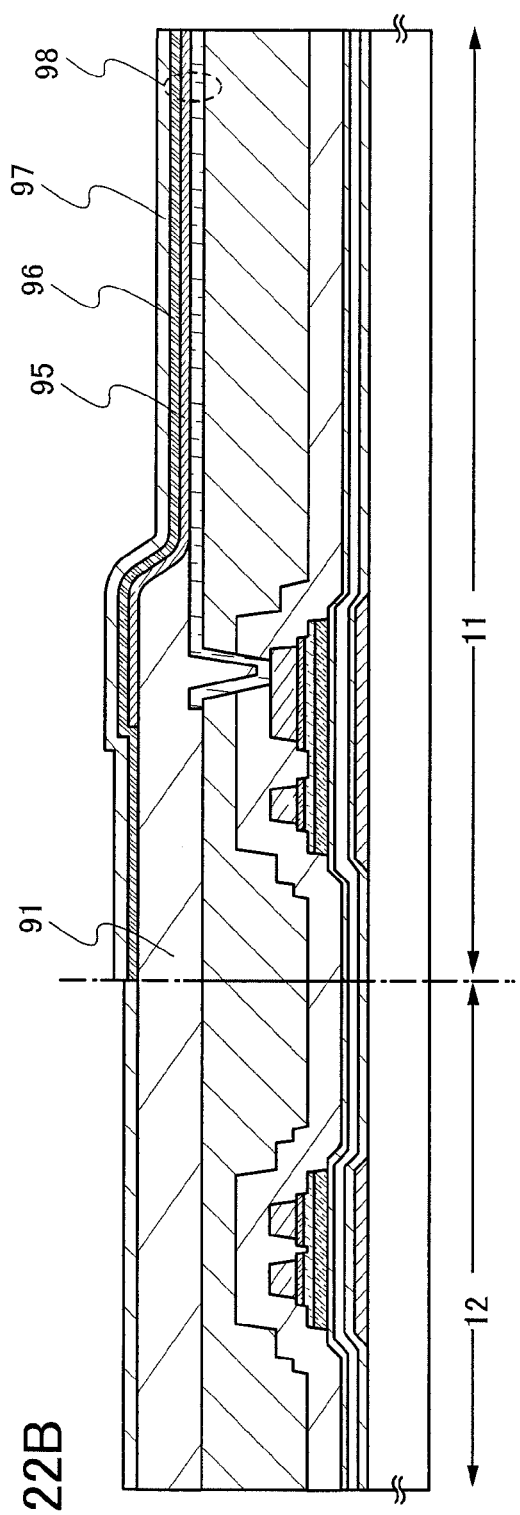

Through the process of FIGS. 12A and 12B, FIGS. 13A to 13C, and FIGS. 14A and 14B, as illustrated in FIGS. 22A and 22B, the thin film transistor 83 is formed over the substrate 50, and the insulating film 76 functioning as a protective film is formed over the thin film transistor 83. A thin film transistor 84 is formed for a driver circuit 12. The thin film transistor 84 can be formed in the same manufacturing process as the thin film transistor 83 in a pixel portion 11. Next, a planarization film 93 is formed over the insulating film 76, and a pixel electrode 94 connected to a source or drain electrode of the thin film transistor 83 is formed over the planarization film 93.

The planarization film 93 is preferably formed of an organic resin such as acrylic, polyimide, or polyamide; or siloxane.

In FIG. 22A, the thin film transistor in the pixel portion 11 is an n-channel transistor; thus, it is preferable that the pixel electrode 94 be a cathode. In contrast, when a p-channel thin film transistor is used, it is preferable that the pixel electrode 94 be an anode. Specifically, for the cathode, a known material with a low work function, such as calcium, aluminum, calcium fluoride, silver-magnesium alloy, or aluminum-lithium alloy can be used.

Next, as illustrated in FIG. 22B, a partition 91 is formed over the planarization film 93 and an end portion of the pixel electrode 94. The partition 91 has an opening, through which the pixel electrode 94 is exposed. The partition 91 is formed using an organic resin film, an inorganic insulating film, or organic polysiloxane. The partition 91 is formed of a photosensitive material, and the opening is formed over the pixel electrode so that a side wall of the opening forms an inclined surface with a continuous curvature, which is preferable.

Next, a light-emitting layer 95 is formed in contact with the pixel electrode 94 in the opening of the partition 91. The light-emitting layer 95 may be formed using either a single layer or a stacked layer of a plurality of layers.

Then, a common electrode 96 serving as an anode is formed to cover the light-emitting layer 95. The common electrode 96 can be formed of a light-transmitting conductive film using any of the light-transmitting conductive materials listed in Embodiment Mode 2 for the pixel electrode 77. As the common electrode 96, a titanium nitride film or a titanium film may be used in addition to the above-mentioned light-transmitting conductive films. In FIG. 22B, indium tin oxide is used for the common electrode 96. In the opening of the partition 91, a light-emitting element 98 is formed by overlapping of the pixel electrode 94, the light-emitting layer 95, and the common electrode 96. After that, it is preferable that a protective film 97 be formed over the common electrode 96 and the partition 91 so that oxygen, moisture, carbon dioxide, or the like does not enter the light-emitting element 98. As the protective film 97, a silicon nitride film, a silicon nitride oxide film, a DLC film, or the like can be formed.

Further, in a practical case, it is preferable that a display device completed to the state illustrated in FIG. 22B be packaged (sealed) with a protective film (such as a stacked film or an ultraviolet curable resin film) or a cover material with high air-tightness and little degasification so that the display device is not exposed to the outside air.

Next, a structure of a light-emitting element will be described with reference to FIGS. 23A to 23C. A cross-sectional structure of a pixel will be described by taking an n-channel driving TFT as an example.

To obtain light emission, at least one of the anode and the cathode of the light-emitting element may be transparent. A thin film transistor and a light-emitting element are formed over a substrate. There are light-emitting elements having a top emission structure in which light emission is extracted through the surface opposite to the substrate, having a bottom emission structure in which light emission is extracted through the surface on the substrate side, and having a dual emission structure in which light emission is extracted through the surface opposite to the substrate and the surface on the substrate side. The pixel structure of the present invention can be applied to a light-emitting element having any of these emission structures.

Figure 23A:
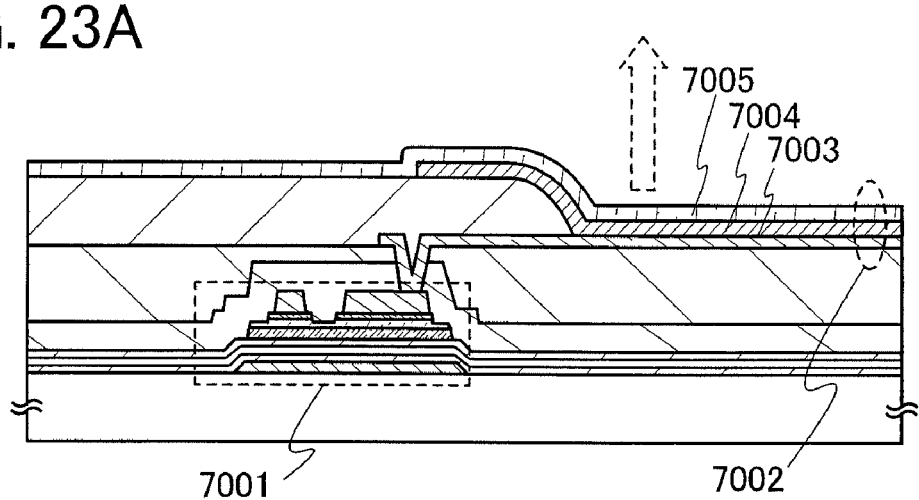
FIGS. 23A to 23C are cross-sectional views each describing a pixel applicable to a light-emitting device.

Description is made with reference to FIG. 23A of a light-emitting element with a top emission structure.

FIG. 23A is a cross-sectional view of a pixel in the case where a driving TFT 7001 is of n-type and light is emitted from a light-emitting element 7002 to an anode 7005 side. In FIG. 23A, a cathode 7003 of the light-emitting element 7002 and the driving TFT 7001 are electrically connected to each other. A light-emitting layer 7004 and the anode 7005 are stacked in this order over the cathode 7003. The cathode 7003 can be formed using any known conductive material as long as it has a low work function and reflects light. For example, calcium, aluminum, calcium fluoride, silver-magnesium alloy, or aluminum-lithium alloy is preferably used. The light-emitting layer 7004 may be formed using either a single layer or a stacked layer of a plurality of layers. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Note that it is not necessary to form all of these layers. The anode 7005 is formed of a light-transmitting conductive material; for example, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added may be used.

The light-emitting element 7002 corresponds to a region where the cathode 7003 and the anode 7005 sandwich the light-emitting layer 7004. In the pixel illustrated in FIG. 23A, light generated in the light-emitting element 7002 is emitted to pass through the anode 7005 as denoted by an outline arrow.

Next, a light-emitting element having a bottom emission structure is described with reference to FIG. 23B. FIG. 23B is a cross-sectional view of a pixel in the case where a driving TFT 7011 is of n-type, and light generated in a light-emitting element 7012 is emitted to pass through a cathode 7013. In FIG. 23B, the cathode 7013 of the light-emitting element 7012 is formed over a light-transmitting conductive material 7017 that is electrically connected to the driving TFT 7011, and a light-emitting layer 7014 and an anode 7015 are stacked in this order over the cathode 7013. Note that a light-blocking film for reflecting or blocking light may be formed so as to cover the anode 7015 when the anode 7015 has a light-transmitting property. As in FIG. 23A, the cathode 7013 can be formed using any known conductive material as long as it has a low work function. Note that the thickness of the cathode 7013 is set such that light is transmitted therethrough (preferably, about 5 nm to 30 nm). For example, Al having a thickness of 20 nm can be used as the cathode 7013. Similar to the case of FIG. 23A, the light-emitting layer 7014 may be formed using either a single layer or a stacked layer of a plurality of layers. Although the anode 7015 does not need to be able to transmit light, similar to FIG. 23A, it can be formed using a light-transmitting conductive material. As the light-blocking film, a metal or the like that reflects light can be used; however, it is not limited to a metal film. For example, a resin or the like to which black pigments are added can be used.

The light-emitting element 7012 corresponds to a region where the cathode 7013 and the anode 7015 sandwich the light-emitting layer 7014. In the pixel illustrated in FIG. 23B, light generated in the light-emitting element 7012 is emitted to pass through the cathode 7013 as shown by an outline arrow.

Then, a light-emitting element having the dual emission structure is described with reference to FIG. 23C. In FIG. 23C, a cathode 7023 of a light-emitting element 7022 is formed over a light-transmitting conductive material 7027 which is electrically connected to a driving TFT 7021, and a light-emitting layer 7024 and an anode 7025 are stacked in this order over the cathode 7023. As the cathode 7023, a known, conductive film can be used as long as it has a low work function as in the case of FIG. 23A. Note that the cathode 7023 is formed to have a thickness that can transmit light. For example, Al having a thickness of 20 nm can be used as the cathode 7023. Similar to FIG. 23A, the light-emitting layer 7024 may be formed using either a single layer or a stacked layer of a plurality of layers. The anode 7025 can be, as in FIG. 23A, formed of a light-transmitting conductive material.

The light-emitting element 7022 corresponds to a region where the cathode 7023, the light-emitting layer 7024, and the anode 7025 overlap with each other. In the pixel illustrated in FIG. 23C, light generated in the light-emitting element 7022 is emitted to pass through both the anode 7025 and the cathode 7023 as shown by outline arrows.

Note that, although an organic EL element is described here as a light-emitting element, an inorganic EL element can also be provided as a light-emitting element.

Note that, in this embodiment mode, the example is described in which a thin film transistor (a driving TFT) which controls the driving of a light-emitting element is electrically connected to the light-emitting element, but a structure may be employed in which a TFT for current control is connected between the driving TFT and the light-emitting element.

Figure 23B:
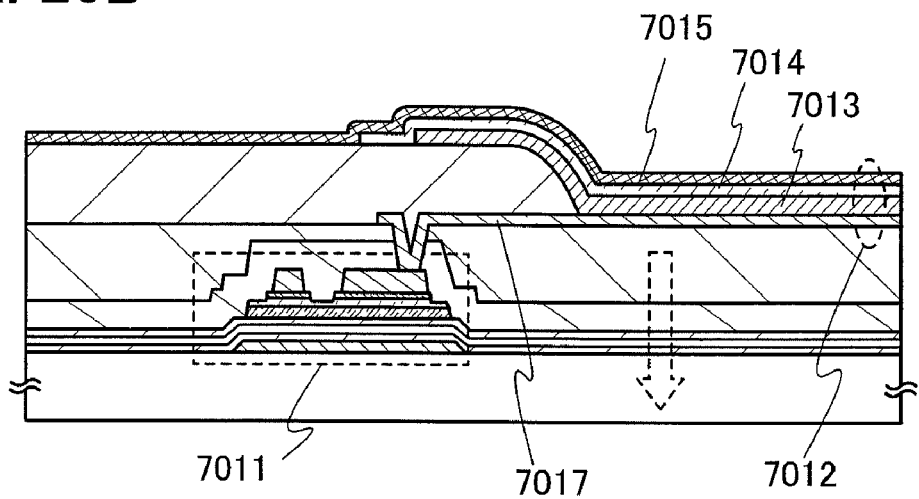
Figure 23C:
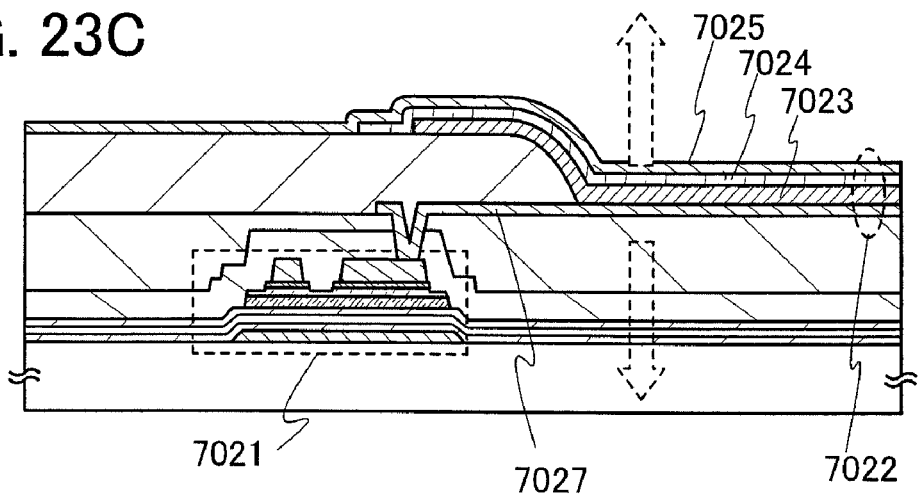

Note that the light-emitting device described in this embodiment mode is not limited to the structures illustrated in FIGS. 23A to 23C and can be modified in various ways based on the technical idea of the present invention.

Through the above-described process, a light-emitting device can be manufactured. The light-emitting device in this embodiment mode has high contrast and high visibility because a thin film transistor with small off current, excellent electric characteristics, and high reliability is used in the light-emitting device.

(Embodiment Mode 8)

A structure of a display panel, which is one mode of a display device of the present invention, will be described.

Figure 24A:
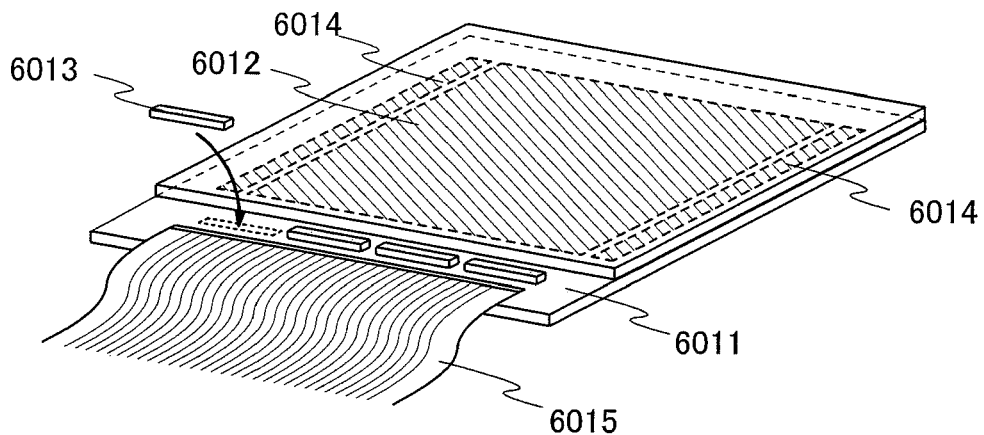
FIGS. 24A to 24C are perspective views each describing a display panel.

FIG. 24A illustrates a mode of a display panel in which a signal line driver circuit 6013 which is separately formed is connected to a pixel portion 6012 formed over a substrate 6011. The pixel portion 6012 and a scanning line driver circuit 6014 are each formed using a thin film transistor which uses a microcrystalline semiconductor film. By forming the signal line driver circuit with a transistor by which higher mobility can be obtained compared with the thin film transistor including the microcrystalline semiconductor film, operation of the signal line driver circuit, which demands a higher driving frequency than that of the scanning line driver circuit, can be stabilized. Note that the signal line driver circuit 6013 may be formed using a thin film transistor including a single crystal semiconductor, a transistor including a polycrystalline semiconductor, or a transistor including an SOI. The pixel portion 6012, the signal line driver circuit 6013, and the scanning line driver circuit 6014 are each supplied with potential of a power source, various signals, and the like via an FPC 6015.

Note that the signal driver circuit and the scanning line driver circuit may both be formed over the same substrate as that of the pixel portion.

Figure 24B:
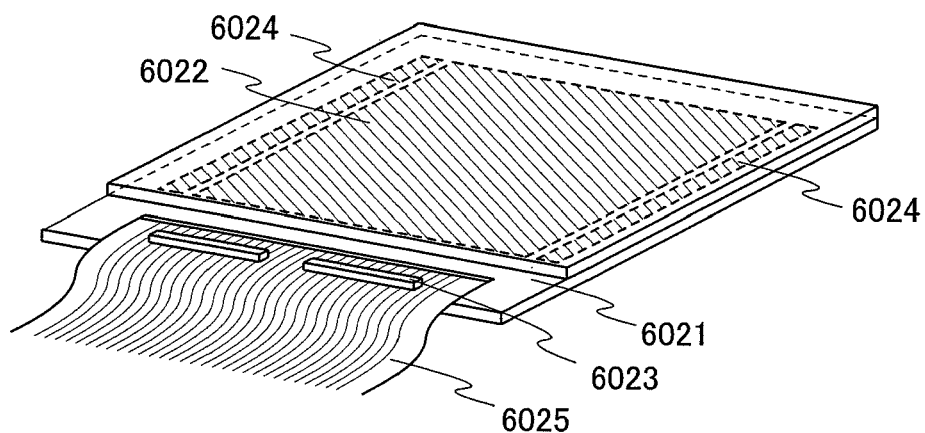

Also, when the driver circuit is separately formed, a substrate provided with the driver circuit is not always required to be attached to a substrate provided with the pixel portion, and may be attached to, for example, the FPC. FIG. 24B illustrates a mode of a liquid crystal display panel in which a signal line driver circuit 6023 is formed separately and is connected to a pixel portion 6022 and a scanning line driver circuit 6024 that are formed over a substrate 6021. The pixel portion 6022 and the scanning line driver circuit 6024 are each formed with a thin film transistor which uses a microcrystalline semiconductor film. The signal line driver circuit 6023 is connected to the pixel portion 6022 via an FPC 6025. The pixel portion 6022, the signal line driver circuit 6023, and the scanning line driver circuit 6024 are each supplied with potential of a power source, a variety of signals, and the like via the FPC 6025.

Figure 24C:
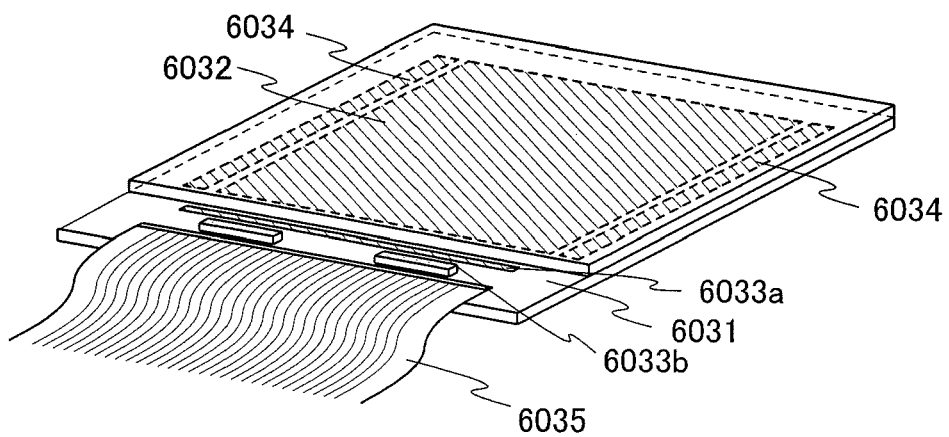

Also, part of the signal line driver circuit or part of the scanning line driver circuit may be formed over the same substrate as that of the pixel portion using the thin film transistor which uses a microcrystalline semiconductor film, and the rest may be formed separately and electrically connected to the pixel portion. FIG. 24C illustrates a mode of a liquid display device panel in which an analog switch 6033a included in a signal line driver circuit is formed over a substrate 6031, which is the same substrate as that of a pixel portion 6032 and a scanning line driver circuit 6034, and a shift register 6033b included in the signal line driver circuit is separately formed over a different substrate and attached to the substrate 6031. The pixel portion 6032 and the scanning line driver circuit 6034 are each formed using the thin film transistor which uses a microcrystalline semiconductor film. The shift register 6033b included in the signal line driver circuit is connected to the pixel portion 6032 via an FPC 6035. The pixel portion 6032, the signal line driver circuit, and the scanning line driver circuit 6034 are each supplied with potential of a power source, a variety of signals, and the like via the FPC 6035.

As illustrated in FIGS. 24A to 24C, in a liquid crystal display device of the present invention, all or part of the driver circuit can be formed over the same substrate as that of the pixel portion, using the thin film transistor in which the microcrystalline semiconductor film is used.

Note that there are no particular limitations on a connection method of a separately formed substrate, and a known method such as a COG method, a wire bonding method, or a TAB method can be used. Further, a connection position is not limited to the position illustrated in FIGS. 24A to 24C, as long as electrical connection is possible. Also, a controller, a CPU, a memory, or the like may be formed separately and connected.

Note that a signal line driver circuit used in the present invention is not limited to a mode including only a shift register and an analog switch. In addition to the shift register and the analog switch, another circuit such as a buffer, a level shifter, or a source follower may be included. Also, the shift register and the analog switch are not always required to be provided, and for example, a different circuit such as a decoder circuit by which selection of signal line is possible may be used instead of the shift register, and a latch or the like may be used instead of the analog switch.

(Embodiment Mode 9)

Figure 25A:
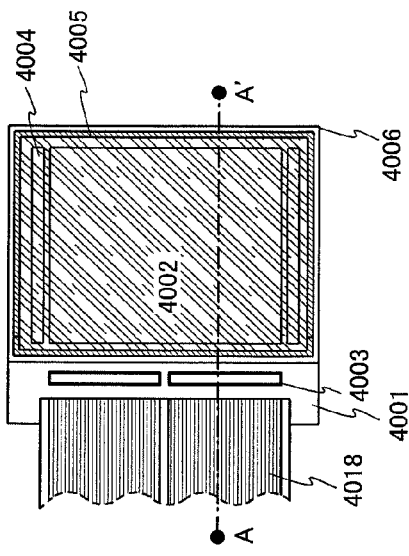
FIGS. 25A and 25B are a top view and a cross-sectional view, respectively, describing a display panel.
Figure 25B:
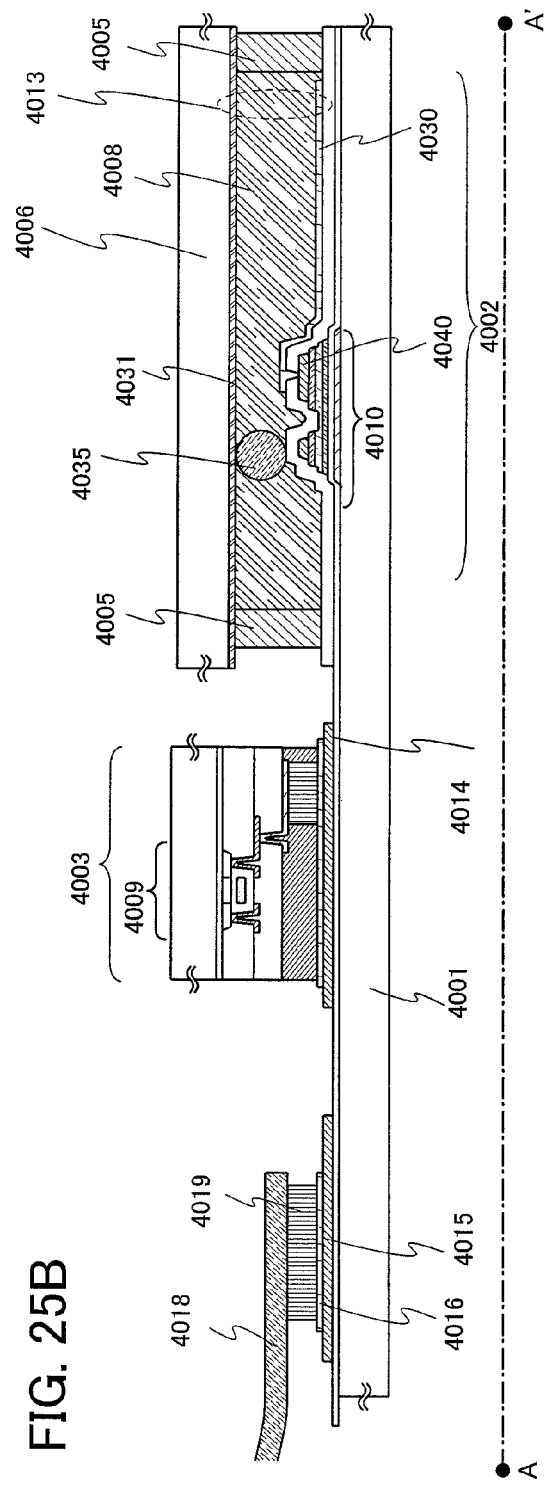

The appearance and a cross section of a liquid crystal display panel which is one mode of the display device of the present invention will be described with reference to FIGS. 25A and 25B. FIG. 25A is a top view of a panel. In the panel, a thin film transistor 4010 in which a microcrystalline semiconductor film is used and a liquid crystal element 4013 which are formed over a first substrate 4001 are sealed between the first substrate 4001 and a second substrate 4006 by a sealant 4005. FIG. 25B is a cross-sectional view along a line A-A' in FIG. 25A.

The sealant 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Therefore, the pixel portion 4002 and the scanning line driver circuit 4004 are sealed, together with liquid crystal 4008, between the first substrate 4001 and the second substrate 4006 with the sealant 4005. A signal line driver circuit 4003 formed over a substrate, which is prepared separately, using a polycrystalline semiconductor film is mounted at a region different from the region surrounded by the sealant 4005 over the first substrate 4001. Note that this embodiment mode will describe an example of attaching the signal line driver circuit 4003 including a thin film transistor formed using a polycrystalline semiconductor film to the first substrate 4001. Alternatively, a signal line driver circuit including a thin film transistor, which is formed using a single crystal semiconductor, may be attached to the first substrate 4001. FIG. 25B exemplifies a thin film transistor 4009 formed using a polycrystalline semiconductor film, which is included in the signal line driver circuit 4003.

The pixel portion 4002 and the scanning line driver circuit 4004 formed over the first substrate 4001 each include a plurality of thin film transistors, and the thin film transistor 4010 included in the pixel portion 4002 is illustrated as an example in FIG. 25B. The thin film transistor 4010 corresponds to a thin film transistor which uses a microcrystalline semiconductor film.

A pixel electrode 4030 included in the liquid crystal element 4013 is electrically connected to the thin film transistor 4010 through a wiring 4040. A counter electrode 4031 of the liquid crystal element 4013 is formed on the second substrate 4006. The liquid crystal element 4013 corresponds to a region where the pixel electrode 4030, the counter electrode 4031, and the liquid crystal 4008 overlap with each other.

Note that the first substrate 4001 and the second substrate 4006 can be formed by using glass, metal (typically, stainless steel), ceramic, or plastic. As for plastic, an FRP (fiberglass-reinforced plastics) plate, a polyvinyl fluoride (PVF) film, a polyester film, or an acrylic resin film can be used. In addition, a sheet with a structure in which an aluminum foil is sandwiched between PVF films or polyester films can be used.

A spherical spacer 4035 is provided to control a distance (a cell gap) between the pixel electrode 4030 and the counter electrode 4031. Note that a spacer obtained by selective etching of an insulating film may be used.

A variety of signals and potential are supplied to the signal line driver circuit 4003 which is formed separately, the scanning line driver circuit 4004, or the pixel portion 4002 via leading wirings 4014 and 4015 from an FPC 4018.

In this embodiment mode, a connecting terminal 4016 is formed of the same conductive film as that of the pixel electrode 4030 included in the liquid crystal element 4013. In addition, the leading wirings 4014 and 4015 are formed of the same conductive film as that of the wiring 4040.

The connecting terminal 4016 is electrically connected to a terminal of the FPC 4018 through an anisotropic conductive film 4019.

Although not illustrated, the liquid crystal display device described in this embodiment mode includes an alignment film, a polarizing plate, and further, may include a color filter and a light-blocking film.

FIGS. 25A and 25B illustrate an example in which the signal line driver circuit 4003 is formed separately and mounted on the first substrate 4001, but this embodiment mode is not limited to this structure. The scanning line driver circuit may be separately formed and then mounted, or only part of the signal line driver circuit or part of the scanning line driver circuit may be separately formed and then mounted.

This embodiment mode can be implemented in combination with the structures of other embodiment modes.

(Embodiment Mode 10)

Figure 26A:
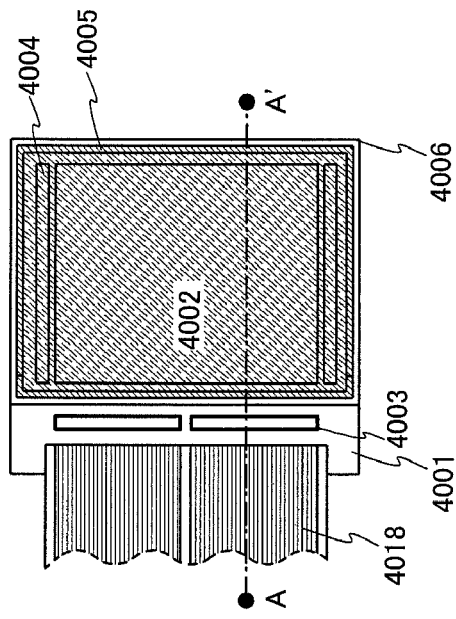
FIGS. 26A and 26B are a top view and a cross-sectional view, respectively, describing a display panel of the present invention.
Figure 26B:
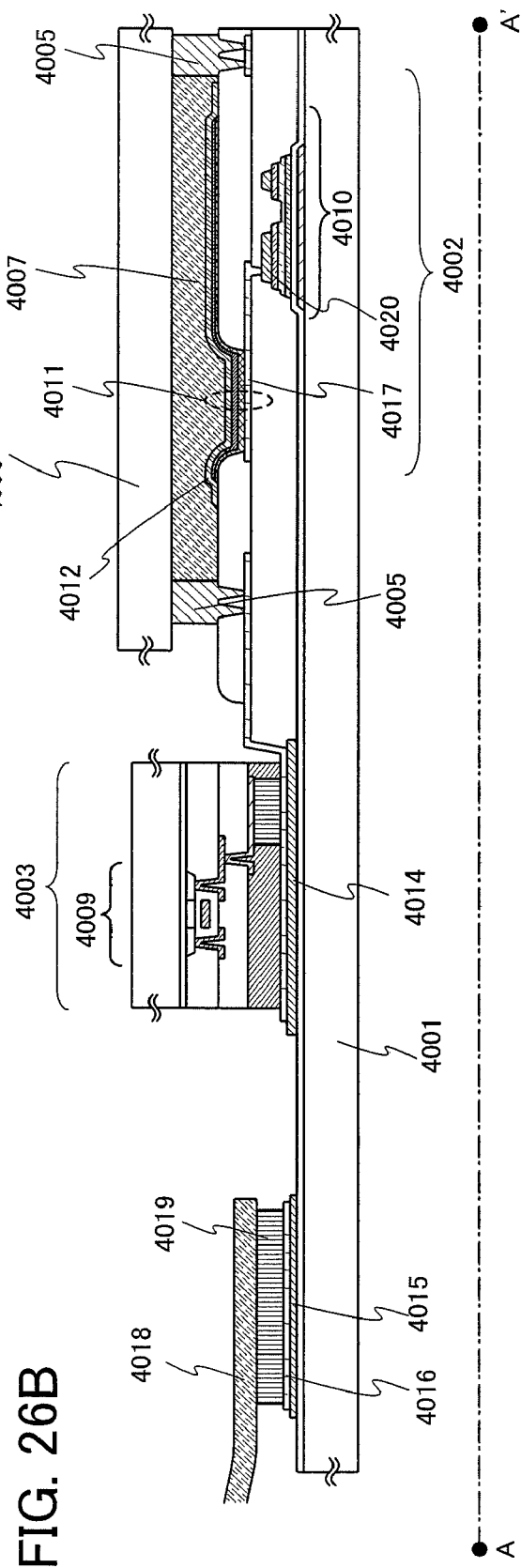

Next, the appearance and a cross section of a light-emitting display panel which is one mode of the display device of the present invention will be described with reference to FIGS. 26A and 26B. FIG. 26A is a top view of a panel. In the panel, a thin film transistor in which a microcrystalline semiconductor film is used and a light-emitting element which are formed over a first substrate are sealed between the first substrate and a second substrate by a sealant. FIG. 26B is a cross-sectional view along a line A-A' in FIG. 26A.

The sealant 4005 is provided so as to surround the pixel portion 4002 and the scanning line driver circuit 4004 which are provided over the first substrate 4001. The second substrate 4006 is provided over the pixel portion 4002 and the scanning line driver circuit 4004. Therefore, the pixel portion 4002 and the scanning line driver circuit 4004 as well as a filler 4007 are sealed between the first substrate 4001 and the second substrate 4006 with the sealant 4005. The signal line driver circuit 4003 formed over a substrate, which is prepared separately, using a polycrystalline semiconductor film is mounted at a region different from the region surrounded by the sealant 4005 over the first substrate 4001. This embodiment mode will describe an example of attaching the signal line driver circuit 4003 including a thin film transistor formed using a polycrystalline semiconductor film to the first substrate 4001. Alternatively, a signal line driver circuit including a thin film transistor, which is formed using a single crystal semiconductor film, may be attached to the first substrate 4001. FIG. 26B illustrates the thin film transistor 4009 formed using a polycrystalline semiconductor film, which is included in the signal line driver circuit 4003.

Each of the pixel portion 4002 and the scanning line driver circuit 4004 which are provided over the first substrate 4001 includes a plurality of thin film transistors.

FIG. 26B illustrates the thin film transistor 4010 included in the pixel portion 4002. Note that, in this embodiment mode, the thin film transistor 4010 is illustrated as a driving TFT but may also be a current control TFT or an erasing TFT. The thin film transistor 4010 corresponds to a thin film transistor which uses a microcrystalline semiconductor film.

Further, reference numeral 4011 denotes a light-emitting element. A pixel electrode 4017 of the light-emitting element 4011 is electrically connected to a source or drain electrode of the thin film transistor 4010 through a wiring 4020. Moreover, in this embodiment mode, a light-transmitting conductive film 4012 and a common electrode of the light-emitting element 4011 are electrically connected to each other. Note that a structure of the light-emitting element 4011 is not limited to the structure described in the present embodiment mode. The structure of the light-emitting element 4011 can be changed as appropriate in accordance with a direction of light taken from the light-emitting element 4011, polarity of the thin film transistor 4010, or the like.

Although not illustrated in the cross-sectional view of FIG. 26B, a variety of signals and potential supplied to the separately formed signal line driver circuit 4003, the scanning line driver circuit 4004, and the pixel portion 4002 are supplied from the FPC 4018 through the leading wirings 4014 and 4015.

In this embodiment mode, the connecting terminal 4016 is formed of the same conductive film as that of the pixel electrode 4017 included in the light-emitting element 4011. In addition, the leading wirings 4014 and 4015 are formed of the same conductive film as that of the wiring 4020.

The connecting terminal 4016 is electrically connected to a terminal of the FPC 4018 through the anisotropic conductive film 4019.

Note that the second substrate in a direction to extract light from the light-emitting element 4011 needs to be transparent. In that case, a light transmitting material such as a glass plate, a plastic plate, a polyester film, or an acrylic film is used.

As the filler 4007, an inert gas such as nitrogen or argon can be used as well as an ultraviolet curable resin or a heat curable resin such as polyvinyl chloride (PVC), acrylic, polyimide, an epoxy resin, a silicone resin, polyvinyl butyral (PVB) or ethylene vinyl acetate (EVA). In this embodiment mode, nitrogen is used as the filler.

In addition, if needed, optical films, such as a polarizer, a circular polarizer (including an elliptical polarizer), a retardation plate (a quarter-wave plate, a half-wave plate), a color filter, and the like, may be provided on a projection surface of the light-emitting element, as appropriate. Further, the polarizing plate or the circular polarizer may be provided with an anti-reflection film. For example, an anti-glare treatment which can diffuse reflected light in the depression/projection of the surface, and reduce glare can be performed.

Note that FIGS. 26A and 26B illustrate an example in which the signal line driver circuit 4003 is formed separately and mounted on the first substrate 4001, but this embodiment mode is not limited to this structure. The scanning line driver circuit may be separately formed and then mounted, or only part of the signal line driver circuit or part of the scanning line driver circuit may be separately formed and then mounted.

This embodiment mode can be implemented in combination with the structures of other embodiment modes.

(Embodiment Mode 11)

The display device obtained by the present invention, and the like can be used for an active matrix display module. That is, the present invention can be applied to all electronic devices incorporating these in display portions.

Examples of such electronic devices are as follows: a camera such as a video camera or a digital camera, a head mounted display (goggle type display), a car navigation system, a projector, a car stereo component, a personal computer, a portable information terminal (a mobile computer, a cellular phone, an e-book reader, or the like), and the like. Examples thereof are illustrated in FIGS. 27A to 27D.

Figure 27A:
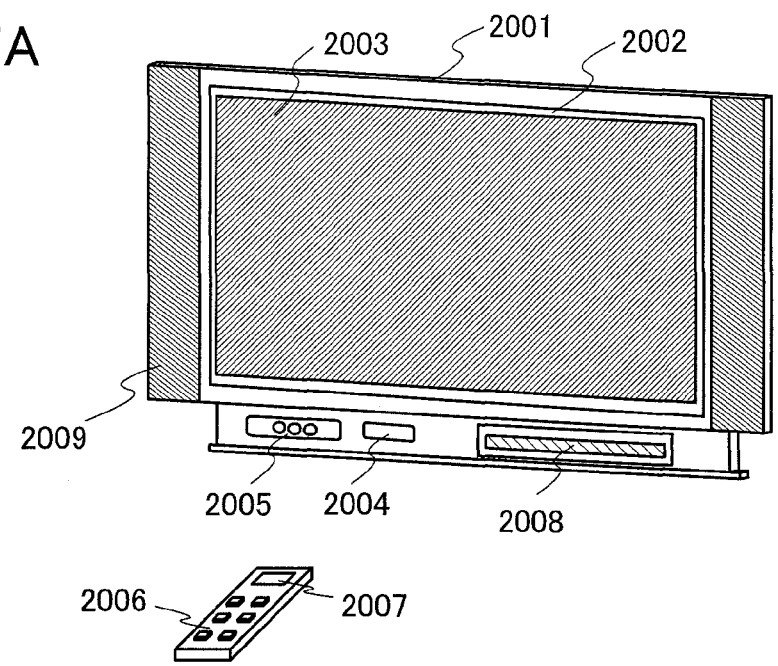
FIGS. 27A to 27D are perspective views describing electronic devices.

FIG. 27A illustrates a television device. A display module is incorporated into a housing as illustrated in FIG. 27A, whereby the television device can be completed. A display panel provided with components up to an FPC is also referred to as a display module. A main screen 2003 is formed of a display module which is provided with a speaker portion 2009, operating switches, and the like as accessory equipment. In such a manner, a television device can be completed.

As illustrated in FIG. 27A, a display panel 2002 using a display element is incorporated in a housing 2001. With the use of a receiver 2005, in addition to reception of general television broadcast, communication of information can also be performed in one way (from a transmitter to a receiver) or in two ways (between a transmitter and a receiver or between receivers) by connection to a wired or wireless communication network through a modem 2004. The television device can be operated by using a switch built in the housing or a remote control unit 2006. Also, a display portion 2007 for displaying output information may also be provided in the remote control unit.

Additionally, the television device may include a sub screen 2008 formed using a second display panel for displaying channels, volume, and the like, in addition to the main screen 2003. In this structure, the main screen 2003 may be formed with a light-emitting display panel which has an excellent viewing angle, and the sub screen 2008 may be formed with a light-emitting display panel by which display is possible with low power consumption. Alternatively, when reduction in power consumption is prioritized, a structure may be employed in which the main screen 2003 is formed using a light-emitting display panel, the sub screen is formed using a light-emitting display panel, and the sub screen can be turned on and off.

It is needless to say that the present invention is not limited to the television device and can be used as a large area display medium for various applications such as a monitor of a personal computer, an information display at a train station, airport, and the like, an advertisement display on the streets, and the like.

Figure 27B:
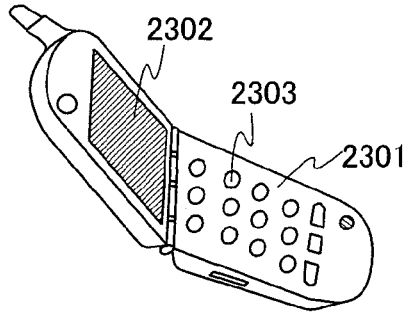

FIG. 27B illustrates one mode of a cellular phone 2301. The cellular phone 2301 includes a display portion 2302, operation switches 2303, and the like. The display device described in the preceding embodiment modes is applied to the display portion 2302, so that mass productivity can be improved.

Figure 27C:
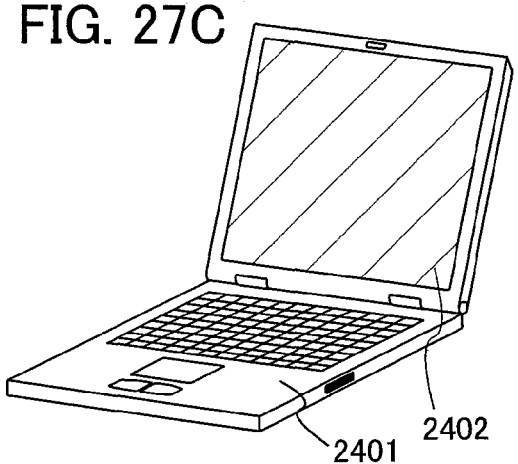

A portable computer illustrated in FIG. 27C includes a main body 2401, a display portion 2402, and the like. The display device described in the preceding embodiment modes is applied to the display portion 2402, so that mass productivity can be improved.

Figure 27D:
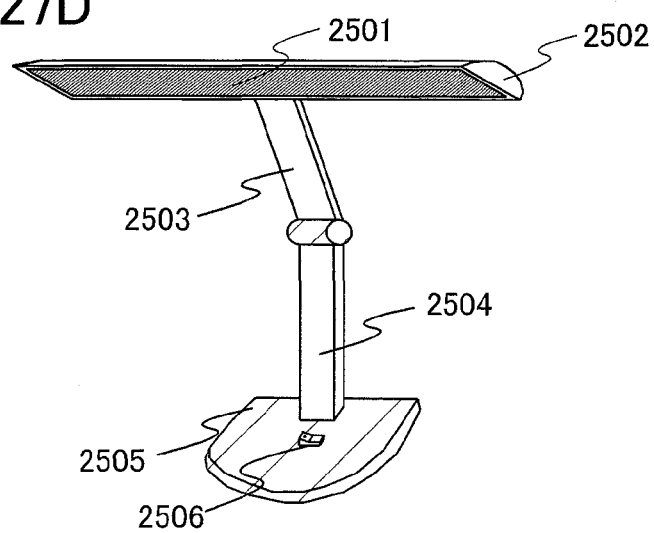

FIG. 27D illustrates a desk lamp including a lighting portion 2501, a lampshade 2502, an adjustable arm 2503, a support 2504, a base 2505, and a power supply 2506. The desk lamp is formed using the light-emitting device, which is described in Embodiment Mode 10, for the lighting portion 2501. Note that a lamp includes ceiling lights, wall lights, and the like in its category. Use of the display device described in the preceding embodiment modes can increase mass productivity and provide inexpensive desk lamps.

This application is based on Japanese Patent Application serial no. 2007-305560 filed with Japan Patent Office on Nov. 27, 2007, the entire contents of which are hereby incorporated by reference.

What is claimed is:

1. A film deposition apparatus comprising:
a first bag;
a vacuum chamber surrounded by the first bag so as to provide a first space;
a plasma generation means in the vacuum chamber;
a second bag covering the first bag so as to provide a second space;
a first vacuum evacuation means and a first gas supply means connected to the second space; and
a second vacuum evacuation means and a second gas supply means connected to the vacuum chamber,
wherein the first space and the second space are separated from each other by the first bag, and
wherein air and an outer wall of the vacuum chamber are separated from each other with one of a noble gas and a hydrogen gas supplied from the first gas supply means to the second space.

2. The film deposition apparatus according to claim 1, wherein the first bag comprises one material selected from the group consisting of a polyethylene resin, a polypropylene resin, a polyvinyl chloride resin, a polyvinylidene chloride resin, a cellulose acetate resin, a fluorine-containing resin and a polyamide resin.

3. The film deposition apparatus according to claim 1, wherein the first bag is shrinkable.

4. The film deposition apparatus according to claim 1, wherein the first bag is formed of a film.

5. The film deposition apparatus according to claim 1, wherein a surface of the first bag is uneven.

6. The film deposition apparatus according to claim 1, wherein the noble gas includes argon gas.

7. A film deposition apparatus comprising:
a bubble cushioning material;
a vacuum chamber surrounded by the bubble cushioning material; and
a first gas supply means which supplies one of a noble gas and a hydrogen gas to a space between the bubble cushioning material and the vacuum chamber,
wherein the vacuum chamber is provided with a vacuum evacuation means and a second gas supply means, and a plasma generation means is included in the vacuum chamber, and
wherein an inside of the bubble cushioning material includes a bubble of one of the noble gas and the hydrogen gas, and a periphery of the bubble is sealed with a resin.

8. The film deposition apparatus according to claim 7, wherein the bubble cushioning material comprises one material selected from the group consisting of a polyethylene resin, a polypropylene resin, a polyvinyl chloride resin, a polyvinylidene chloride resin, a cellulose acetate resin, a fluorine-containing resin and a polyamide resin.

9. The film deposition apparatus according to claim 7, wherein the noble gas includes argon gas.

10. An apparatus comprising:
a first bag;
a vacuum chamber, wherein at least a part of the vacuum chamber is covered by the first bag so as to provide a first space;
a second bag covering the first bag so as to provide a second space; and
a gas supply means connected to the second space,
wherein the first space and the second space are separated from each other by the first bag.

11. The apparatus according to claim 10, wherein the first space comprises one of a noble gas and a hydrogen gas.

12. The apparatus according to claim 11, wherein the first space has a positive pressure that is higher than atmospheric pressure.

13. The apparatus according to claim 11, wherein oxygen concentration and nitrogen concentration included in the one of the noble gas and the hydrogen gas is 30 ppm or less.

14. The apparatus according to claim 10, wherein the first bag comprises one material selected from the group consisting of a polyethylene resin, a polypropylene resin, a polyvinyl chloride resin, a polyvinylidene chloride resin, a cellulose acetate resin, a fluorine-containing resin and a polyamide resin.

15. The apparatus according to claim 10, wherein the vacuum chamber comprises a plasma generation means.

16. The apparatus according to claim 10, wherein the first bag is shrinkable.

17. The apparatus according to claim 10, wherein the first bag is formed of a film.

18. The apparatus according to claim 10, wherein a surface of the first bag is uneven.

19. The apparatus according to claim 11, wherein the noble gas includes argon gas.

* * * * *

UNITED STATES PATENT AND TRADEMARK OFFICE
CERTIFICATE OF CORRECTION

PATENT NO.        : 8,242,562 B2
APPLICATION NO.   : 13/094886
DATED             : August 14, 2012
INVENTOR(S)       : Shunpei Yamazaki et al.

It is certified that error appears in the above-identified patent and that said Letters Patent is hereby corrected as shown below:

Column 1, line 61, after "No" replace "," with --.--;

Column 2, line 33, replace "O-ring" with --o-ring--;

Column 3, line 34, after "of" delete ",";

Column 22, line 15, after "damage" delete ",";

Column 35, line 64, after "known" delete ",".

Signed and Sealed this
First Day of January, 2013

David J. Kappos
*Director of the United States Patent and Trademark Office*